United States Patent

Ohwaki et al.

[11] Patent Number: 5,983,043
[45] Date of Patent: Nov. 9, 1999

[54] POTENTIAL MEASURING APPARATUS AND POTENTIAL MEASURING METHOD

[75] Inventors: Hironori Ohwaki, Shizuoka-ken; Koji Yamazaki, Odawara; Toshiyuki Ehara, Yokohama; Masaya Kawada, Nara; Takaaki Kaya, Mishima; Tetsuya Karaki, Shizuoka-ken, all of Japan

[73] Assignee: Canon Kabushiki Kaisha, Tokyo, Japan

[21] Appl. No.: 09/218,628

[22] Filed: Dec. 22, 1998

[30] Foreign Application Priority Data

Dec. 24, 1997 [JP] Japan .................................... 9-355009
Dec. 24, 1997 [JP] Japan .................................... 9-355476

[51] Int. Cl.⁶ ............................ G03G 15/00; G03G 21/00
[52] U.S. Cl. ................................ 399/48; 324/457; 399/73
[58] Field of Search ............................. 399/48, 50, 73; 324/457; 702/64

[56] References Cited

U.S. PATENT DOCUMENTS 4,330,749  5/1982  Eda et al. ................................. 324/457

FOREIGN PATENT DOCUMENTS 6-3397    1/1994  Japan .
6-313782  11/1994  Japan .

*Primary Examiner*—Joan Pendegrass
*Attorney, Agent, or Firm*—Fitzpatrick, Cella, Harper & Scinto

[57] ABSTRACT

In a surface potential measuring apparatus for measuring a potential configuration by moving a photosensitive body of an image forming apparatus of electrophotographic type and at least one potential sensor relative to each other and by generating dielectric current in the potential sensor due to change in potential on a surface of the photosensitive body and by analyzing the dielectric current, a width of a detecting portion of the potential sensor is smaller than a width of the change in potential to be measured, and a sectional shape of the detecting portion in a plane perpendicular to the surface of the photosensitive body and parallel to the relative movement direction does not include any edge.

37 Claims, 43 Drawing Sheets

$$\text{LINEARITY} = \frac{w}{d} \times 100 \, [\%]$$

$$\text{PARALLELISM} = \frac{w}{d} \times 100 \, [\%]$$

PARALLELISM = $\frac{w}{d} \times 100$ [%]

POTENTIAL MEASURING APPARATUS AND POTENTIAL MEASURING METHOD

BACKGROUND OF THE INVENTION

1. Field of the Invention

The present invention relates to a method for measuring surface potential of a photosensitive body of an electrophotographic image forming apparatus and a method for effecting control on the basis of a measured result.

2. Related Background Art

Present electrophotographic image forming apparatus have widely been used not only as copying machines but also as printers as output means of computers or word processors which have recently been requested remarkably. There are various use conditions. For example, various image stabilizing means such as a means for preventing fluctuation of density of an output image caused by change in an environmental condition have been adopted. Particularly, in such printers, since not only normal office use but also personal use have been increased, low cost and maintenance free have been requested greatly.

Image quality of the output image from the electrophotographic system greatly depends upon sharpness or clearness in various electrophotographic processes, i.e., clearness of writing information, clearness of an electrostatic latent image formed on a surface of a photosensitive body, clearness of a color fine particle (referred to as "toner" hereinafter) image formed on the surface of the photosensitive body, clearness of the toner image after transferred to a transfer sheet and clearness of the image after the toner is fixed. Thus, in order to obtain a higher quality image, the clearness of various processes must be enhanced.

FIG. 72 is a schematic view of a known electrophotographic apparatus. In order to control an electrostatic latent image, methods for controlling a charging process or an exposure process on the basis of a result obtained by measuring potential of a surface of a photosensitive body within a macroscopic range.

A structure of the electrophotographic apparatus will now be described. The reference numeral 601 denotes a potential sensor; 602 denotes a support; and 603 denotes a photosensitive drum. The photosensitive drum 603 includes a conductive substrate 604, and a surface on which potential is varied. A surface 605 of the photosensitive drum 603 is charged by a charger 606, and an electrostatic latent image is formed on the drum by illuminating light from an image signal applying means 607 onto the drum. Distribution of the potential on the surface 605 of the photosensitive drum 603 is measured by the potential sensor 601. The electrostatic latent image is developed by a developing device 608 to form a toner image which is in turn transferred, by a transfer charger 610a, onto a transfer sheet conveyed from a transfer sheet supplying system 609 through a pair of resist rollers 614. After the transferring, the transfer sheet is separated from the drum by a separation charger 610b, and the separated transfer sheet is sent, through a transfer sheet conveying system 611, to a fixing device 615, where the toner image is fixed to the transfer sheet. Thereafter, the transfer sheet is discharged out of the electrophotographic apparatus. On the other hand, after the transferring, residual toner remaining on the surface 605 of the photosensitive drum 603 is scraped by a cleaning blade 616 of a cleaning unit 612. The remaining electrostatic latent image is erased by an electricity removing light source 613. In this way, a cycle of the processes is completed.

Now, the measurement of the potential of the surface of the photosensitive body using the potential sensor in the above-mentioned electrophotographic apparatus will be explained. First of all, in a condition that the light is not illuminated, the charging process is controlled to set the potential Vdark of the surface of the photosensitive body in a dark condition to a predetermined value. In this way, a reference charging condition at this point, i.e., a value of current or voltage to be applied is determined. Then, the photosensitive body is illuminated with a single light amount or plural light amounts, so that surface potential values of the photosensitive body are measured in the respective conditions.

From a relation between the exposure light amounts and the surface potential values of the photosensitive body so obtained, the reference light amount at this point is selected so that the surface potential V1 of the photosensitive body in the exposure becomes the predetermined value. Such potential measurement and potential control are performed upon rise-up of the electrophotographic apparatus and on demand. With this arrangement, the potential values Vdark and V1 are kept constant to prevent fluctuation of image density, thereby providing a stable image.

On the other hand, also in the printers, since output of not only characters but also photograph has been increased, higher image quality such as reproductively of fine dots or thin lines, as well as stability of electrophotography have been required more and more.

In order to achieve high image quality, it is required to control the electrostatic latent image on a small area of the surface of the photosensitive body. To do so, it is very important to know the fine shape of the electrostatic latent image.

However, since the electrostatic latent image cannot be observed directly and the dark portion of the latent image is maintained in the same condition only for a very short time, an observing means for judging whether the clearness of the electrostatic latent image formed on the surface of the photosensitive body is considerably limited. Thus, in the prior art, the following methods were utilized:

(1) method for visualizing the latent image in some manner; or (2) method for making the electrostatic latent image quantitative during the electrophotographic process by using a potential measuring means.

As the above method (1), for example, a method in which the latent image is developed by using toner as the visualizing means and the image is evaluated to guess the electrostatic latent image before development has widely been used. However, in this method, a mechanism for measuring and analyzing the image after the development is required. Further, this method is not proper from the view point of increase in cost of the apparatus and poor reproductively, since dispersion in evaluation becomes great when the image is evaluated by the operator of the electrophotographic apparatus. In addition, this method is not preferably from the view point of environment, since a transfer material (copy sheet) and toner are required for evaluation.

As the above method (2), several methods for electrically evaluating the surface potential of the photosensitive body have been reported. For example, Japanese Patent Application (Laid Open) No. 5-508708 discloses a method for measuring evenness of the surface potential by using a detecting electrode. In this method, a potential sensor is arranged in the vicinity of a surface to be measured and dielectric current due to change in potential on the surface to be measured is generated on the potential sensor by effecting a relative movement between the sensor and the surface to be measured, and the evenness of the surface potential is measured by analyzing the result. The potential sensor has an edge, and it is characterized that the change in potential of the surface to be measured is detected by the edge of the detecting electrode.

Further, another example is disclosed in an electrophotographic institution magazine, volume 30, No. 2and No. 4 (1991). In this example, a means for preventing discharge by applying bias or for preventing discharge by suing gas ($SF_6$) having high discharge start pressure is used and a potential sensor is arranged closely spaced apart form a surface to be measured by a distance of about 30 $\mu$m and dielectric current due to change in potential on the surface to be measured is generated on the potential sensor by effecting a relative movement between the sensor and the surface to be measured, and change in gradient of potential of a latent image at an edge portion is measured by analyzing the result. It is characterized that the detection is effected by suing the potential sensor of several tens of $\mu$m or less and the measurement gap of several tens of $\mu$m or less.

In present electrophotography, particularly, digital electrophotography, the main resolving power is generally 600 dpi to 1200 dpi. It is required that the latent image potential so generated (referred to as "digital latent image potential" hereinafter), particularly, high image quality such as reproductively of fine dots and/or thin lines is maintained very stably against fluctuation of environment, thereby providing a sharp image stably.

As is in the above-mentioned conventional examples, in order to obtain the high quality image, it is required that configuration of the digital latent image potential formed by laser exposure having spot diameter smaller than several tens of $\mu$m or an LED array, particularly, gradient of change in potential at a boundary between the non-exposed portion and the exposed portion of the digital electrostatic latent image (referred to as "sharpness of latent image" hereinafter), and, the potential difference between the non-exposed portion and the exposed portion, i.e., electrical depth of the latent image (referred to as "depth of latent image" hereinafter) are controlled and the image forming means is controlled in accordance with the depth and sharpness of the latent image.

To this end, similarly, a method for detecting distribution of potential of the latent image requires to detect the distribution of the potential of the digital latent image within a small range with a high resolving power, with the result that the control arrangement becomes complicated.

Further, for example, regarding a phenomenon "(high humidity) image flow" in which the image tends to become dim when the apparatus is sued under a high humidity environment, countermeasure is effected by frictionally polishing the photosensitive body in case of a photosensitive body made of relatively soft material such as OPC and by providing a mechanism for adjusting the photosensitive body to a predetermined temperature in case of a photosensitive body made of high hard material such as a-Si group. However, it is difficult to improve the service life of the apparatus and to make the apparatus compact, and detection and control of the latent image with high accuracy are required, with the result that the potential control requires a long time and is not efficient.

Further, in the above-mentioned method for macroscopically controlling the contrast, microscopically, the depth and the sharpness of the latent image may be varied in accordance with the environment or other factors. For example, as well as occurrence of the above-mentioned high humidity image flow, if the exposure amount is too great, since the latent image is expanded, the reproductively of the fine dots may not be ensured or the image may become dim (image flow).

In addition, in order to control the potential of the digital latent image which is changed in the width of several tens of $\mu$m, the resolving power of the detecting means must be improved up to several tens of $\mu$m. The resolving power can be improved to some extent by decreasing an area of the detecting portion of the potential sensor. However, as the area of the detecting portion is decreased, output of the detection signal is also reduced, thereby reducing S/N ratio.

On the other hand, in order to increase the output of the detection signal, a distance between the sensor and the drum must be approached up to several tens of $\mu$m and a relative speed between the sensor and the drum must be increased. However, in the conventional sensors having the edge portion, discharge may be generated or measured potential distribution may be distorted. Further, when a discharge preventing means for preventing the discharge by using gas ($SF_6$) having high discharge start voltage is provided, the apparatus itself becomes more complicated, and, if the relative speed between the sensor and the photosensitive drum is increased, leakage of gas will affect a bad influence upon the charging process.

Under such present circumstances wherein digitization has been progressed, in order to measure the change in the surface potential with the high resolving power of the order of several tens of $\mu$m, it has been requested to provide a technique in which the resolving power is enhanced while maintaining the S/N ratio. The measuring method can preferably be effected simply and easily, and the control is effected on the basis of the measured result to obtain the high quality image stably. In particular, in the presently used compact electrophotographic apparatuses such as printers, it is effective to provide a system capable of extending service interval.

SUMMARY OF THE INVENTION

An object of the present invention is to provide a potential measuring apparatus and a potential measuring method, in which the above-mentioned conventional drawbacks can be eliminated.

Another object of the present invention is to provide a potential measuring apparatus and a potential measuring method, in which distribution of potential of an electrostatic latent image on a surface of a photosensitive body with high accuracy while improving an S/N ratio.

Still another object of the present invention is to provide an image forming method and an image forming apparatus, in which a high quality image can be obtained stably for a long term by using improved potential measuring method and potential measuring apparatus, respectively.

The other objects and features of the present invention will be apparent from the following detailed explanation of the invention referring to the accompanying drawings.

DETAILED DESCRIPTION OF THE PREFERRED EMBODIMENTS

The present invention will now be fully explained in connection with embodiments thereof with reference to the accompanying drawings.

FIRST EMBODIMENT

Figure 1:
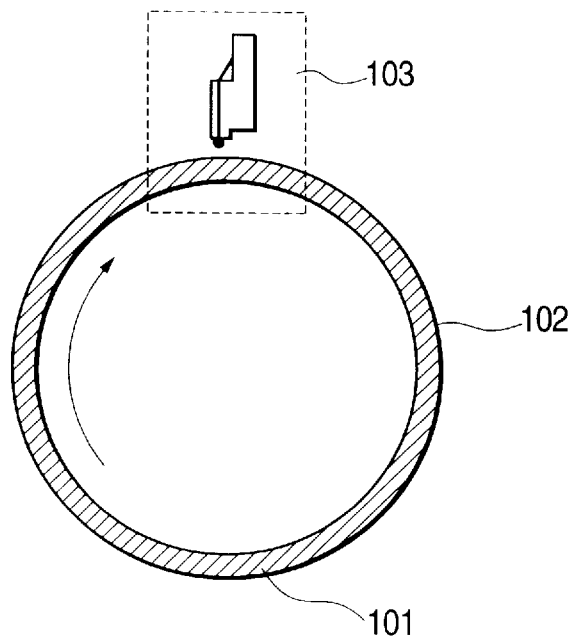
FIG. 1 is a schematic view showing measuring of a surface potential configuration according to a first embodiment of the present invention.

FIG. 1 is a schematic view showing measurement of configuration of surface potential according to a first embodiment of the present invention. In FIG. 1, the reference numeral 101 denotes a photosensitive drum used in an electrophotographic image forming apparatus such as a copying machine; 102 denotes a surface of the photosensitive drum on which potential is changed; and 103 denotes a potential measuring apparatus acting as a potential measuring means. The potential measuring apparatus is constituted by at least one potential sensor (described later), and an insulation support for supporting the potential sensor. Incidentally, the other arrangement around the photosensitive drum is the same as that shown in FIG. 72.

Figure 2:
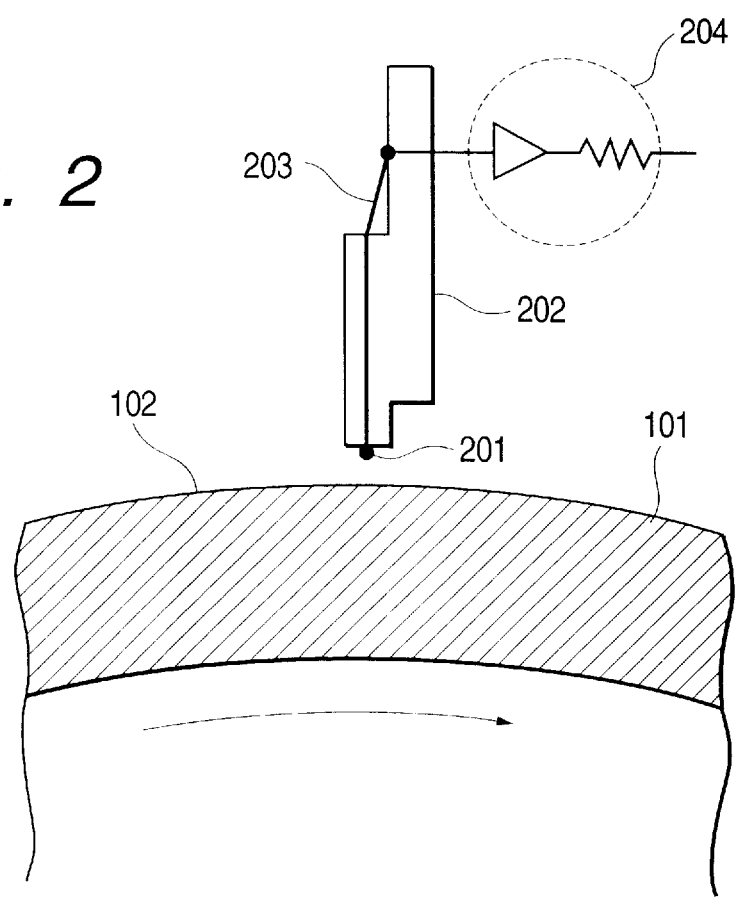
FIG. 2 is a view showing a detailed structure of a potential measuring apparatus 103 shown in FIG. 1.

FIG. 2 is a view showing a detailed structure of the potential measuring apparatus 103 shown in FIG. 1. In FIG. 2, the reference numeral 201 denotes a potential sensor; 202 denotes an insulation support; 203 denotes a conductive lead; and 204 denotes a circuit element. As shown in FIG. 2, the potential sensor 201 is characterized in that a section of a detecting portion taken along a plane perpendicular to the surface 102 and parallel to a relative movement direction between the potential sensor 201 and the surface 102 has no edge.

Figure 3:
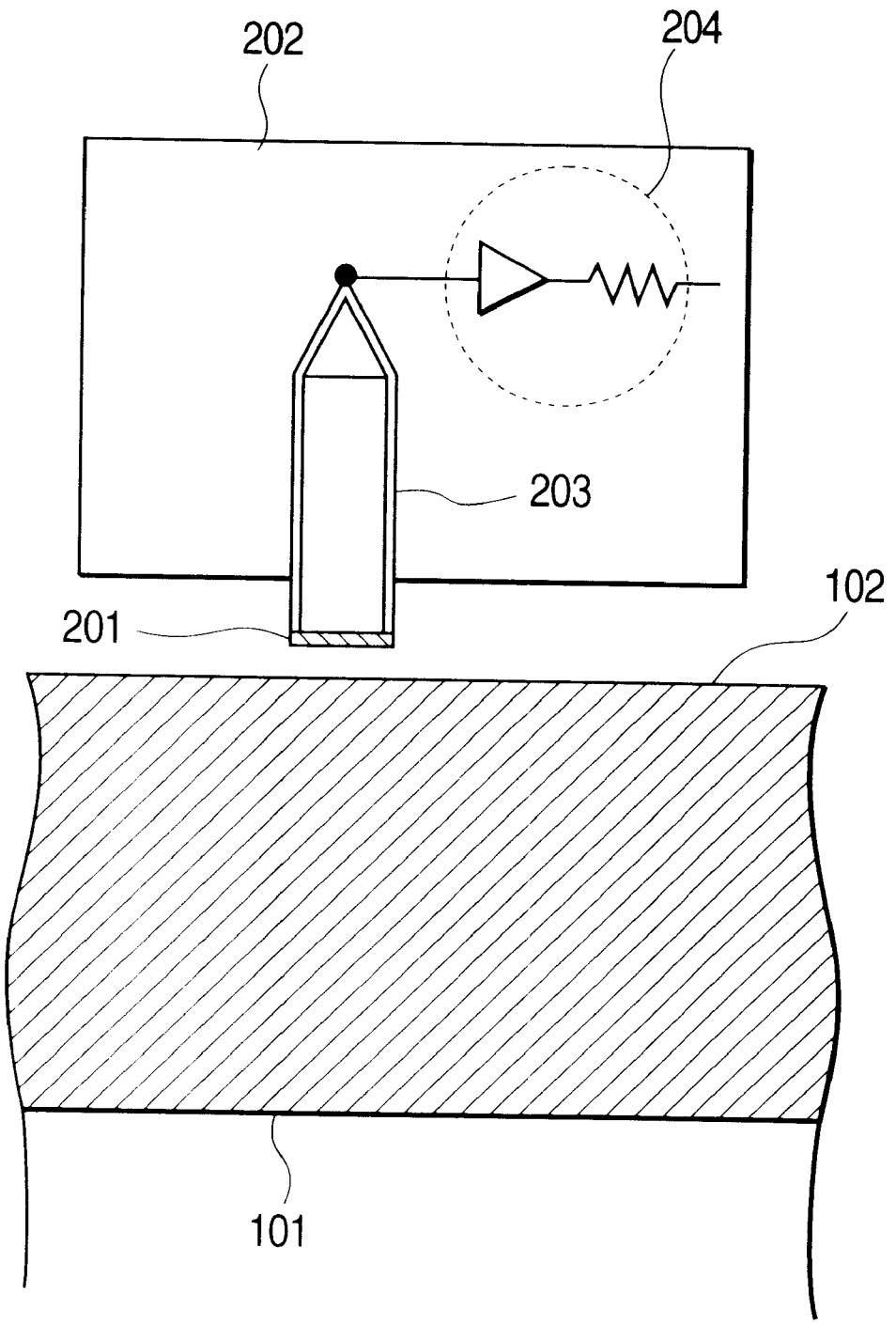
FIG. 3 is a schematic side view of the potential measuring apparatus 103 shown in FIG. 2.

FIG. 3 is a schematic side view of the potential measuring apparatus 103 shown in FIG. 2. As shown in FIGS. 2 and 3, the detecting portion of the potential sensor 201 is connected to the circuit element 204 via the conductive lead 203.

With this arrangement, in a case where a relative movement (an amount of dx per dt) is generated between the potential sensor 201 and the surface 102, when it is assumed that a change amount of potential is dV and a relative movement speed is dx/dt, dielectric current proportional to $dV/dt = (dV/dx) \cdot (dx/dt)$ is generated in the potential sensor 201. In the illustrated embodiment, since the relative movement speed can be selected freely, the detected dielectric current includes information relating to gradient of surface potential. By integrating and analyzing this data, the surface potential configuration can be measured. Incidentally, integration constant used in analysis is determined to reproduce the potential configuration when the surface having a known potential configuration is measured.

Figure 4A:
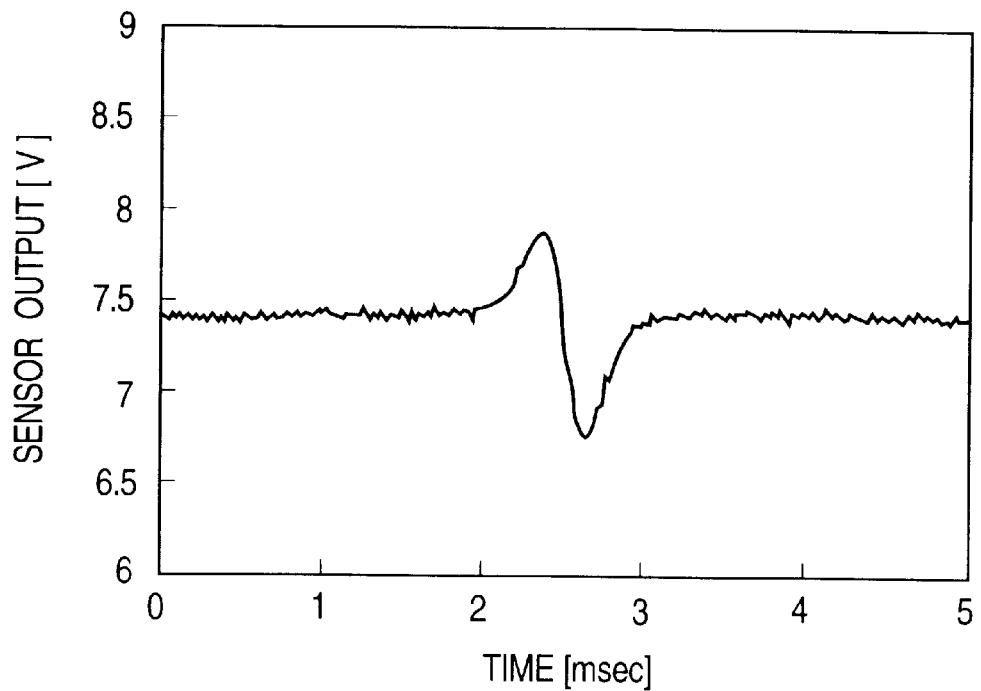
FIGS. 4A and 4B are graphs showing measured results of a one-pixel digital latent image formed by a laser exposure device having scan line density of 600 dpi.
Figure 4B:
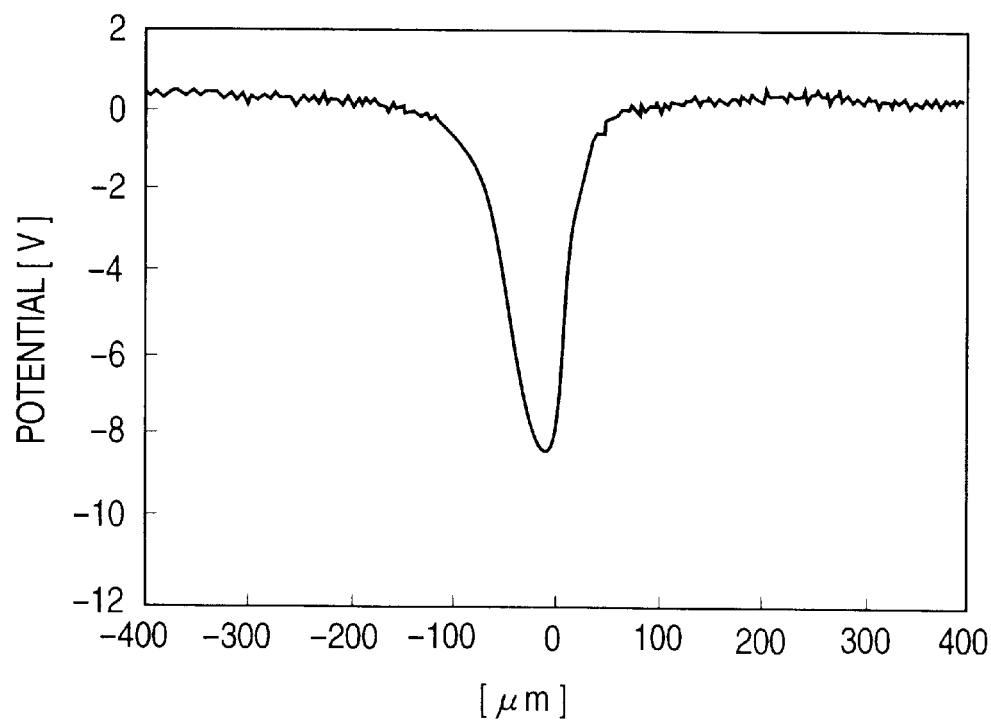
Figure 5A:
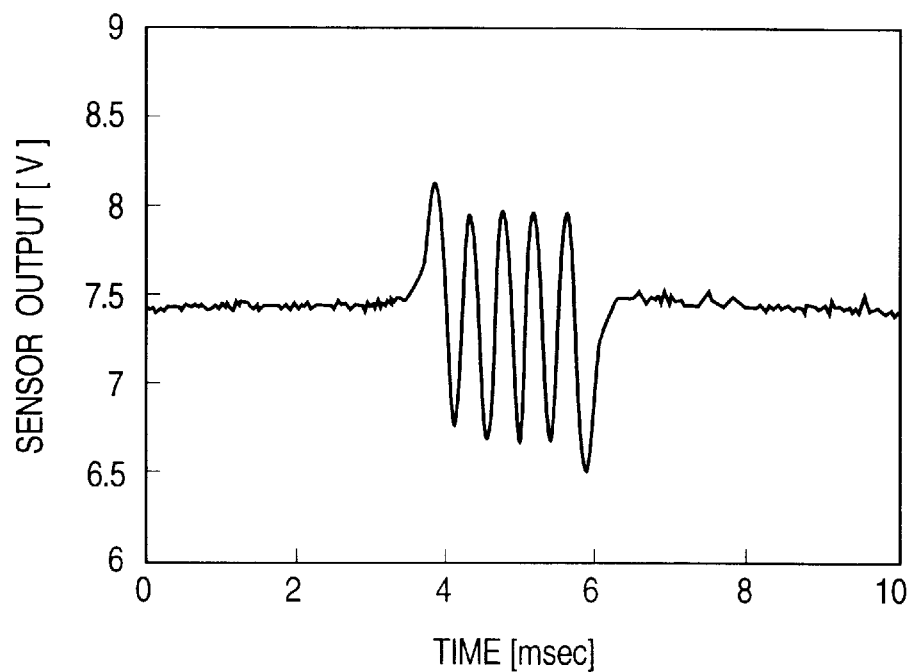
FIGS. 5A and 5B are graphs showing measured results of a one-dot/one-space digital latent image formed by a laser exposure device having scan line density of 600 dpi.
Figure 5B:
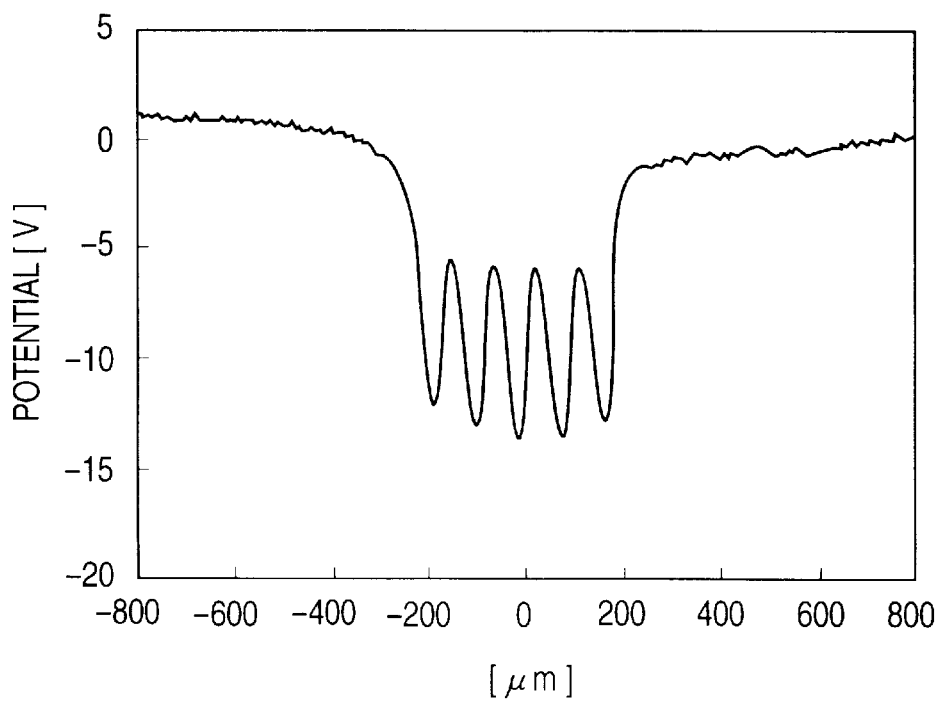

FIGS. 4A and 4B and FIGS. 5A and 5B are graphs showing measured results obtained by effecting measurement in a condition that surface potential in a dark condition (in which the photosensitive body is not illuminated) is set to 100 V. Particularly, FIGS. 4A and 4B are graphs showing measured results of a one-pixel (referred to as "dot", if desired) digital latent image formed by a laser exposure device having scan line density of 600 dpi, and FIGS. 5A and 5B are graphs showing measured results of a one-dot/one-space digital latent image formed by a laser exposure device having scan line density of 600 dpi. FIGS. 4A and 5A show the potential configurations in a form of a detected waveform, and FIGS. 4B and 5B show the potential configurations in a form of a waveform after integration analysis. As apparent from these Figures, the digital latent image can be measured with very high accuracy. In the analyzing method according to the illustrated embodiment, it is required that a width of the detecting portion of the potential sensor is smaller than a width of change in potential to be measured.

Incidentally, the potential sensor 201 can be formed from a conductive wire. In this case, a diameter of the wire greatly affects an influence upon a detecting resolving power. Fundamentally, although the diameter of the wire is desirable to be smaller as can be possible, if the diameter is decreased, since signal intensity is reduced accordingly, the diameter of the wire has lower limitation. It is desirable that the diameter of the wire is within a range of $\phi$ 1 $\mu$m to 500 $\mu$m. Further, a length of the signal detecting portion of the potential sensor in a direction transverse to the relative movement direction (i.e., in an axial direction of the photosensitive drum) affects an influence upon intensity of the signal to be detected. That is to say, the greater the length the stronger the signal intensity. However, if the length is increased, linearity and parallelism of the wire are apt to be worsened to cause reduction in the resolving power.

Thus, it is desirable that the length of the wire is within a range of 0.2 mm to 10 mm. In this case, as shown in FIGS. 1 to 3, the detecting portion is arranged to be in parallel with the surface to be measured and in perpendicular to the relative movement direction. The detecting resolving power greatly depends upon the linearity and parallelism of the detecting portion of the potential sensor, and, thus, it is preferable that the linearity and parallelism (regarding the direction parallel to the surface to be measured and perpendicular to the relative movement direction (direction perpendicular to the plane of FIG. 2)) of the detecting electrode are within 300%.

In the illustrated embodiment, the detected signal, i.e., dielectric current is proportional to the relative movement speed as mentioned above. That is to say, by increasing the relative movement speed, the signal intensity is increased, thereby obtaining a good signal. However, if the speed is too high, due to influence of time constant based on the connected circuit element, the S/N ratio may be worsened.

To avoid this, it is preferable that the relative movement speed is within a range of 10 mm/sec to 10000 mm/sec. It is not so preferable that a distance between the potential sensor and the surface to be measured (referred to as "measurement interval" herein after) is changed during the relative movement. Thus, in the illustrated embodiment, there is provided a means for keep the distance (between the potential sensor and the surface to be measured) constant. This can be achieved by various means.

For example, there is provided a mechanism for keeping the distance constant mechanically by using a roller or a spacer, or a method in which the distance is monitored by a laser gap sensor or an eddy current displacement sensor and control is effected by a motor to always keep the distance constant. Further, a set value of the measurement interval affects an influence upon measurement accuracy. In order to measure the potential configuration of the surface, it is preferable that the measurement interval is small. However, if the measurement interval is too small, discharge may be generated between the potential sensor and the surface, thereby distorting the electric field. To avoid this, it is preferable that the measurement interval is within a range of 10 $\mu$m to 300 $\mu$m. Incidentally, the interval may be changed before each measurement.

Material used in the detecting electrode of the potential sensor may be conductive. Materials such as W, Au, Pt, Cu, Fe, Ti, Cr, Ag, Ta and the like have excellent conductivity and are suitable for the potential sensor according to the present invention. Among them, W (tungsten) has excellent easy-workability and is most suitable for the potential sensor in total.

In the above-mentioned measuring method, one-dimensional (in the relative movement direction) potential configuration can be obtained by a signal from the single potential sensor. Further, in the illustrated embodiment, by providing a plurality of potential sensors, two-dimensional potential configuration of the surface to be measured can be measured. Such plurality of electrodes are disposed side by side along a direction perpendicular to the relative movement direction, i.e., the axial direction of the photosensitive drum (i.e., direction substantially perpendicular to the plane of Figure) in the apparatus shown in FIGS. 1 to 3.

In the above-mentioned arrangement of the apparatus, the relative movement between the potential sensor and the surface is generated by rotation of the photosensitive drum. Namely, the surface is movable with respect to the potential sensor. However, in the measuring method according to the illustrated embodiment, the potential sensor may be movable with respect to the surface.

Test Example and Embodiments

Now, test examples and embodiments will be explained concretely. Incidentally, the present invention is not limited to such embodiments. Further, the detecting resolving power in the tests is evaluated as $1/e^2$ half value width of a potential signal obtained when a digital latent image corresponding to one pixel is measured.

Test Example 1

Figure 6:
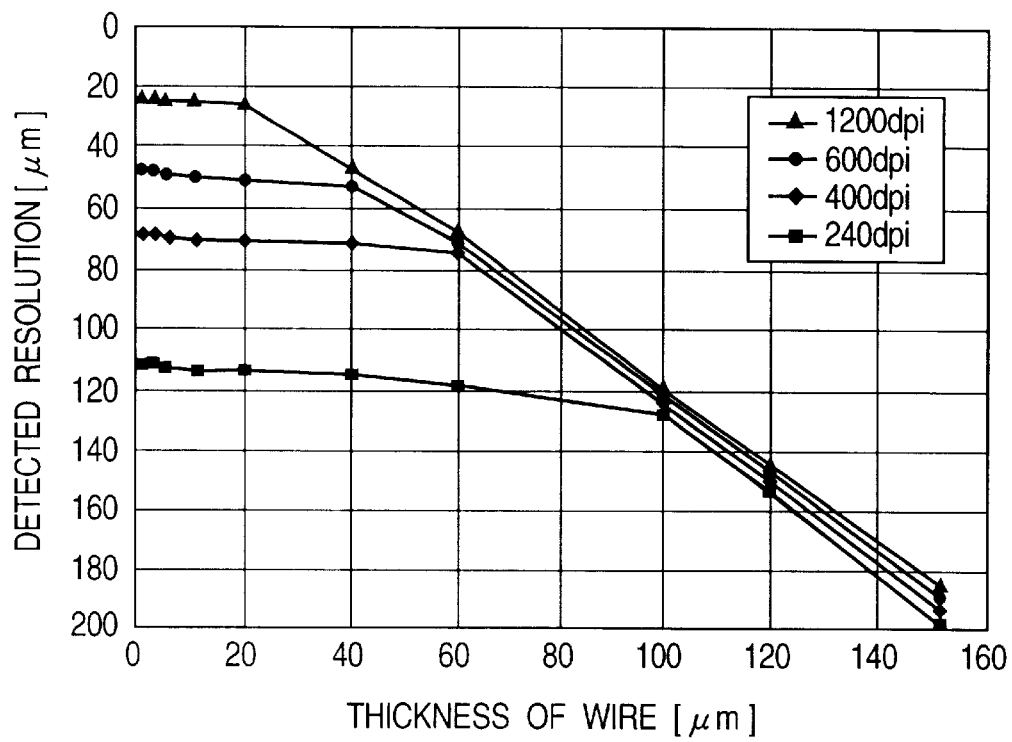
FIG. 6 is a graph showing a relation between a wire thickness and a detecting resolving power of a potential sensor formed from a conductive wire.

FIG. 6 shows a measured result of the potential configuration of the digital latent image obtained by a laser exposure device having scan line density of 400 dpi to 1200 dpi in a test effected by using the potential configuration measuring apparatus shown in FIG. 1. Measuring conditions are as shown in the following Table 1:

TABLE 1

| Wire diameter | 1 to 100 [$\mu$m] |
| Wire length | 1 [mm] |
| measurement interval | 10 [$\mu$m] |
| relative movement speed | 300 [mm/sec] |

From FIG. 6, it can be seen that the detecting resolving power strongly depends upon the diameter of the wire, and, as the diameter of the wire is decreased, the detecting resolving power is improved. Namely, in the measured result of the digital latent image having 1200 dpi, when the diameter of the wire becomes smaller than a diameter ($\approx$20 $\mu$m) of a spot of the laser, the potential configuration can be measured with a high resolving power nearer to the diameter of the laser spot. Similarly, also in case of 600 dpi and 400 dpi, when the wire diameter is smaller than the diameter of the laser spot, the resolving power near the spot diameter can be obtained. Incidentally, even when the potential sensor having the wire diameter of 1 μm is used, a good signal having excellent S/N ratio can be obtained.

Figure 7:
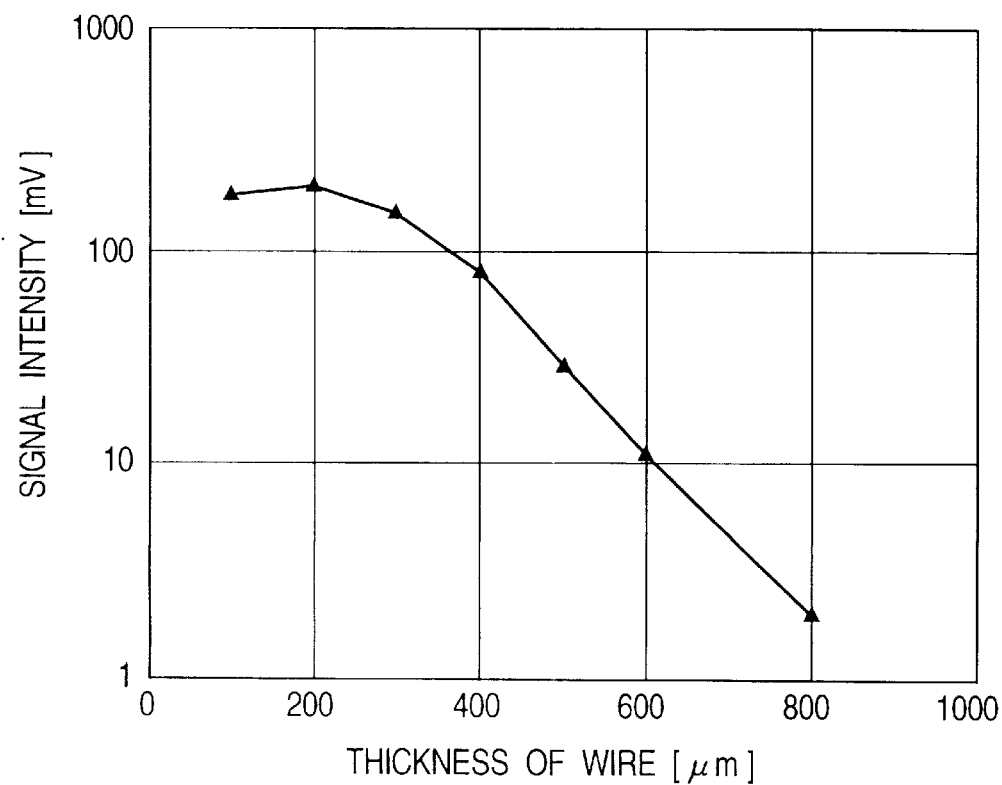
FIG. 7 is a graph showing a relation between a wire thickness and signal intensity of a potential sensor formed form a conductive wire.

On the other hand, regarding the signal intensity, in the arrangement shown in FIG. 1, as the diameter of the wire is increased the signal intensity is also increased. FIG. 7 shows a detailed result of a relation between the diameter of the wire and the signal intensity. The change in potential in this case is formed by image exposure having a width of 2 mm so that it becomes greater than the diameter of the wire. As shown in FIG. 7, it was found that, when the wire diameter exceeds 500 μm, the signal intensity is decreased. That is to say, it was found that, in a range where the wire diameter exceeds 500 μm, both the detecting resolving power and the signal intensity are worsened, which is not suitable for the measurement of the surface potential configuration according to the present invention.

Test Example 2

Figure 8:
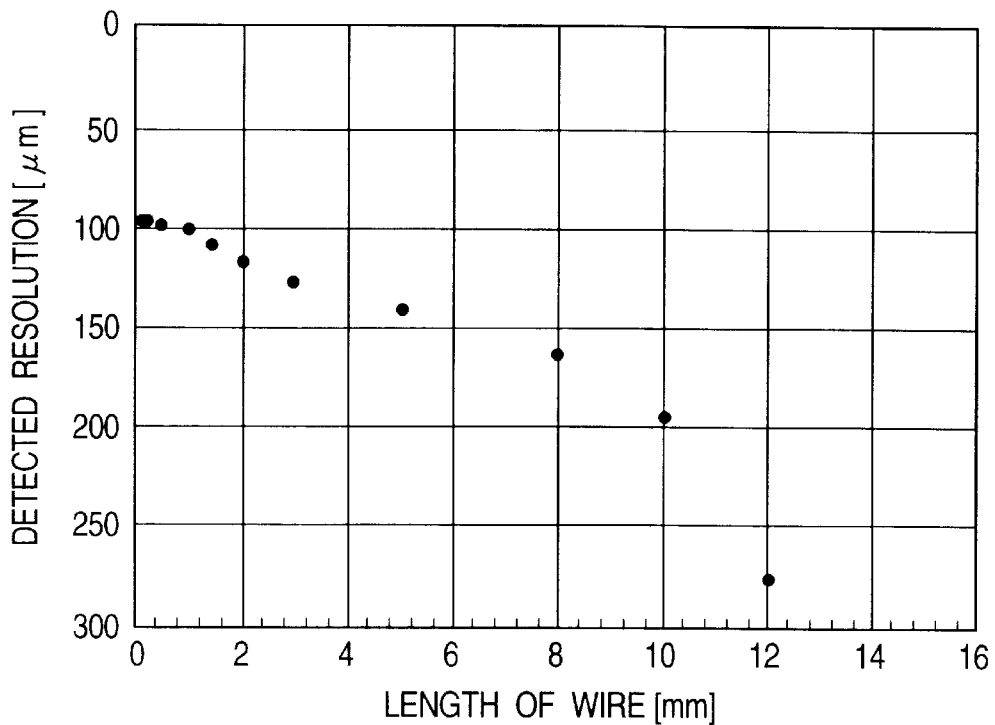
FIG. 8 is a graph showing a relation between a wire length and a detecting resolving power of a potential sensor formed from a conductive wire.
Figure 9:
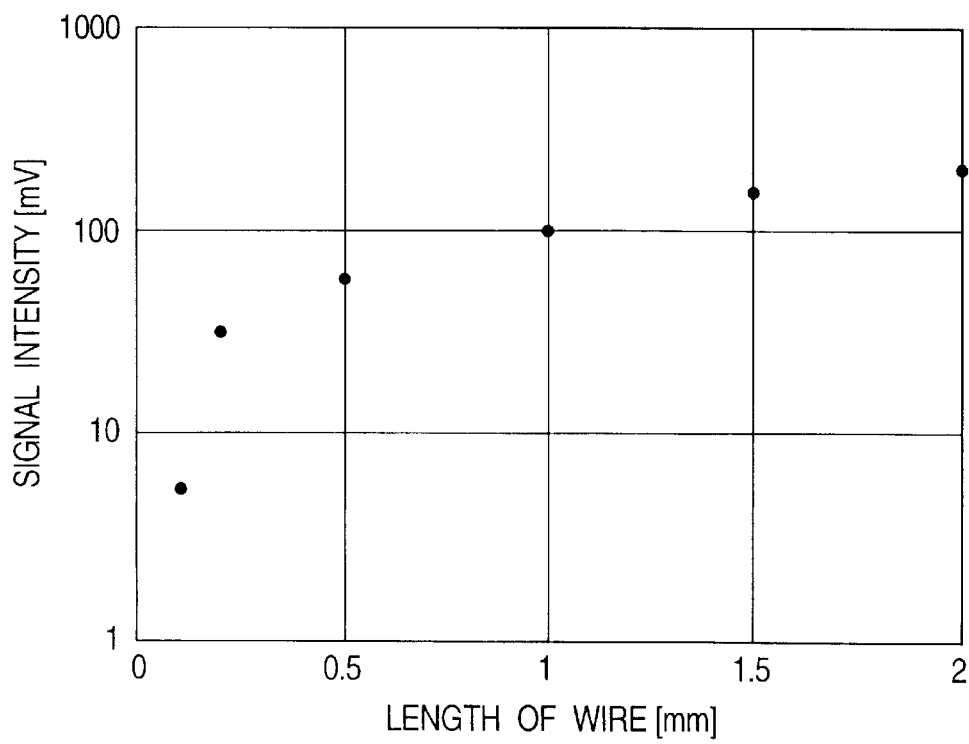
FIG. 9 is a graph showing a relation between a wire length and signal intensity of a potential sensor formed from a conductive wire.

FIGS. 8 and 9 show test results providing a relation between a length of the wire used in the potential sensor and the detecting resolving power and a relation between the wire length and the signal intensity in tests effected by using the potential configuration measuring apparatus shown in FIG. 1. Measuring conditions are as shown in the following Table 2:

TABLE 2

| Wire diameter | 10 [μm] |
|---|---|
| Wire length | 0.1 to 15 [mm] |
| measurement interval | 10 [μm] |
| relative movement speed | 300 [mm/sec] |
| scan line density | 600 [dpi] |

As apparent from FIGS. 8 and 9, the length of the wire is associated with the signal intensity and the detecting resolving power. As the length of the wire is increased, the detecting resolving power is worsened. However, an absolute value of the detecting resolving power strongly depends upon the wire diameter more than the wire length. Thus, it is considered that, when the wire length is increased, the resolving power inherently included in the wire cannot be reached. According to the result shown in FIG. 8, when the length of the wire is 10 mm, the detecting resolving power is worsened about twice in comparison with the case where the length of the wire is 1 mm. Thus, it is not so preferable to select a wire length greater than 10 mm.

Further, as shown in FIG. 9, as the length of the wire is decreased, the signal intensity is also reduced, and, it was found that, when the wire length becomes smaller than 0.2 mm, it is difficult to effect the detection.

Test Example 3

Figure 10:
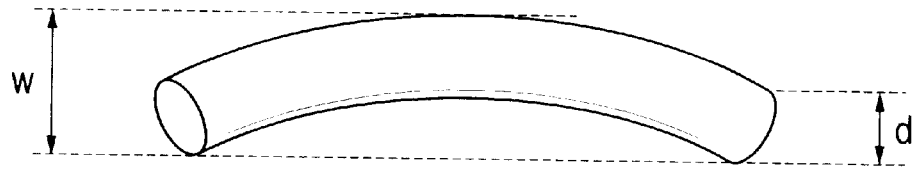
FIG. 10 is a schematic view showing definition of linearity of a wire of a potential sensor formed from a conductive wire.
Figure 11:
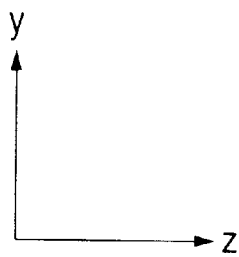
FIG. 11 is a schematic view showing definition of parallelism of a wire of a potential sensor formed from a conductive wire.
Figure 11:
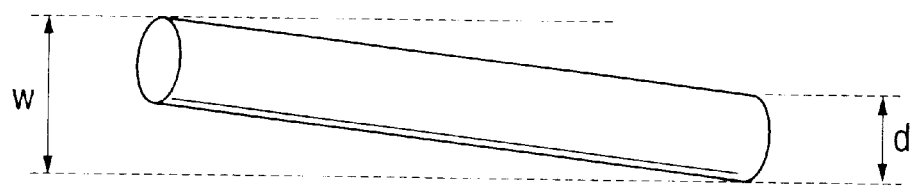

Tests for seeking linearity and parallelism of the detecting portion of the potential sensor and the detecting resolving power were effected by using the potential configuration measuring apparatus shown in FIG. 1. FIG. 10 is an enlarged view of a detecting portion of a potential sensor specially manufactured for these tests, looked at from a direction shown in FIG. 3. As shown in FIG. 10, the potential sensor is manufactured so that the detecting portion has intentionally a curved shape, and it is defined so that the linearity is illustrated in the Figure. FIG. 11 is a schematic view showing definition of the parallelism. A relative movement direction X is perpendicular to the plane of FIG. 11, and "Y" indicates a direction perpendicular to the surface to be measured and "Z" indicates a direction perpendicular to the directions X and Y. Test conditions and test result are shown in the following Table 3 and FIG. 12, respectively.

TABLE 3

| Wire diameter | 10 [μm] |
|---|---|
| Wire length | 1 [mm] |
| measurement interval | 10 [μm] |
| relative movement speed | 300 [mm/sec] |
| scan line density | 600 [dpi] |

Figure 12:
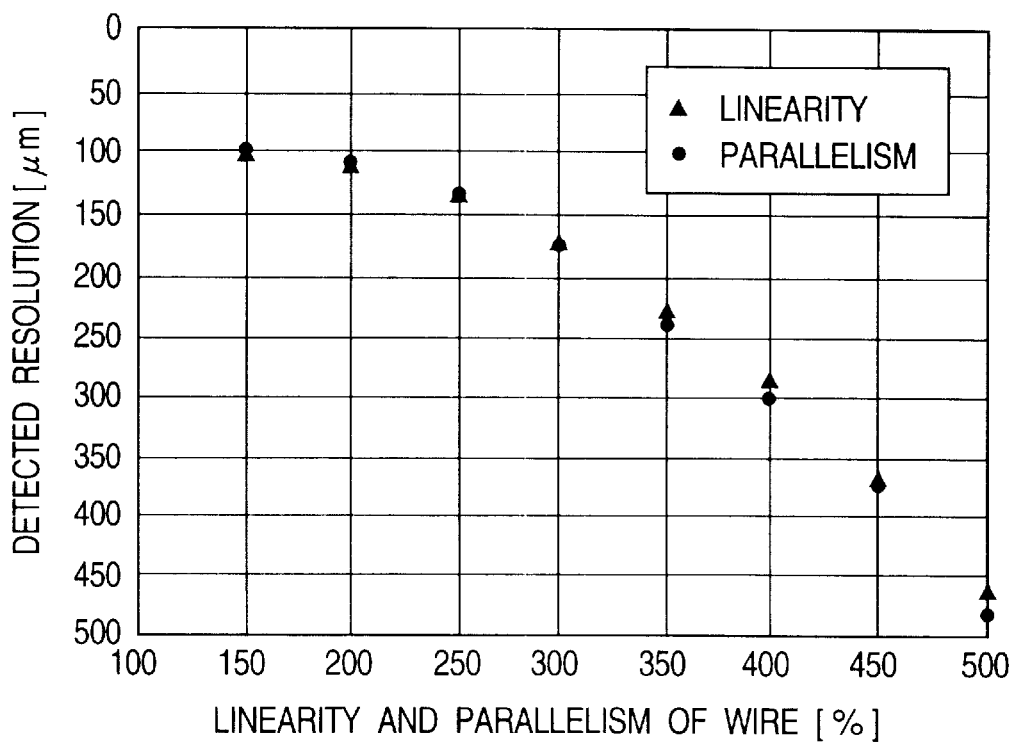
FIG. 12 is a graph showing a relation between a linearity and parallelism and a detecting resolving power of a wire of a potential sensor formed from a conductive wire.

As apparent form FIG. 12, the linearity and parallelism of the wire are associated with the resolving power, and, it was found that, when the linearity and the parallelism are worsened, the detecting resolving power is also worsened. However, an absolute value of the detecting resolving power strongly depends upon the wire diameter more than the linearity and parallelism of the wire. Thus, it is considered that, when the linearity and/or the parallelism are worsened, the resolving power inherently included in the wire cannot be reached. In the result shown in FIG. 12, it can be seen that, if the linearity and parallelism of the wire exceed 300%, the detecting resolving power is worsened about twice in comparison with the detecting resolving power in the case where the linearity and parallelism of the wire are 150%. Thus, it is not so preferable that the linearity and parallelism of the wire exceed 300%.

Test Example 4

Figure 13:
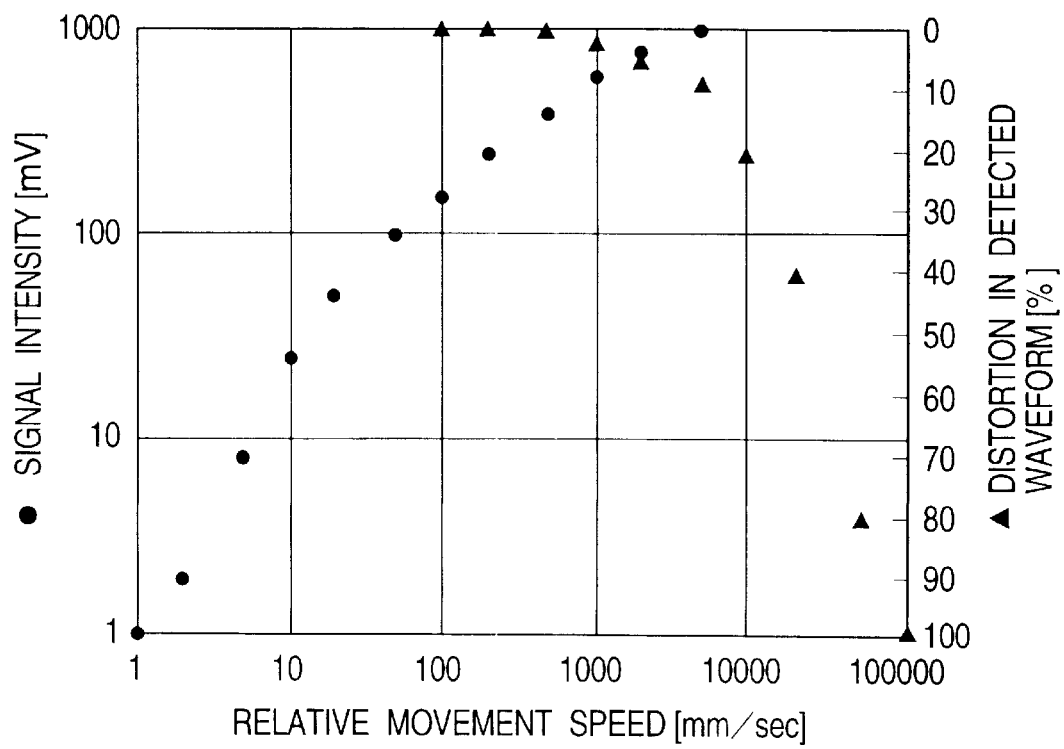
FIG. 13 is a graph showing a relation between a relative movement speed between a surface to be measured and a potential sensor and signal intensity and distortion of a detected waveform of the potential sensor.

FIG. 13 shows a test result providing a relation between the relative movement speed and the signal intensity and distortion of a measured waveform in the test effected by using the potential configuration measuring apparatus shown in FIG. 1. Measuring conditions are as shown in the following Table 4:

TABLE 4

| Wire diameter | 10 [μm] |
|---|---|
| Wire length | 1 [mm] |
| measurement interval | 10 [μm] |
| relative movement speed | 10 to 100000 [mm/sec] |
| scan line density | 600 [dpi] |

As apparent from FIG. 13, if the relative movement speed becomes smaller than 10 mm/sec, the signal intensity becomes weak, with the result that a waveform having excellent S/N ratio cannot be obtained. Further, if the relative movement speed becomes greater than 10000 mm/sec, distortion is generated in the detected waveform by the influence of time constant based on the measuring system, with the result that the potential configuration on the surface cannot be measured correctly.

Test Example 5

Figure 14:
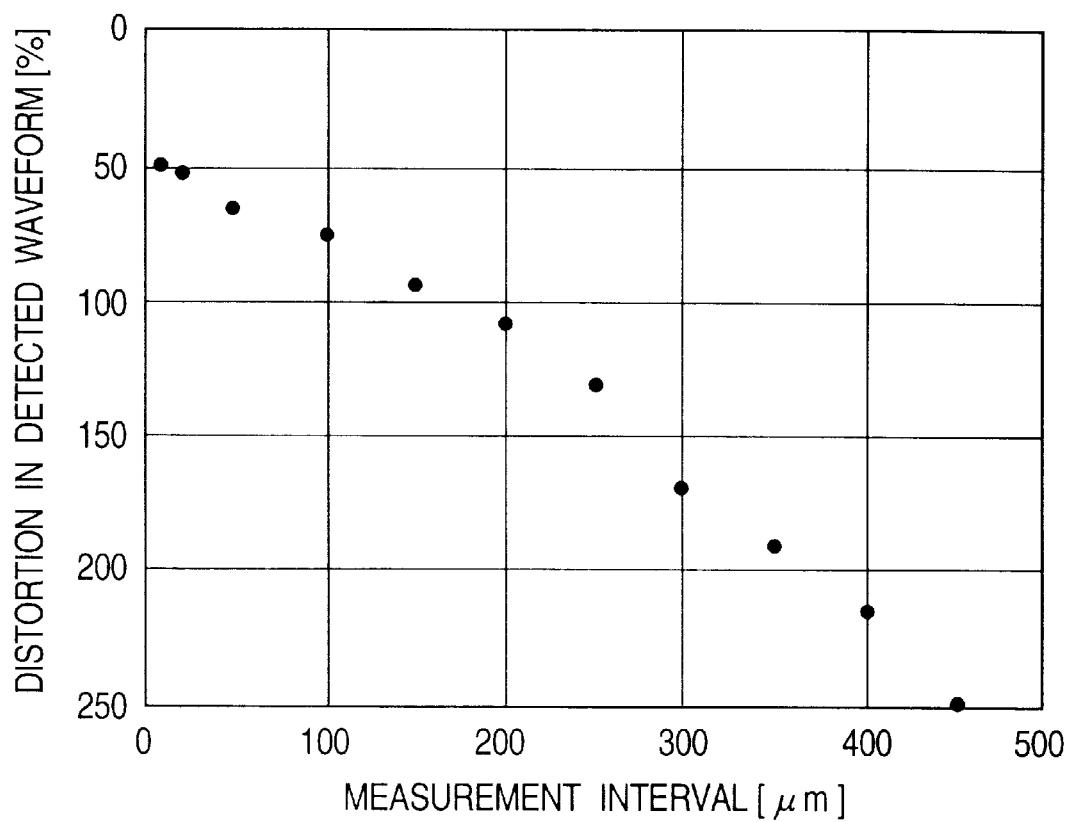
FIG. 14 is a graph showing a relation between a measurement interval and distortion of a detected waveform.

FIG. 14 shows a test result providing a relation between the measurement interval and the detecting resolving power in the test effected by using the potential configuration measuring apparatus shown in FIG. 1. Measuring conditions are as shown in the following Table 5:

TABLE 5

| Wire diameter | 10 [μm] |
|---|---|
| Wire length | 1 [mm] |
| measurement interval | 5 to 500 [μm] |
| relative movement speed | 300 [mm/sec] |
| scan line density | 600 [dpi] |

Judging from the result shown in FIG. 14, it seems that, as the measurement interval is increased, the detecting resolving power is reduced. However, this is due to the fact that the actual potential has spatial extension but is not caused by the measuring system. In order to correctly evaluate the potential configuration near the surface, it is preferable that the measurement interval is 200 μm or less, and more preferably, 100 μm or less.

That is to say, when the spatial extension of the potential configuration is evaluated, the measurement interval can be selected voluntarily. If the measurement interval is smaller than 10 μm, discharge is generated between the surface potential and the potential sensor to distort the detected waveform considerably, thereby making the measurement of the potential configuration of the surface impossible.

Embodiment 1

Figure 15A:
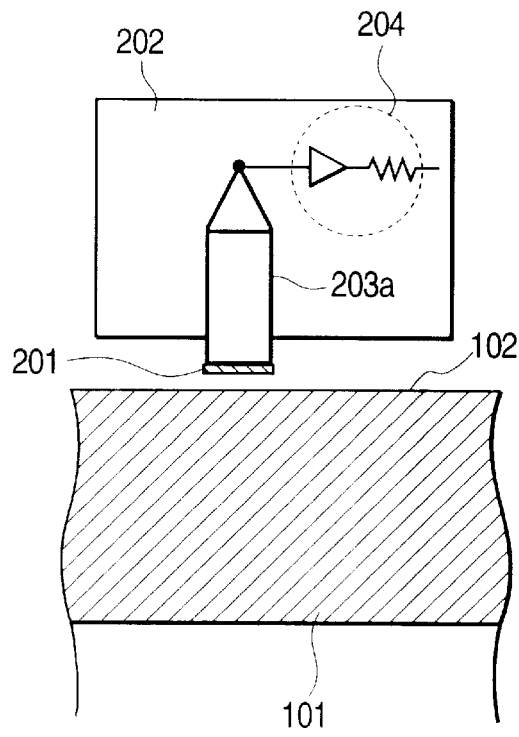
FIGS 15A, 15B and 15C are schematic views showing an example of a structure of potential sensor according to a first embodiment.
Figure 15B:
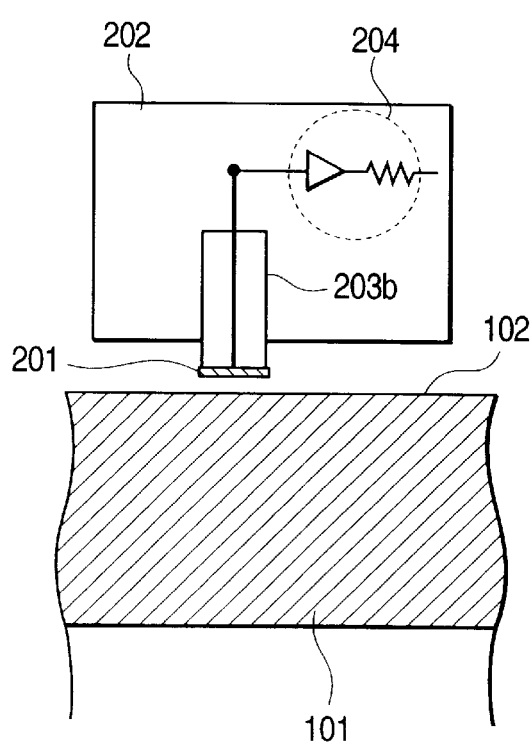
Figure 15C:
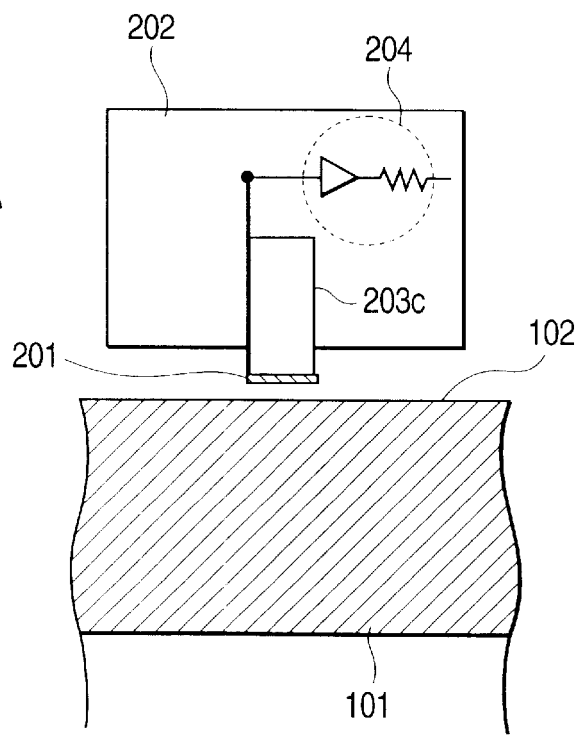

Next, a case where the potential configuration measuring apparatus shown in FIG. 1 is manufactured and a potential sensor having a detecting portion having a shape (looked at from the direction shown in FIG. 3) shown in FIGS. 15A to 15C is manufactured and the potential configuration of the surface is measured by using these apparatus and sensor will be explained. The following Table 6 shows a measured result:

TABLE 6

| Sensor shape | a [μm] | b [μm] | c [mm] | d [mm/sec] | e [μm] | f [dpi] |
|---|---|---|---|---|---|---|
| 15A laid-U shape | 49 | 10 | 1.0 | 300 | 10 | 600 |
| 15B T shape | 53 | 10 | 1.0 | 300 | 10 | 600 |
| 15C L shape | 47 | 10 | 1.0 | 300 | 10 | 600 | a: detecting resolving power
b: wire diameter
c: wire length
d: relative movement speed
e: measurement interval
f: scan line density As shown in the Table 6, in three shapes shown in FIGS. 15A to 15C, there are no great differences in the detecting resolving power, and, the resolving power sufficient to measure the digital latent image can be obtained by any one of these shapes.

To the contrary, if a potential sensor in which the wire diameter is not within a range of 1 μm to 500 μm, the wire length is not within a range of 0.2 mm to 10 mm and linearity and parallelism of the wire are not within 300% is manufactured, an S/N ratio or a resolving power sufficient to measure the digital latent image cannot be obtained.

Embodiment 2

Figure 16A:
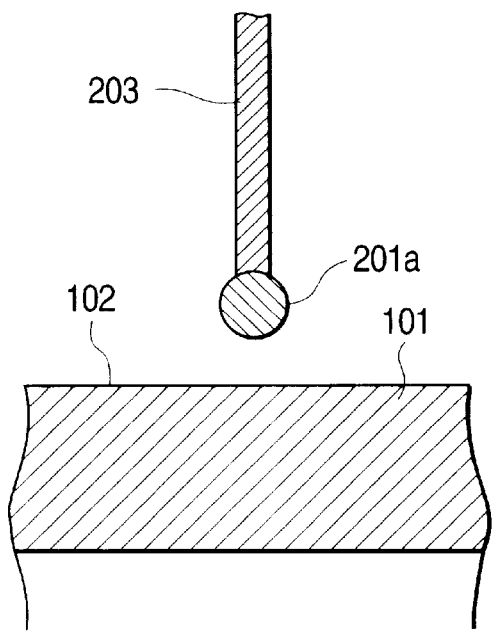
FIGS. 16A, 16B, 16C and 16D are schematic sectional views of the potential sensor according to the first embodiment, looked at from the same direction as FIG. 2.
Figure 16B:
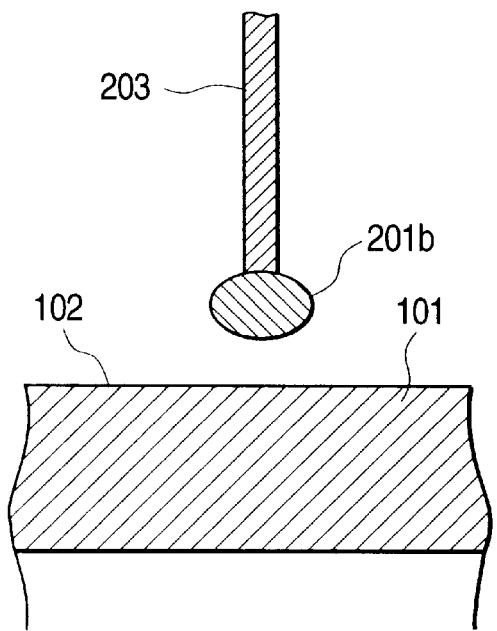
Figure 16C:
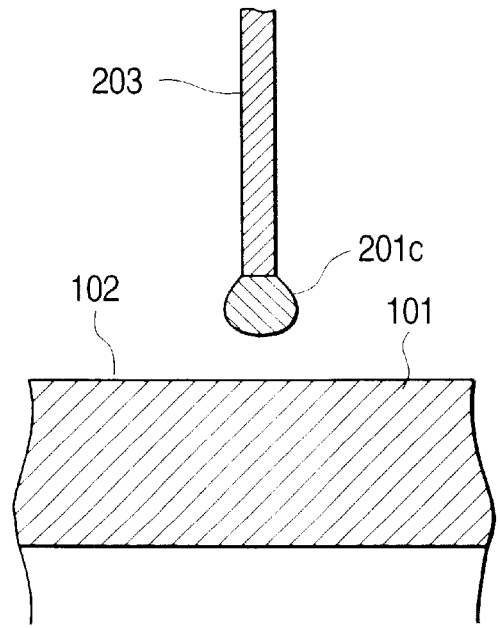

Next, a case where the potential configuration measuring apparatus shown in FIG. 1 is manufactured and a potential sensor having a detecting portion having a sectional shape (taken along the plane perpendicular to the surface to be measured and parallel to the relative movement direction, i.e., a shape (looked at from the direction shown in FIG. 2) shown in FIGS. 16A to 16C is manufactured and the potential configuration of the surface is measured by suing these apparatus and sensor will be explained. The following Table 7 shows a measured result:

TABLE 7

| Sensor shape | a [μm] | b [μm] | c [mm] | d [mm/sec] | e [μm] | f [dpi] |
|---|---|---|---|---|---|---|
| 16A I | 49 | 10 | 1.0 | 300 | 10 | 600 |
| 16B II | 54 | 10 | 1.0 | 300 | 10 | 600 |
| 16C III | 58 | 10 | 1.0 | 300 | 10 | 600 | a: detecting resolving power
b: wire diameter
c: wire length
d: relative movement speed
e: measurement interval
f: scan line density
I: true circular shape
II: elliptic shape
III: triangle shape with corners chamfered As shown in the Table 7, in three shapes shown in FIGS. 16A to 16C, there are not great differences in the detecting resolving power, and, the resolving power sufficient to measure the digital latent image can be obtained by any one of these shapes.

Figure 16D:
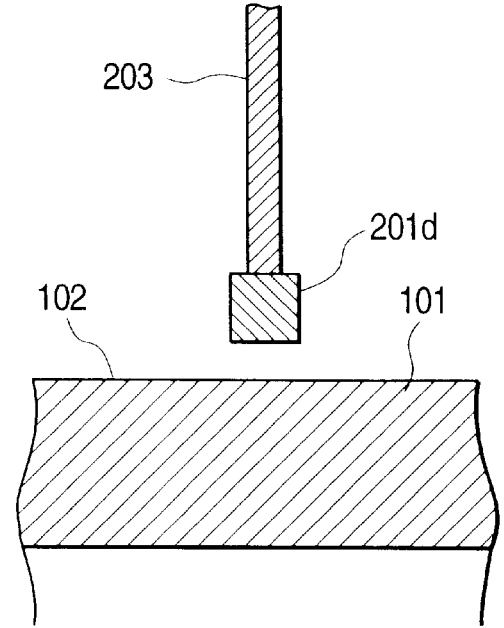

To the contrary, in a rectangular sensor having edges shown in FIG. 16D, signals are detected by a plane opposed to the surface to be measured and planes perpendicular to the surface at the edge portions, with the result that the resolving power and S/N ratio sufficient to measure the digital latent image cannot be obtained.

Embodiment 3

Next, a case where the potential configuration of surfaces of a flat board-shaped photosensitive body and a belt-shaped photosensitive body were measured by using the potential sensor of the potential configuration measuring apparatus shown in FIG. 1 will be explained. The following Table 8 shows a measured result:

TABLE 8

| Photosensitive body shape | a [μm] | b [μm] | c [mm] | d [mm/sec] | e [μm] | f [dpi] |
|---|---|---|---|---|---|---|
| drum shape | 49 | 10 | 1.0 | 300 | 10 | 600 |
| flat board shape | 54 | 10 | 1.0 | 300 | 10 | 600 |
| belt shape | 56 | 10 | 1.0 | 300 | 10 | 600 | a: detecting resolving power
b: wire diameter
c: wire length
d: relative movement speed
e: measurement interval
f: scan line density As shown in the Table 8, the surface potential measuring apparatus can have a resolving power sufficient to measure the digital latent image in the flat board-shaped photosensitive body and the belt-shaped photosensitive body, as well as the drum-shaped photosensitive body.

[Embodiment 4]

In the potential configuration measuring apparatus shown in FIG. 1, the relative movement is generated between the potential sensor and the surface by rotation of the photosensitive drum. Now, by improving such an apparatus, a case where potential configuration along the axial direction of the photosensitive drum was measured by shifting the potential sensor along the axial direction of the photosensitive drum will be explained. The following Table 9 shows a measured result:

TABLE 9

| Relative movement direction | relative movement means | a [$\mu$m] | b [$\mu$m] | c [mm] | d [mm/sec] | e [$\mu$m] | f [dpi] |
|---|---|---|---|---|---|---|---|
| circumference of drum | rotation of drum | 49 | 10 | 1.0 | 300 | 10 | 600 |
| axis of drum | shift of sensor | 58 | 10 | 1.0 | 300 | 10 | 600 | a: detecting resolving power
b: wire diameter
c: wire length
d: relative movement speed
e: measurement interval
f: scan line density As shown in the Table 9, by shifting the potential sensor, also in an arrangement in which the relative movement is generated, a resolving power and intensity sufficient to measure the digital latent image can be obtained. From the result, it can be seen that the surface potential measuring method according to the illustrated embodiment can be applied to the arrangement in which the potential sensor is movable with respect to the drum surface, as well as the arrangement in which the relative movement between the potential sensor and the drum surface is achieved by the rotation of the photosensitive drum, i.e., the drum surface is movable with respect to the potential sensor.

In this way, according to the first embodiment, in the surface potential measurement wherein the dielectric current generated by the relative movement between the potential sensor and the surface to be measured is detected and analyzed, by using the potential sensor having the characteristic that the sectional shape of the detecting portion of the potential sensor taken along the plane perpendicular to the surface to be measured and parallel to the relative movement direction between the potential sensor and the surface has no edge, there can be provided the more efficient resolving power by about two or three times in comparison with the conventional potential sensor using the flat conductive board as the detecting electrode. Further, even when the width of the detecting electrode, the potential sensor can maintain the signal intensity, thereby providing a signal having excellent S/N ratio. Thus, the digital latent image which was conventionally considered to be hard to measure can be measured and the surface potential configuration thereof can be evaluated.

[[SECOND EMBODIMENT]]

Next, a second embodiment of the present invention will be fully explained with reference to the accompanying drawings.

Figure 17:
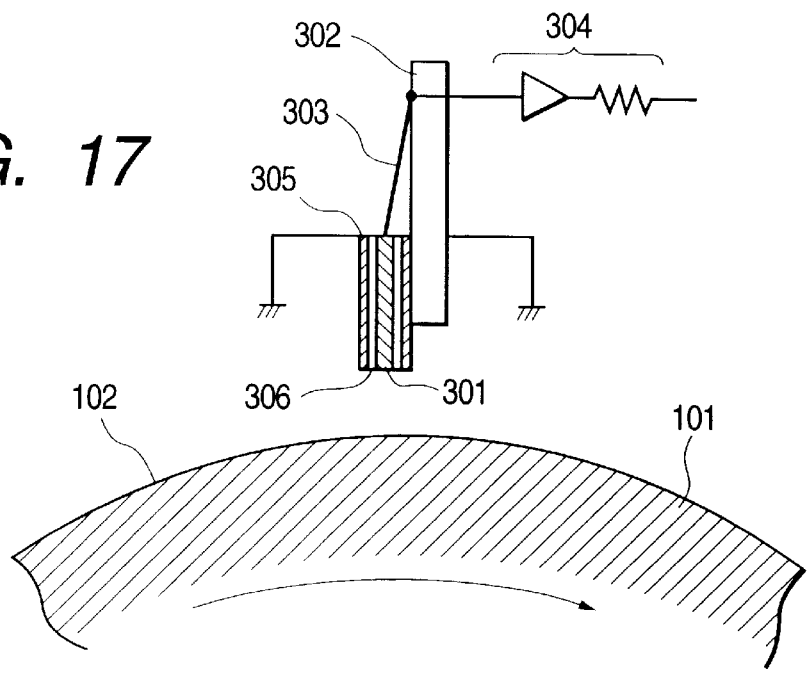
FIG. 17 is view showing a detailed structure of a potential measuring apparatus according to a second embodiment of the present invention.

FIG. 17 is a view showing a potential measuring apparatus according to a second embodiment of the present invention in detail. In FIG. 17, the reference numeral 301 denotes a potential sensor; 302 denotes a support; 303 denotes a conductive lead; 304 denotes a circuit element; 305 denotes a shield; and 306 denotes an insulation body. As shown, a detecting portion of the potential sensor 301 is constituted by a board-shaped conductive body having extension extending in a plane perpendicular to a surface to be measured and perpendicular to a relative movement direction, and a conductive portion other than a surface opposed to the surface to be measured is covered by the shield.

Figure 18:
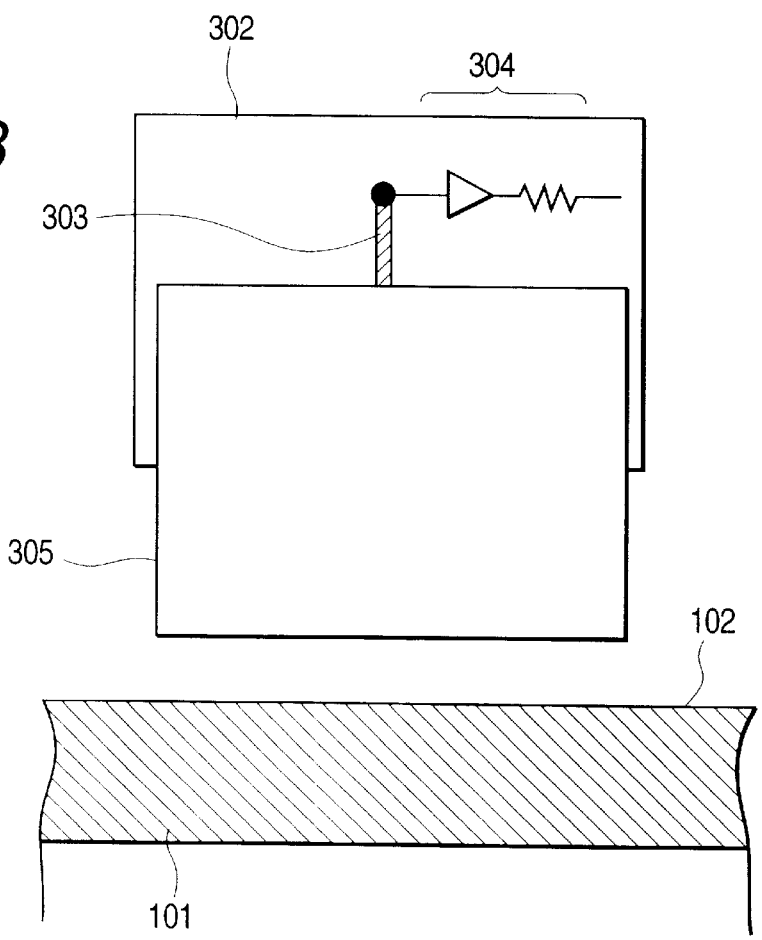
FIG. 18 is a schematic side view of the potential measuring apparatus shown in FIG. 17.

FIG. 18 is a schematic side view of the potential measuring apparatus of FIG. 17. As shown in FIGS. 17 and 18, the detecting portion of the potential sensor 301 is connected to the circuit element 304 via the conductive lead 303. Further, in the potential sensor 301, the conductive portion other than the surface opposed to the surface to be measured is covered by the shield 305 via the insulation body 306. If there is no shield 305, when the surface potential was measured, since signals were also detected by the surfaces other than the surface opposed to the surface to be measured, only a signal having bad S/N ratio was obtained, with the result that the potential configuration of the digital latent image could not be measured correctly.

With the arrangement as mentioned above, in a case wherein a relative movement is generated between the potential sensor 301 and the surface 102, when it is assumed that a change amount of potential is dV and a relative movement speed is dx/dt, dielectric current proportional to $dV/dt = (dV/dx) \cdot (dx/dt)$ is generated in the potential sensor 301. In the illustrated embodiment, since the relative movement speed can be selected freely, the detected dielectric current includes information relating to gradient of surface potential. By integrating and analyzing this data, the surface potential configuration can be measured. Incidentally, integration constant used in analysis is determined to reproduce the potential configuration when the surface having a known potential configuration is measured.

Figure 19A:
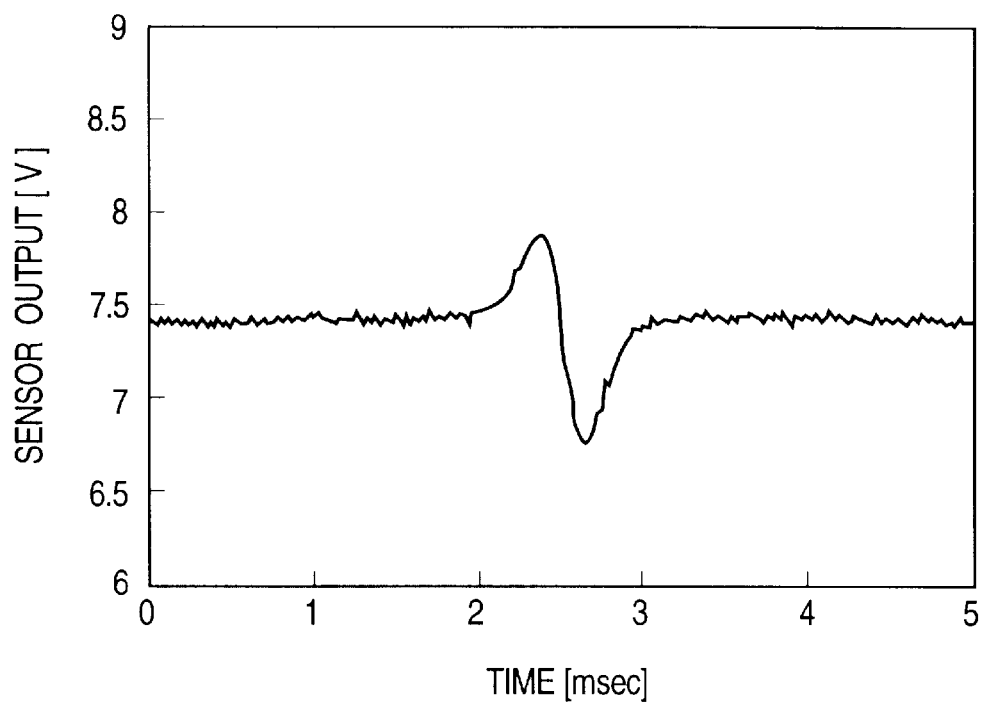
FIGS. 19A and 19B are graphs showing measured results of a one-pixel digital latent image formed by a laser exposure device having scan line density of 600 dpi.
Figure 19B:
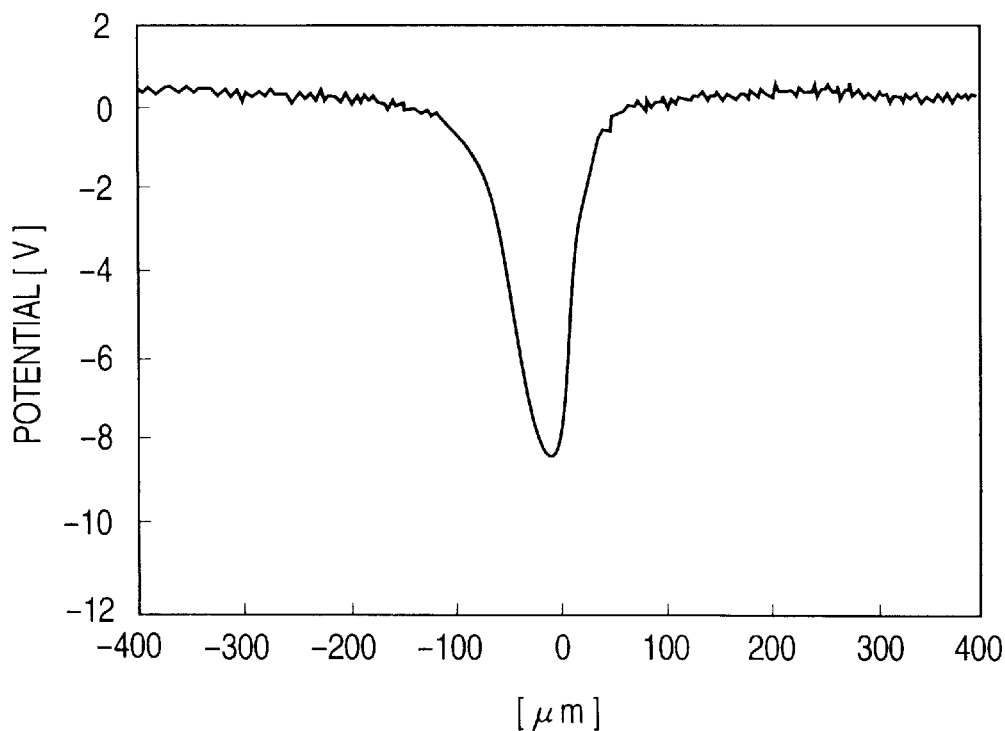
Figure 20A:
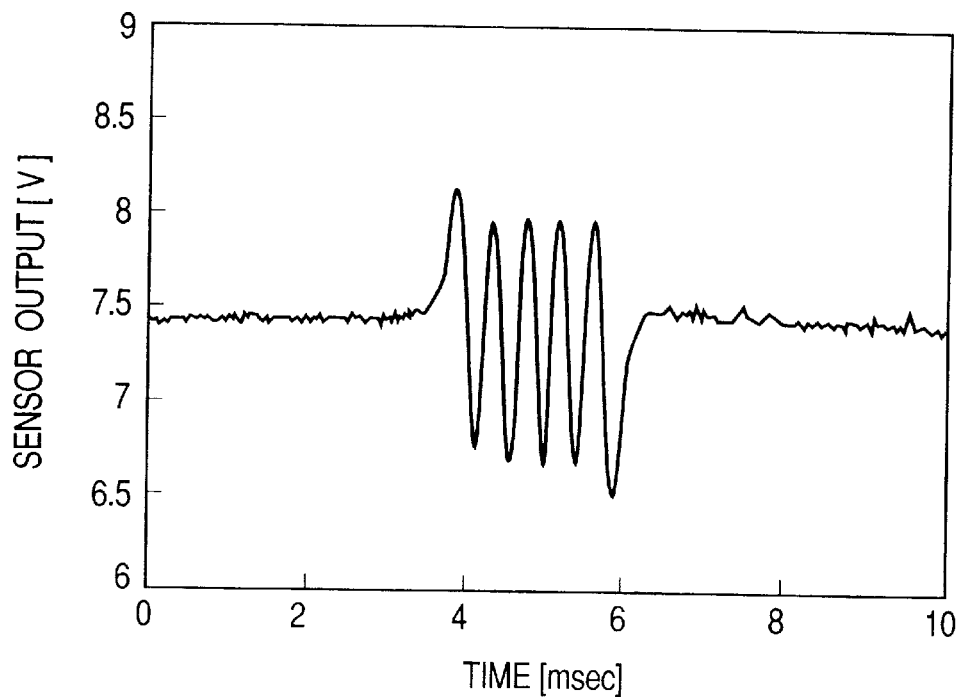
FIGS. 20A and 20B are graphs showing measured results of a one-dot/one-space digital latent image formed by a laser exposure device having scan line density of 600 dpi.
Figure 20B:
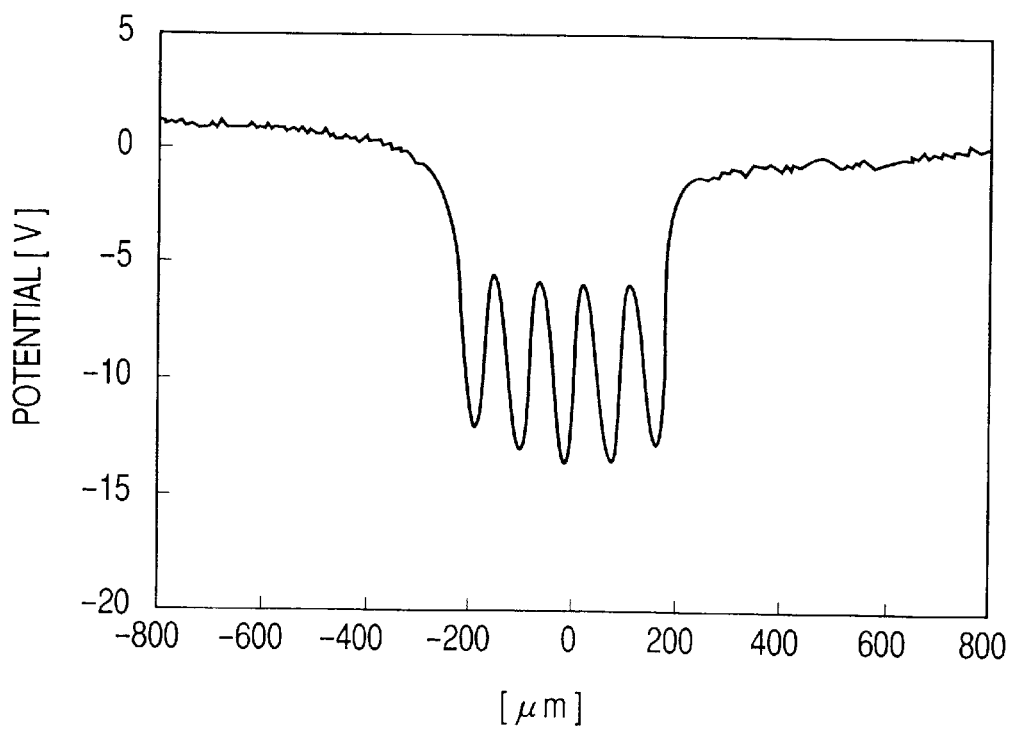

FIGS. 19A and 19B and FIGS. 20A and 20B are graphs showing measured results obtained by effecting measurement in a condition that surface potential in a dark condition is set to 100V. Particularly, FIGS. 19A and 19B are graphs showing measured results of a one-pixel (referred to as "dot", if desired) digital latent image formed by a laser exposure device having scan line density of 600 dpi, and FIGS. 20A and 20B are graphs showing measured results of a one-dot/one-space digital latent image formed by a laser exposure device having scan line density of 600 dpi. FIGS. 19A and 20A show the potential configurations in a form of a detected waveform, and FIGS. 19B and 20B show the potential configurations in a form of a waveform after integration analysis. As apparent from these Figures, the digital latent image can be measured with very high accuracy. In the analyzing method according to the illustrated embodiment, it is required that a width of the detecting portion of the potential sensor is smaller than a width of change in potential to be measured.

Incidentally, the potential sensor 301 has a board-shaped structure. In this case, a thickness of the board, i.e., a thickness of the detecting portion greatly affects an influence upon a detecting resolving power. Fundamentally, although the thickness of the board is desirable to be smaller as can as possible, if the thickness is decreased, since signal intensity is reduced accordingly, the thickness of the board has lower limitation. It is desirable that the thickness is within a range of 1 $\mu$m to 500 $\mu$m. Further, a length of the signal detecting portion of the potential sensor in a direction transverse to the relative movement direction (i.e., in an axial direction of the photosensitive drum) affects an affects an influence upon intensity of the signal to be detected. That is to say, the greater the length the stronger the signal intensity. However, if the length is increased, parallelism to the surface to be measured is apt to be worsened to cause reduction in the resolving power. Thus, it is desirable that the length of the detecting portion is within a range of 0.2 mm to 10 mm.

The detecting resolving power greatly depends upon the linearity and parallelism of the detecting portion of the potential sensor, and, thus, it is preferable that the linearity and parallelism (regarding the direction parallel to the surface to be measured and perpendicular to the relative movement direction (direction perpendicular to the plane of FIG. 17)) of the detecting electrode are within 300%.

In the illustrated embodiment, the detected signal, i.e., dielectric current is proportional to the relative movement speed as mentioned above. That is to say, by increasing the relative movement speed, the signal intensity is increased, thereby obtaining a signal having good S/N ratio. However, if the speed is too high, due to influence of time constant based on the connected circuit element, the S/N ratio may be worsened.

To avoid this, it is preferable that the relative movement speed is within a range of 10 mm/sec to 10000 mm/sec. It is not so preferable that a distance between the potential sensor and the surface to be measured (referred to as "measurement interval" hereinafter) is changed during the relative movement. Thus, in the illustrated embodiment, there is provided a means for keeping the distance (between the potential sensor and the surface to be measured) constant. This can be achieved by various means.

For example, there is provided a mechanism for keeping the distance constant mechanically by using a roller or a spacer, or a method in which the distance is monitored by a laser gap sensor or an eddy current displacement sensor and control is effected by a motor to always keep the distance constant. Further, a set value of the measurement interval affects an influence upon measurement accuracy. In order to measure the potential configuration of the surface, it is preferable that the measurement interval is small. However, if the measurement interval is too small, discharge may be generated between the potential sensor and the surface, thereby distorting the electric field. To avoid this, it is preferable that the measurement interval is within a range of 10 $\mu$m to 300 $\mu$m.

In the above-mentioned measuring method, one-dimensional (in the relative movement direction) potential configuration can be obtained by a signal from the signal potential sensor. Further, in the illustrated embodiment, by providing a plurality of potential sensors, two-dimensional potential configuration of the surface to be measured can be measured. Such plurality of electrodes are disposed side by side along a direction perpendicular to the relative movement direction, i.e., the axial direction of the photosensitive drum (i.e., direction substantially perpendicular to the plane of Figure) in the apparatus shown in FIGS. 17 and 18.

In the above-mentioned arrangement of the apparatus, the relative movement between the potential sensor and the drum surface is generated by rotation of the photosensitive drum. Namely, the drum surface is movable with respect to the potential sensor. However, in the measuring method according to the illustrated embodiment, the potential sensor may be movable with respect to the drum surface.

[Test Examples and Embodiments]

Now, test examples and embodiments will be explained concretely. Incidentally, the present invention is not limited to such embodiments. Further, the detecting resolving power in the tests is evaluated as 1/e$^2$ half value width of a potential signal obtained when a digital latent image corresponding to one pixel measured.

<Test Example 6>

Figure 21:
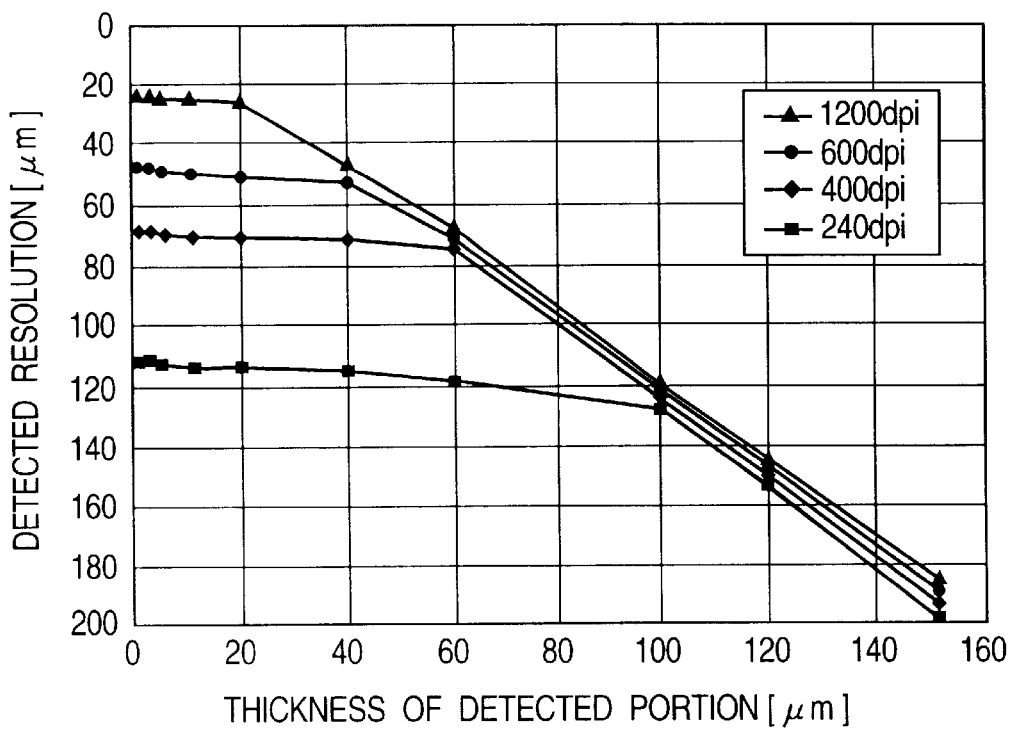
FIG. 21 is a graph showing a relation between a thickness and a detecting resolving power of a detecting portion of the potential sensor.

FIG. 21 shows a measured result of the potential configuration of the digital latent image obtained by a laser exposure device having scan line density of 400 dpi to 1200 dpi in a test effected by using the potential configuration measuring apparatus shown in FIG. 17. Measuring conditions are as shown in the following Table 10:

TABLE 10

| | |
|---|---|
| thickness of detecting portion | 1 to 100 [$\mu$m] |
| length of detecting portion | 1 [mm] |
| measurement interval | 10 [$\mu$m] |
| relative movement speed | 300 [mm/sec] |

From FIG. 21, it can be seen that the detecting resolving power strongly depends upon the thickness of the detecting portion, and, as the thickness is decreased, the detecting resolving power is improved. Namely, in the measured result of the digital latent image having 1200 dpi, when the thickness of the detecting portion becomes smaller than a diameter (≈20 $\mu$m) of a spot of the laser, the potential configuration can be measured with a high resolving power nearer to the diameter of the laser spot. Similarly, also in case of 600 dpi and 400 dpi, when the thickness is smaller than the diameter of the laser spot, the resolving power near the spot diameter can be obtained. Incidentally, even when the potential sensor including the detecting portion having a thickness of 1 $\mu$m is used, a signal having excellent S/N ratio can be obtained.

Figure 22:
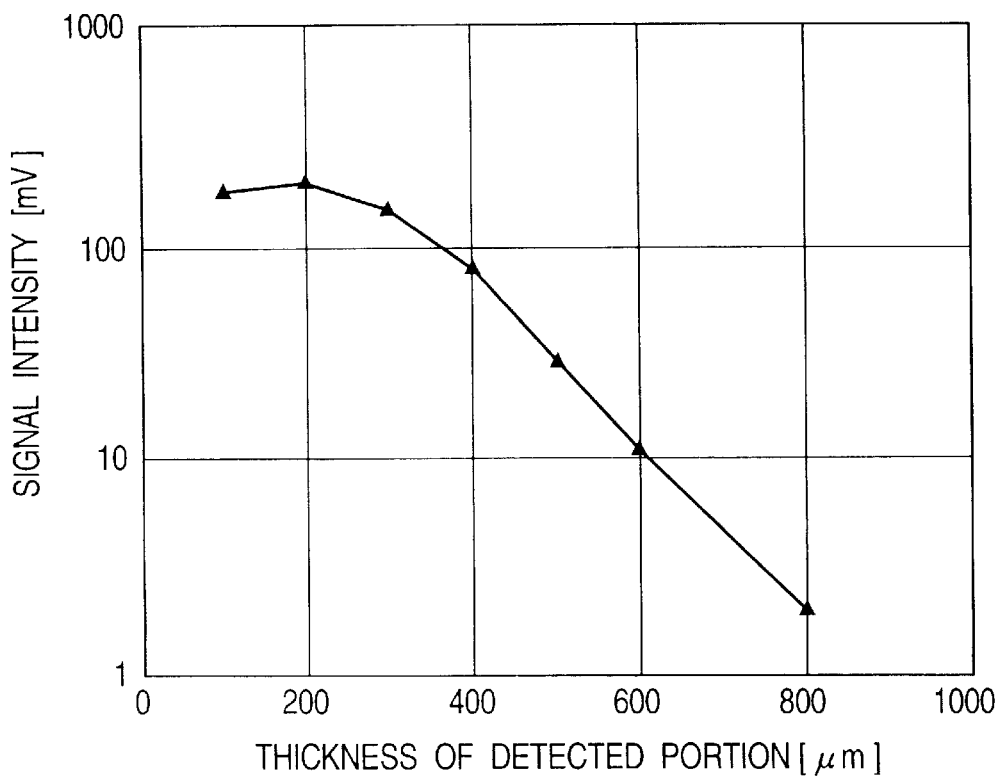
FIG. 22 is a graph showing a relation between a thickness and signal intensity of a detecting portion of the potential sensor.

On the other hand, regarding the signal intensity, in the arrangement shown in FIG. 17, as the thickness of the detecting portion is increased, the signal intensity is also decreased. FIG. 22 shows a detailed result of a relation between the thickness of the detecting portion and the signal intensity. The change in potential in this case is formed by image exposure having a width of 2 mm so that it becomes greater than the thickness of the detecting portion. As shown in FIG. 22, it was found that, if the thickness exceeds 500 $\mu$m, the signal intensity is decreased. That is to say, it was found that, in a range where the thickness exceeds 500 $\mu$m, both the detecting resolving power and the signal intensity are worsened, which is not suitable for the measurement of the surface potential configuration according to the present invention.

<Test Example 7>

Figure 23:
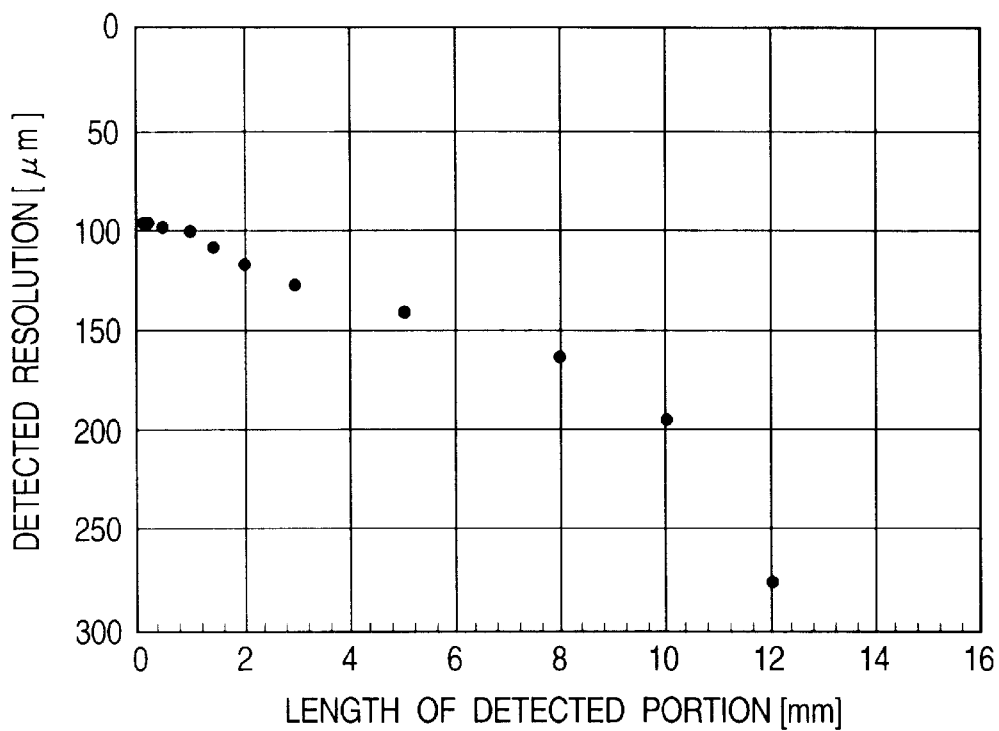
FIG. 23 is a graph showing a relation between a length and a detecting resolving power of a detecting portion of the potential sensor.
Figure 24:
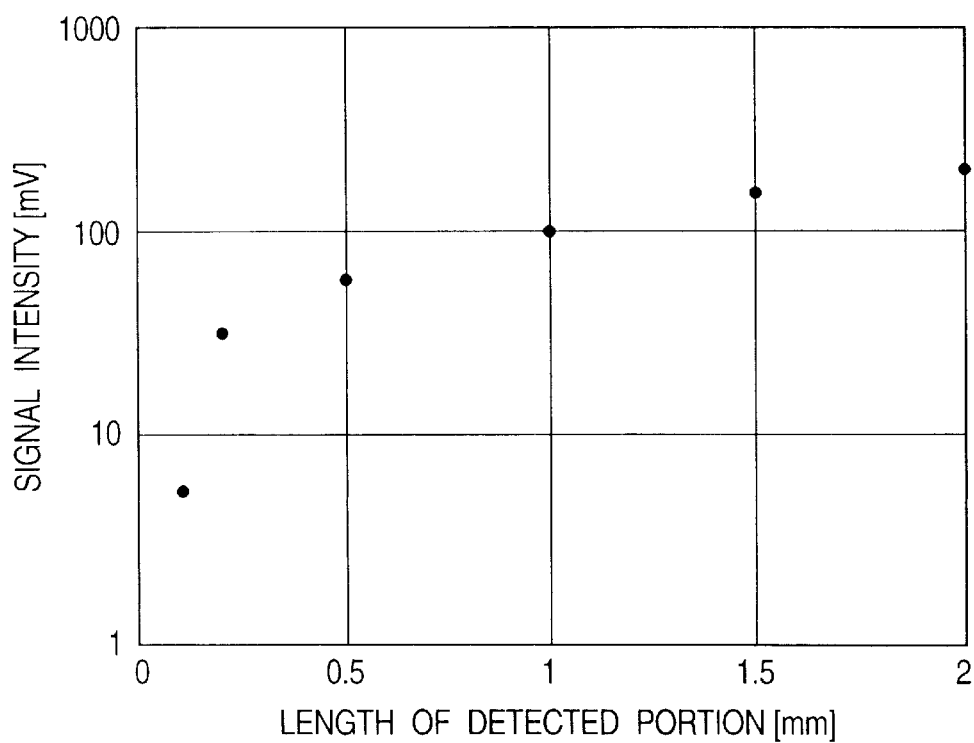
FIG. 24 is a graph showing a relation between a length and signal intensity of a detecting portion of the potential sensor.

FIGS. 23 and 24 show test results providing a relation between a length of the detecting portion used in the potential sensor and the detecting resolving power and a relation between the wire length and the signal intensity in tests effected by using the potential configuration measuring apparatus shown in FIG. 17. Measuring conditions are as shown in the following Table 11:

TABLE 11

| | |
|---|---|
| thickness of detecting portion | 10 [$\mu$m] |
| length of detecting portion | 0.1 to 15 [mm] |
| measurement interval | 10 [$\mu$m] |
| relative movement speed | 300 [mm/sec] |

As apparent from FIGS. 23 and 24, the thickness of the detecting portion is associated with the signal intensity and the detecting resolving power. As the thickness of the detecting portion is increased, the detecting resolving power is worsened. However, an absolute value of the detecting resolving power strongly depends upon the thickness of the detecting portion more than the length of the detecting portion. Thus, it is considered that, when the length of the detecting portion is increased, the resolving power inherently included in the wire cannot be reached. According to the result shown in FIG. 23, when the length of the detecting portion is 10 mm, the detecting resolving power is worsened about twice in comparison with the case where the length is 1 mm. Thus, it is not so preferable to select a length greater than 10 mm.

Further, as shown in FIG. 24, as the length is decreased, the signal intensity is also reduced, and, it was found that, when the length becomes smaller than 0.2 mm, it is difficult to effect the detection.

<Test Example 8>

Figure 25:
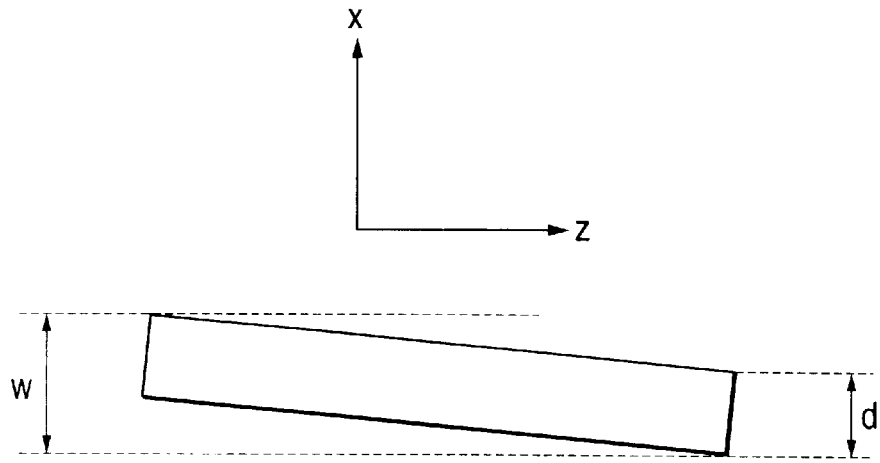
FIG. 25 is a schematic view showing definition of parallelism of the detecting portion of the potential sensor.

Tests for seeking linearity and parallelism of the detecting portion of the potential sensor and the detecting resolving power were effected by using the potential configuration measuring apparatus shown in FIG. 17. FIG. 25 is a schematic view showing definition of the parallelism. A relative movement direction "X" indicates a relative movement direction, "Y" indicates a direction perpendicular to the plane of FIG. 25 and perpendicular to the surface to be measured and "Z" indicates a direction perpendicular to the directions X and Y. Test conditions and test result are shown in the following Table 12 and FIGS. 16A to 16D, respectively.

TABLE 12

| thickness of detecting portion | 10 [$\mu$m] |
| length of detecting portion | 1 [mm] |
| measurement interval | 10 [$\mu$m] |
| relative movement speed | 300 [mm/sec] |
| scan line density | 600 [dpi] |

Figure 26:
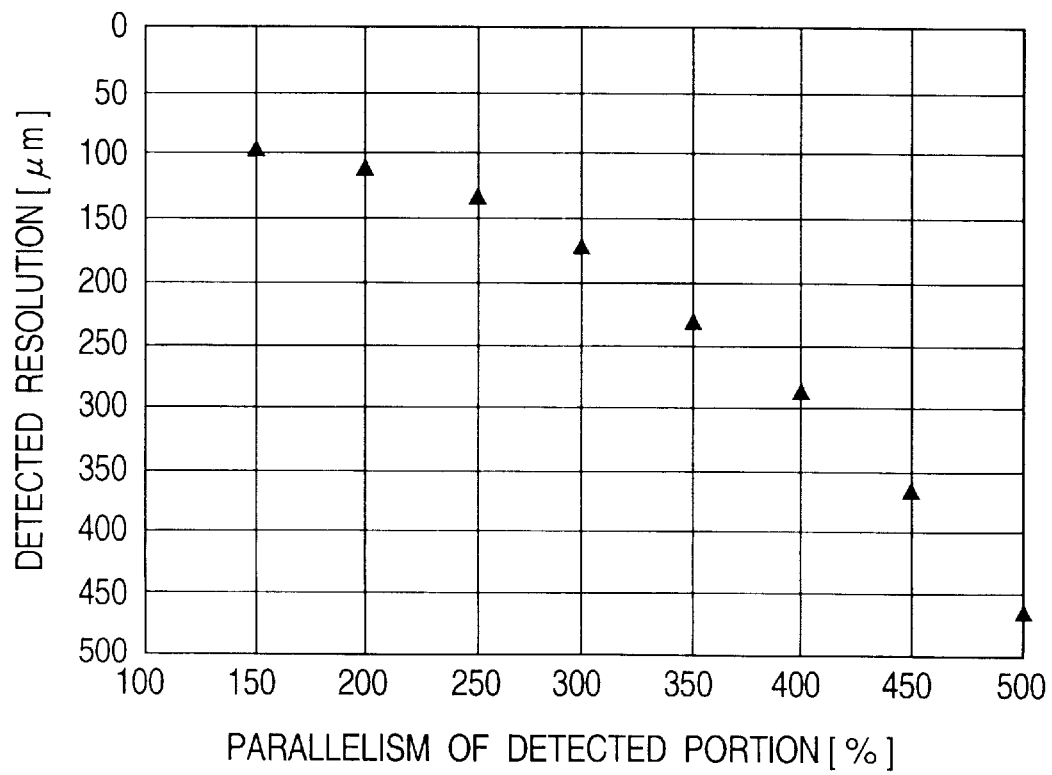
FIG. 26 is a graph showing a relation between a parallelism and a detecting resolving power of the detecting portion of the potential sensor.

As apparent from FIG. 26, the parallelism of the wire is associated with the resolving power, and, it was found that, when the parallelism is worsened, the detecting resolving power is also worsened. However, an absolute value of the detecting resolving power strongly depends upon the thickness of the detecting portion more than the parallelism. Thus, it is considered that, when the parallelism is worsened, the resolving power inherently included in the wire cannot be reached. In the result shown, in FIG. 26, it can be seen that, if the parallelism of the wire exceeds 300%, the detecting resolving power is worsened about twice in comparison with the detecting resolving power in the case where the parallelism of the wire is 150%. Thus, it is not so preferable that the parallelism of the wire exceeds 300%.

<Test Example 9>

Figure 27:
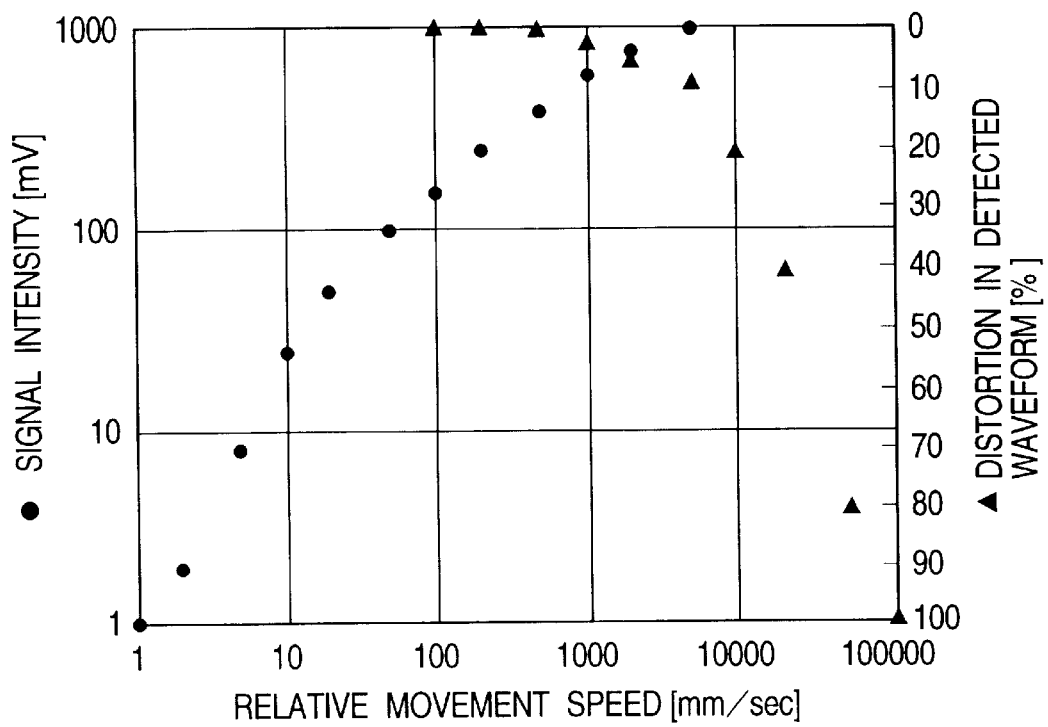
FIG. 27 is a graph showing a relation between a relative movement speed between a surface to be measured and a potential sensor and signal intensity and distortion of a detected waveform of the potential sensor.

FIG. 27 shows a test result providing a relation between the relative movement speed and the signal intensity and distortion of a measured waveform in the test effected by using the potential configuration measuring apparatus shown in FIG. 17. Measuring conditions are as shown in the following Table 13:

TABLE 13

| thickness of detecting portion | 10 [$\mu$m] |
| length of detecting portion | 1 [mm] |
| measurement interval | 10 [$\mu$m] |
| relative movement speed | 10 to 100000 [mm/sec] |
| scan line density | 600 [dpi] |

As is apparent from FIG. 27, if the relative movement speed becomes smaller than 10 mm/sec, the signal intensity becomes weak, with the result that a waveform having excellent S/N ratio cannot be obtained. Further, if the relative movement speed becomes greater than 10000 mm/sec, distortion is generated in the detected waveform by the influence of the time constant based on the measuring system, with the result that the potential configuration on the surface cannot be measured correctly.

<Test Example 10>

Figure 28:
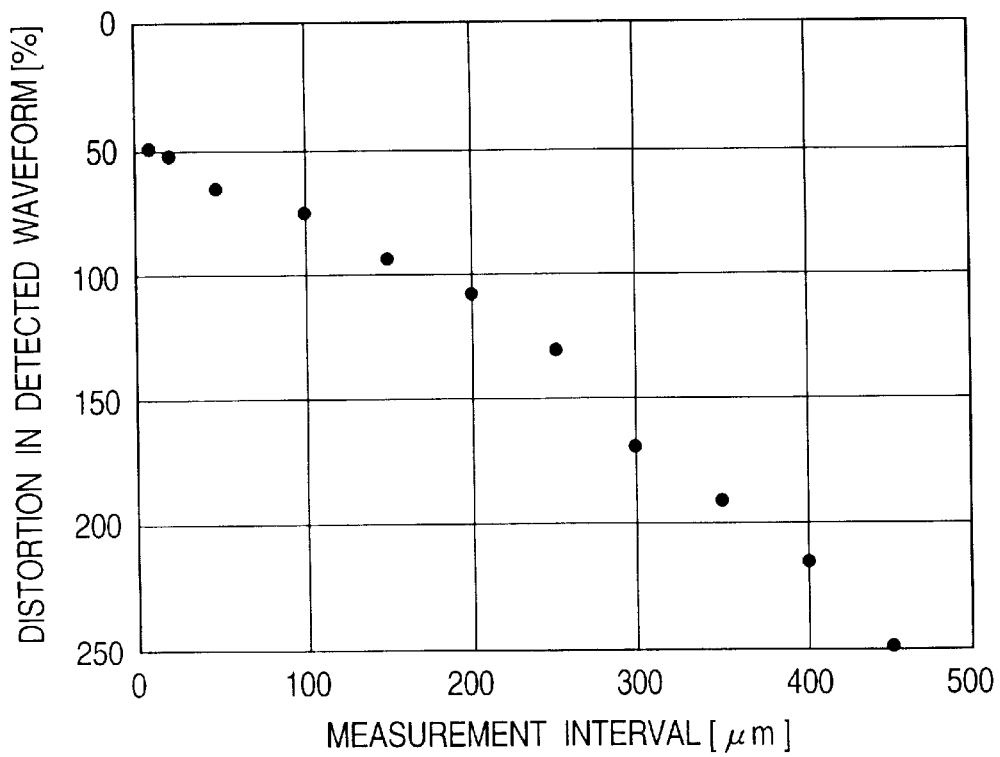
FIG. 28 is a graph showing a relation between a measurement interval and distortion of a detected waveform.

FIG. 28 shows a test result providing a relation between the measurement interval and the detecting resolving power in the test effected by using the potential configuration measuring apparatus shown in FIG. 17. Measuring conditions are as shown in the following Table 14:

TABLE 14

| thickness of detecting portion | 10 [$\mu$m] |
| length of detecting portion | 1 [mm] |
| measurement interval | 5 to 500 [$\mu$m] |
| relative movement speed | 300 [mm/sec] |
| scan line density | 600 [dpi] |

Judging from the result shown in FIG. 28, it seems that, as the measurement interval is increased, the detecting resolving power is reduced. However, this is due to the fact that the actual potential has spatial extension but is not caused by the measuring system. In order to correctly evaluate the potential configuration near the surface, it is preferable that the measurement interval is 200 $\mu$m or less, and more preferably, 100 $\mu$m or less.

That is to say, when the spatial extension of the potential configuration is evaluated, the measurement interval can be selected voluntarily. If the measurement interval is smaller than 10 $\mu$m, discharge is generate between the surface potential and the potential sensor to distort the detected waveform considerably, thereby making the measurement of the potential configuration of the surface impossible.

[Embodiment 5]

Next, a case where the potential configuration measuring apparatus shown in FIG. 17 is manufactured and potential sensors having detecting portions having different thicknesses are manufactured and the potential configurations of the surface are measured by using these apparatus and sensors will be explained. The following Table 15 shows measured results:

TABLE 15

| a [$\mu$m] | b [$\mu$m] | c [mm] | d [mm/sec] | e [$\mu$m] | f [dpi] |
|---|---|---|---|---|---|
| 1 | 26 | 1.0 | 300 | 10 | 1200 |
| 10 | 28 | 1.0 | 300 | 10 | 1200 |
| 30 | 53 | 1.0 | 300 | 10 | 600 |
| 50 | 72 | 1.0 | 300 | 10 | 400 |
| 100 | 120 | 1.0 | 300 | 10 | 240 |
| 1000 | 1000 or more | 1.0 | 300 | 10 | 240 | a: thickness of detecting portion
b: detecting resolving power
c: length of detecting portion
d: relative movement speed
e: measurement interval
f: scan line density As shown in the Table 15, in the sensors including the detecting portions having thicknesses of 1 $\mu$m to 500 $\mu$m, in all cases, the measurement can be performed with the resolving power near the diameter of the laser spot, thereby obtaining the resulting power sufficient to measure the digital latent image.

To the contrary, in case of the potential sensors including the detecting portions having a thickness of 1 mm, an S/N ratio or a resolving power sufficient to measure the digital latent image cannot be obtained.

[Embodiment 6]

Figure 29:
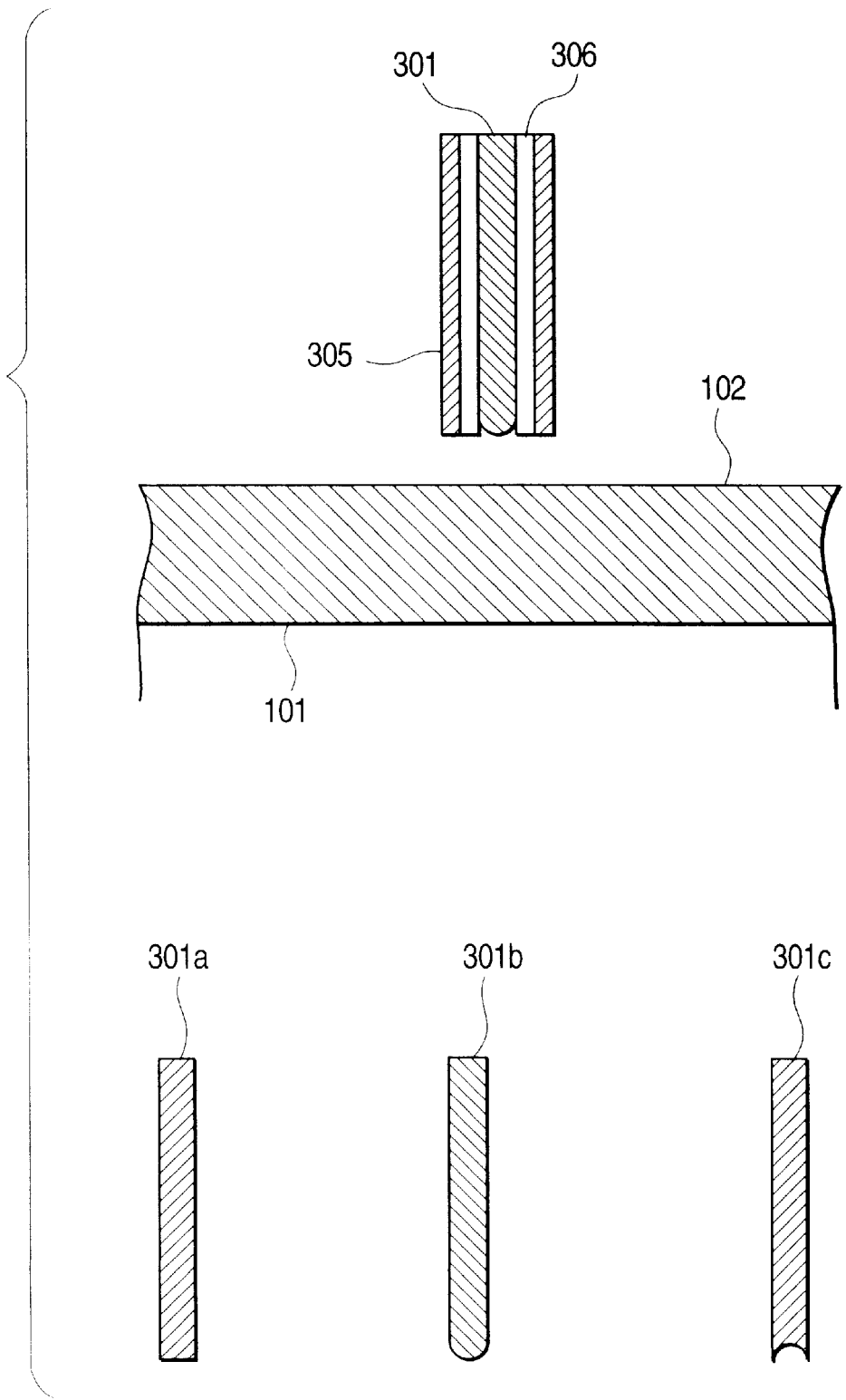
FIG. 29 is a schematic sectional view of the potential sensor according to the second embodiment, looked at from the same direction as FIG. 17.

Next, a case where the potential configuration measuring apparatus shown in FIG. 17 is manufactured and potential sensors having detecting portions having sectional shapes (taken along the plane perpendicular to the surface to be measured and parallel to the relative movement direction, i.e., shapes (looked at from the direction shown in FIG. 17) shown by 301a to 301c in FIG. 29 are manufactured and the potential configuration of the surface is measured by using these apparatus and sensors will be explained. The following Table 16 shows measured results:

TABLE 16

| Sensor shape | a [μm] | b [μm] | c [mm] | d [mm/sec] | e [μm] | f [dpi] |
| --- | --- | --- | --- | --- | --- | --- |
| 301a I | 49 | 10 | 1.0 | 300 | 10 | 600 |
| 301b II | 54 | 10 | 1.0 | 300 | 10 | 600 |
| 301c III | 62 | 10 | 1.0 | 300 | 10 | 600 | a: detecting resolving power
b: thickness of detecting portion
c: length of detecting portion
d: relative movement speed
e: measurement interval
f: scan line density
I: rectangular shape
II: round shape
III: concave shape As shown in the Table 16, in three shapes shown by 301a to 301c in FIG. 29, there are no great differences in the detecting resolving power, and, the resolving power sufficient to measure the digital latent image can be obtained by any one of these shapes.

[Embodiment 7]

Next, a case where potential configurations of surfaces of a flat board-shaped photosensitive body and a belt-shaped photosensitive body were measured by using the potential sensor of the potential configuration measuring apparatus shown in FIG. 17 will be explained. The following Table 17 shows measured results:

TABLE 17

| Photo-sensitive body shape | a [μm] | b [μm] | c [mm] | d [mm/sec] | e [μm] | f [dpi] |
| --- | --- | --- | --- | --- | --- | --- |
| drum shape | 51 | 10 | 1.0 | 300 | 10 | 600 |
| flat board shape | 57 | 10 | 1.0 | 300 | 10 | 600 |
| belt shape | 59 | 10 | 1.0 | 300 | 10 | 600 | a: detecting resolving power
b: wire diameter
c: wire length
d: relative movement speed
e: measurement interval
f: scan line density As shown in the Table 17, the surface potential measuring apparatus can have a resolving power sufficient to measure the digital latent image in the flat board-shaped photosensitive body and the belt-shaped photosensitive body, as well as the drum-shaped photosensitive body.

[Embodiment 8]

In the potential configuration measuring apparatus shown in FIG. 17, the relative movement is generated between the potential sensor and the surface by rotation of the photosensitive drum. Now, by improving such an apparatus, a case where potential configuration along the axial direction of the photosensitive drum was measured by shifting the potential sensor along the axial direction of the photosensitive drum will be explained. The following Table 18 shows a measured result:

TABLE 18

| Relative movement direction | relative movement means | a [μm] | b [μm] | c [mm] | d [mm/sec] | e [μm] | f [dpi] |
| --- | --- | --- | --- | --- | --- | --- | --- |
| circumference of drum | rotation of drum | 53 | 10 | 1.0 | 300 | 10 | 600 |
| axis of drum | shift of sensor | 64 | 10 | 1.0 | 300 | 10 | 600 | a: detecting resolving power
b: thickness of detecting portion
c: length of detecting portion
d: relative movement speed
e: measurement interval
f: scan line density As shown in the Table 18, by shifting the potential sensor, also in an arrangement in which the relative movement is generated, a resolving power and intensity sufficient to measure the digital latent image can be obtained. From the result, it can be seen that the surface potential measuring method according to the illustrated embodiment can be applied to the arrangement in which the potential sensor is movable with respect to the drum surface, as well as the arrangement in which the relative movement between the potential sensor and the drum surface is achieved by the rotation of the photosensitive drum, i.e., the drum surface is movable with respect to the potential sensor.

In this way, according to the second embodiment, in the surface potential measurement wherein the dielectric current generated by the relative movement between the potential sensor and the surface to be measured is detected and analyzed, by using the potential sensor having the characteristic that the sectional shape of the detecting portion of the potential sensor is constituted by the board-shaped conductive body having the extension in the plane perpendicular to the surface to be measured and perpendicular to the relative movement direction and the conductive portion other than the surface opposed to the surface to be measured is covered by the shield so that the dielectric current is not received from the portion other than the surface opposed to the surface to be measured, there can be provided the more efficient resolving power by about two or three times in comparison with the conventional potential sensor using the flat conductive board as the detecting electrode. Further, even when the width of the detecting electrode, the potential sensor can maintain the signal intensity, thereby providing a signal having excellent S/N ratio. Thus, the digital latent image which was conventionally considered to be hard to measure can be measured and the surface potential configuration thereof can be evaluated.

[[THIRD EMBODIMENT]]

Next, a second embodiment of the present invention will be fully explained with reference to the accompanying drawings.

Figure 30:
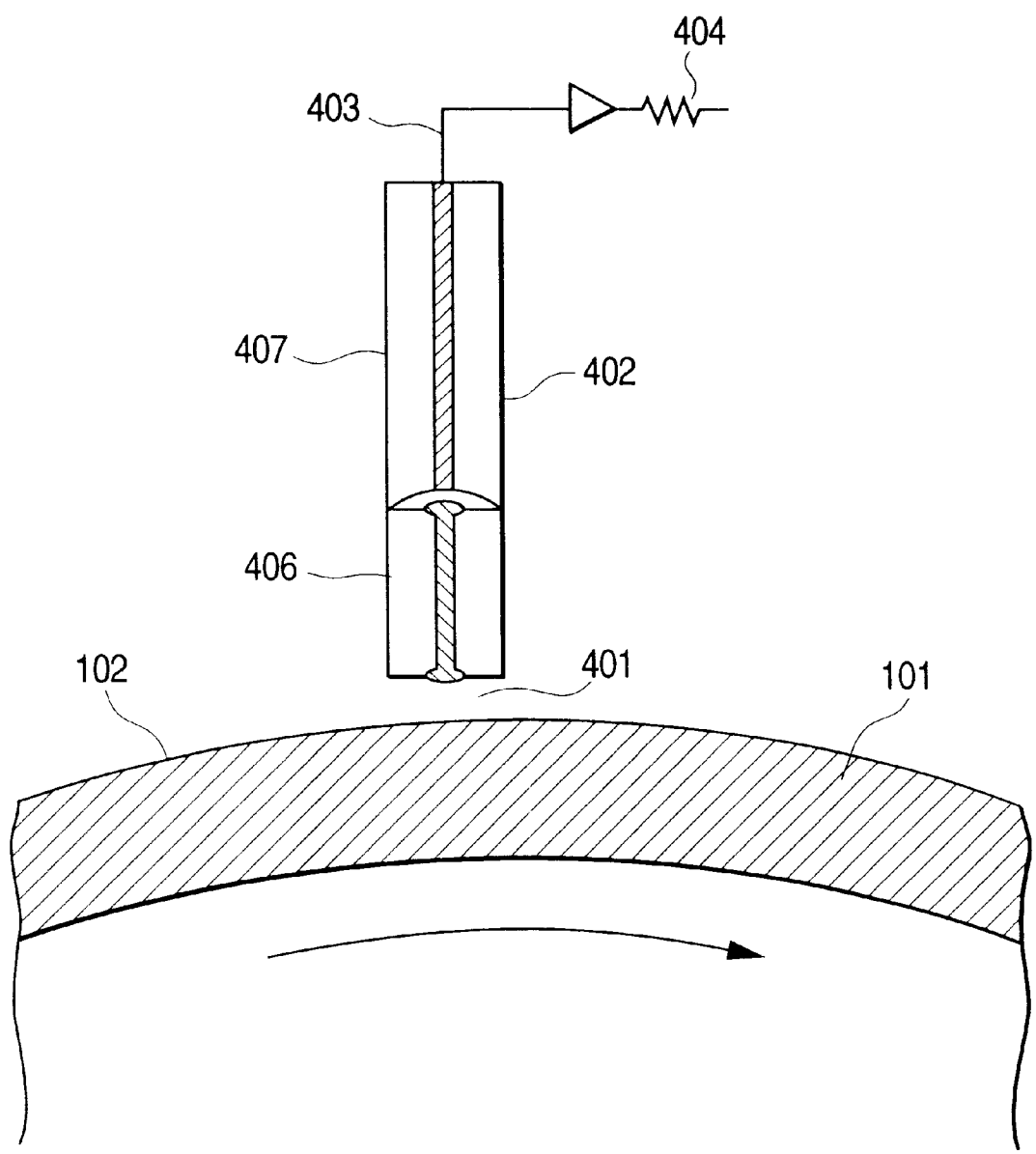
FIG. 30 is view showing a detailed structure of a potential measuring apparatus according to a third embodiment of the present invention.

FIG. 30 is a view showing a potential measuring apparatus according to a third embodiment of the present invention in detail. In FIG. 30, the reference numeral 401 denotes a potential sensor; 402 denotes a support; 403 denotes a conductive lead; and 304 denotes a circuit element. As shown, a detecting portion of the potential sensor 401 is constituted by a rod-shaped conductive body extending in perpendicular to a surface to be measured, and a conductive portion other than a surface opposed to the surface to be measured is covered by the shield so that dielectric current is not received from the portion other than the surface opposed to the surface to be measured.

The detecting portion of the potential sensor 401 is connected to the circuit element 404 via the conductive lead 403. Further, in the potential sensor 401, the conductive portion other than the surface opposed to the surface to be measured is covered by the shield 305 via an insulation body 406. If there is no shield 405, when the surface potential was measured, since signals were also detected by the surfaces other than the surface opposed to the surface to be measured, only a signal having bad S/N ratio was obtained, with the result that the potential configuration of the digital latent image could not measured correctly.

With the arrangement as mentioned above, in a case where a relative movement is generated between the potential sensor 401 and the surface 102, when it is assumed that a change amount of potential is dV and a relative movement speed is dx/dt, dielectric current proportional to dV/dt=(dV/dx)·(dx/dt) is generated in the potential sensor 401. In the illustrated embodiment, since the relative movement speed can be selected freely, the detected dielectric current includes information relating to gradient of surface potential. By initiating and analyzing this data, the surface potential configuration can be measured. Incidentally, integration constant used in analysis is determined to reproduce the potential configuration when the surface having a known potential configuration is measured.

Figure 31A:
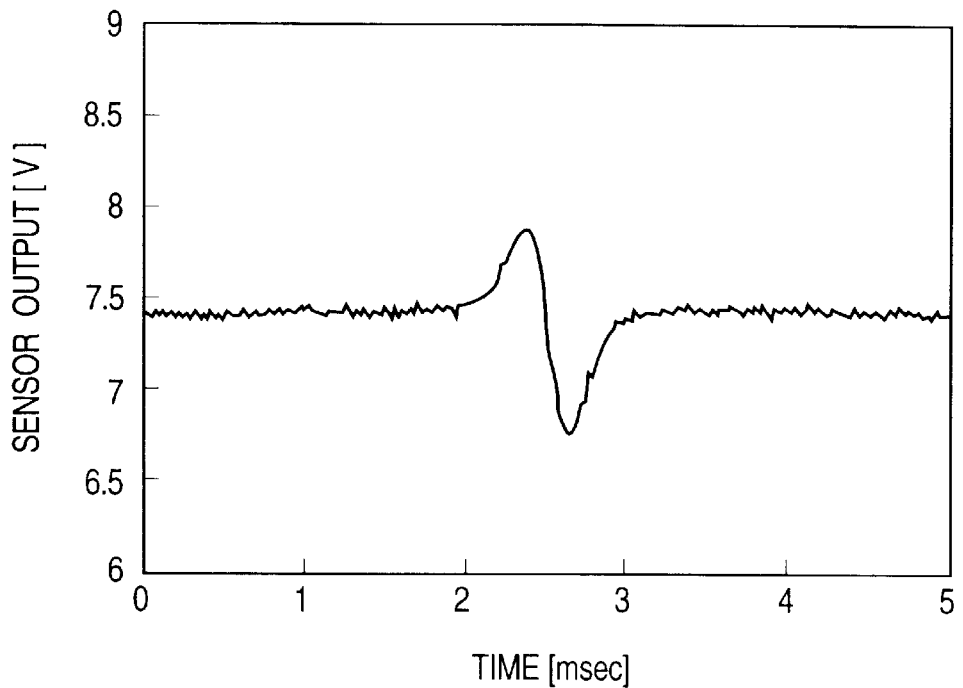
FIGS. 31A and 31B are graphs showing measured results of a one-pixel digital latent image formed by a laser exposure device having scan line density of 600 dpi.
Figure 31B:
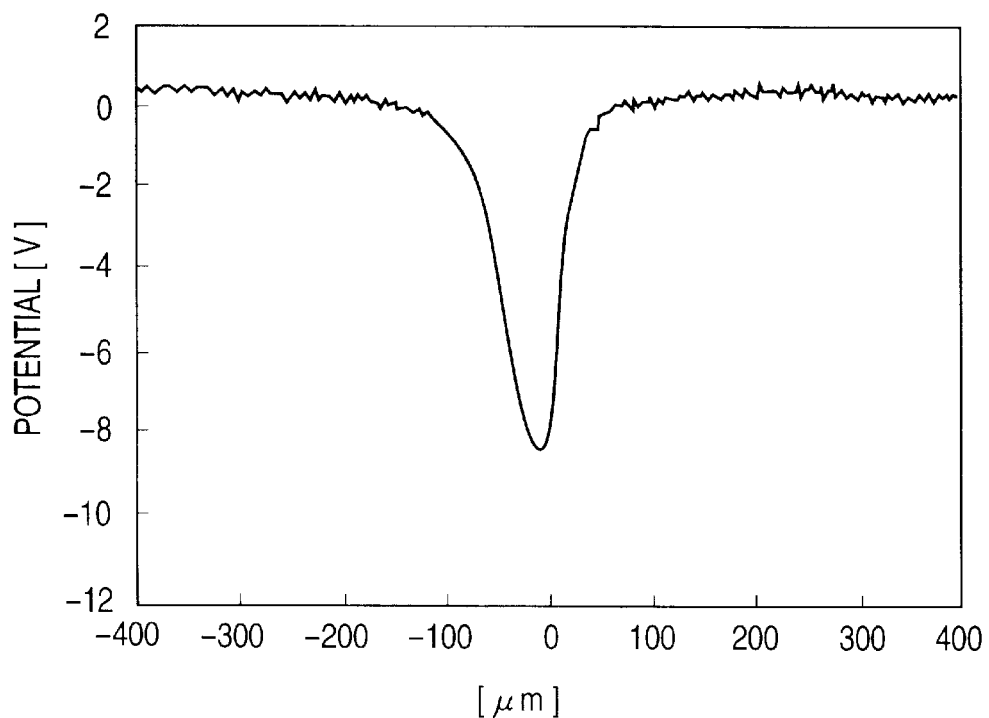
Figure 32A:
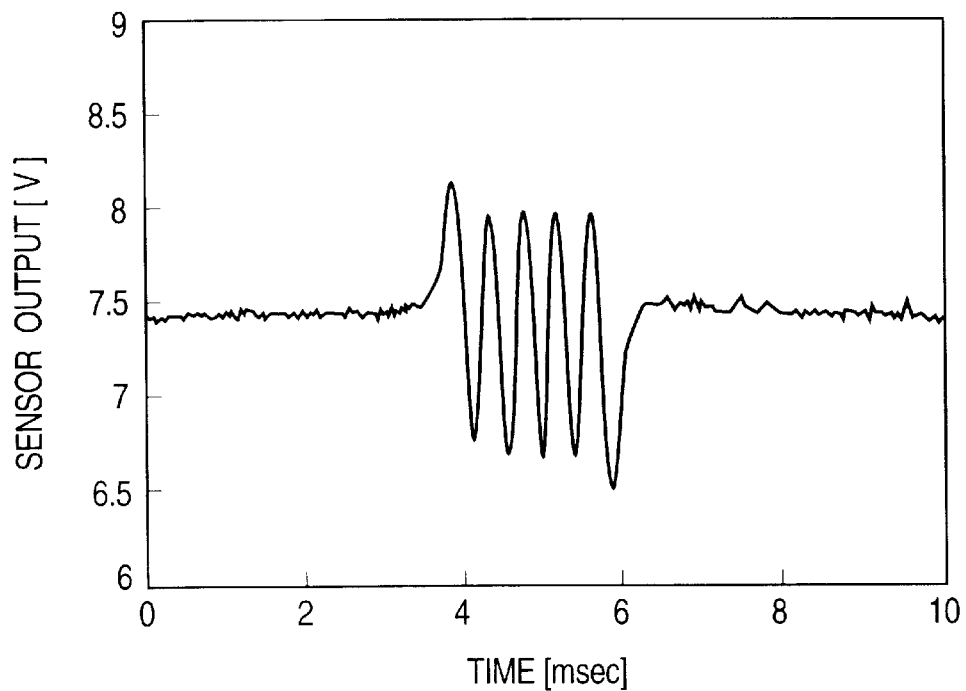
FIGS. 32A and 32B are graphs showing measured results of a one-dot/one-space digital latent image formed by a laser exposure device having scan line density of 600 dpi.
Figure 32B:
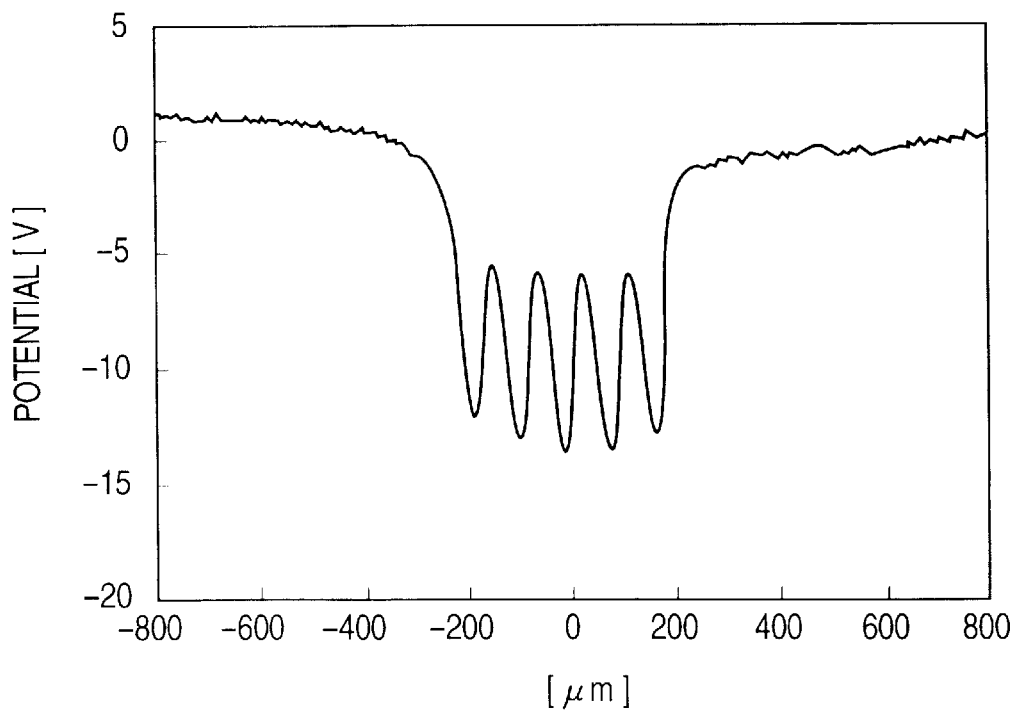

FIGS. 31A and 31B and FIGS. 32A and 32B are graphs showing measured results obtained by effecting measurement in a condition that surface potential in a dark condition is set to 100V. Particularly, FIGS. 31A and 31B are graphs showing measured results of a one-pixel (referred to as "dot", if desired) digital latent image formed by a laser exposure device having scan line density of 600 dpi, and FIGS. 32A and 32B are graphs showing measured results of a one-dot/one-space digital latent image formed by a laser exposure device having scan line density of 600 dpi. FIGS. 31A and 32A show the potential configurations in a form of a detected waveform, and FIGS. 31B and 32B show the potential configurations in a form of a waveform after integration analysis. As apparent from these Figures, the digital latent image can be measured with very high accuracy. In the analyzing method according to the illustrated embodiment, it is required that a width of the detecting portion of the potential sensor is smaller than a width of change in potential to be measured.

Incidentally, the potential sensor 301 ha a rod-shaped structure. In this case, a width of a surface of the detecting portion of the potential sensor 401 opposed to the surface to be measured greatly affects an influence upon a detecting resolving power. Fundamentally, although the width of the surface opposed to the surface to be measured (referred to as "width of detecting portion" hereinafter) is desirable to be smaller as can as possible, if the width of the detecting portion is decreased, since signal intensity is reduced accordingly, the width of the detecting portion has lower limitation. It is desirable that the width of the detecting portion is within a range of 1 $\mu$m to 500 $\mu$m.

In the illustrated embodiment, the detected signal, i.e., dielectric current is proportional to the relative movement speed as mentioned above. That is to say, by increasing the relative movement speed, the signal intensity is increased, thereby obtaining a signal having good S/N ratio. However, if the speed is too high, due to influence of time constant based on the connected circuit element, the S/N ratio may be worsened.

To avoid this, it is preferable that the relative movement speed is within a range of 10 mm/sec to 10000 mm/sec. It is not so preferable that a distance between the potential sensor and the surface to be measured (referred to as "measurement interval" herein after) is changed during the relative movement. Thus, in the illustrated embodiment, there is provided a means for keep the distance (between the potential sensor and the surface to be measured) constant. This can be achieved by various means.

For example, there is provided a mechanism for keeping the distance constant mechanically by using a roller or a spacer, or a method in which the distance is monitored by a laser gap sensor an eddy current displacement sensor and control is effected by a motor to always keep the distance constant. Further, a set value of the measurement interval affects an influence upon measurement accuracy. In order to measure the potential configuration of the surface, it is preferable that the measurement interval is small. However, if the measurement interval is too small, discharge may be generated between the potential sensor and the surface, thereby distorting the electric field. To avoid this, it is preferable that the measurement interval is within a range of 10 $\mu$m to 300 $\mu$m.

In the above-mentioned measuring method, one-dimensional (in the relative movement direction) potential configuration can be obtained by a signal from the single potential sensor. Further, in the illustrated embodiment, by providing a plurality of potential sensors, two-dimensional potential configuration of the surface to be measured can be measured. Such plurality of electrodes are disposed side by side along a direction transverse to the relative movement direction, i.e., the axial direction of the photosensitive drum (i.e., direction substantially perpendicular to the plane of Figure) in the apparatus shown in FIG. 30.

In the above-mentioned arrangement of the apparatus, the relative movement between the potential sensor and the drum surface is generated by rotation of the photosensitive drum. Namely, the drum surface is movable with respect to the potential sensor. However, in the measuring method according to the illustrated embodiment, the potential sensor may be movable with respect to the drum surface.

[Test Examples and Embodiments]

Now, test examples and embodiments will be explained concretely. Incidentally, the present invention is not limited to such embodiments. Further, the detecting resolving power in the tests is evaluated as 1/e$^2$ half value of a potential signal obtained when a digital latent image corresponding to one pixel is measured.

<Test Example 11>

Figure 33:
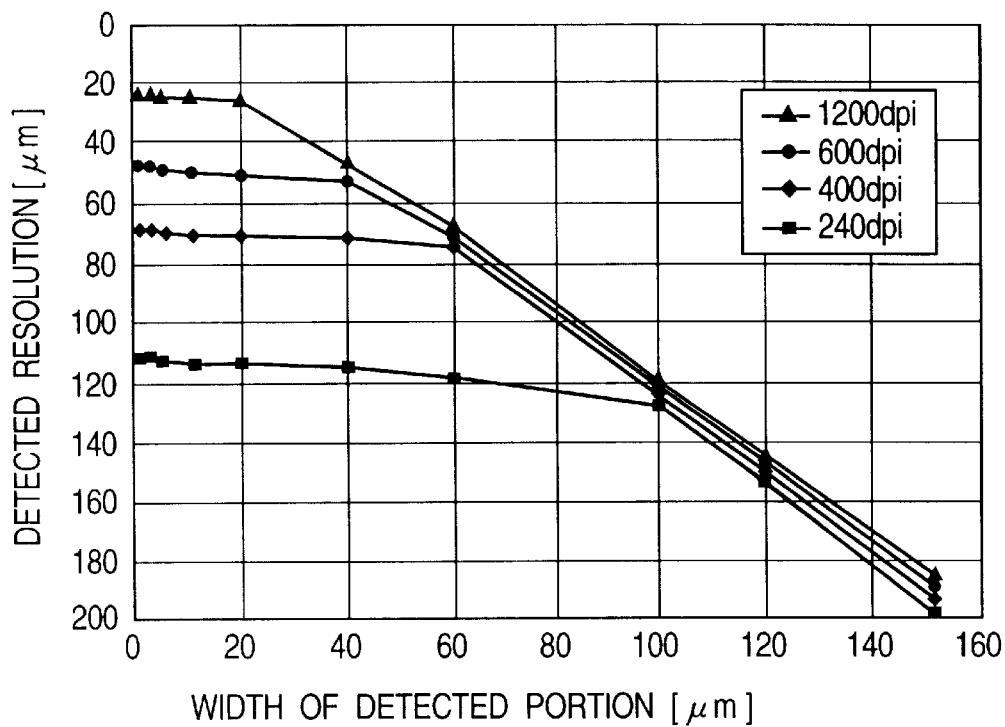
FIG. 33 is a graph showing a relation between a width and a detecting resolving power of a detecting portion of the potential sensor.

FIG. 33 shows a measured result of the potential configuration of the digital latent image obtained by a laser exposure device having scan line density of 400 dpi to 1200 dpi in a test effected by using the potential configuration measuring apparatus shown in FIG. 30. Measuring conditions are as shown in the following Table 19:

TABLE 19

| width of detecting portion | 1 to 500 [μm] |
|---|---|
| measurement interval | 10 [μm] |
| relative movement speed | 300 [mm/sec] |

From FIG. 33, it can be seen that the detecting resolving power strongly depends upon the width of the detecting portion, and, as the width is decreased, the detecting resolving power is improved. Namely, in the measured result of the digital latent image having 1200 dpi, when the width of the detecting portion becomes smaller than a diameter (≈20 μm) of a spot of the laser, the potential configuration can be measured with a high resolving power nearer to the diameter of the laser spot. Similarly, also in case of 600 dpi and 400 dpi, when the width is smaller than the diameter of the laser spot, the resolving power near the spot diameter can be obtained. Incidentally, even when the potential sensor including the detecting portion having a width of 1 μm is used, a signal having excellent S/N ratio can be obtained.

Figure 34:
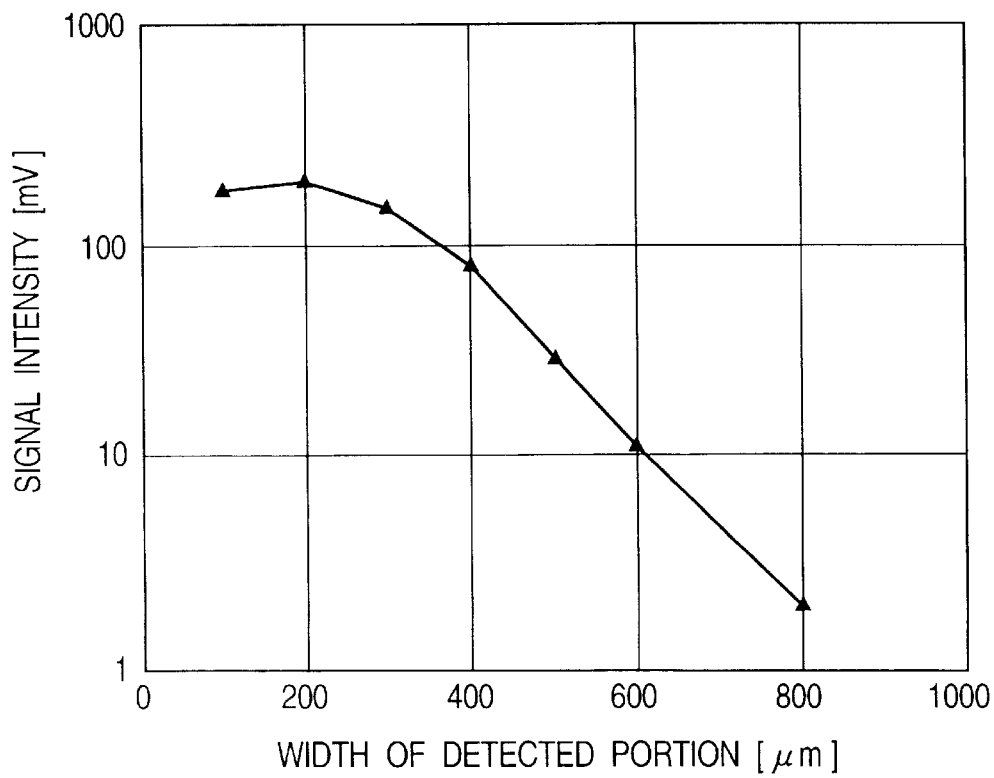
FIG. 34 is a graph showing a relation between a width and signal intensity of a detecting portion of the potential sensor.

On the other hand, regarding the signal intensity, in the arrangement shown in FIG. 30, as the width of the detecting portion is increased, the signal intensity is also decreased. FIG. 34 shows a detailed result of a relation between the width of the detecting portion and the signal intensity. The change in potential in this case is formed by image exposure having a width of 2 mm so that it becomes greater than the width of the detecting portion. As shown in FIG. 34, it was found that, if the width exceeds 500 μm, the signal intensity is decreased. That is to say, it was found that, in a range where the width exceeds 500 μm, both the detecting resolving power and the signal intensity are worsened, which is not suitable for the measurement of the surface potential configuration according to the present invention.

<Test Example 12>

Figure 35:
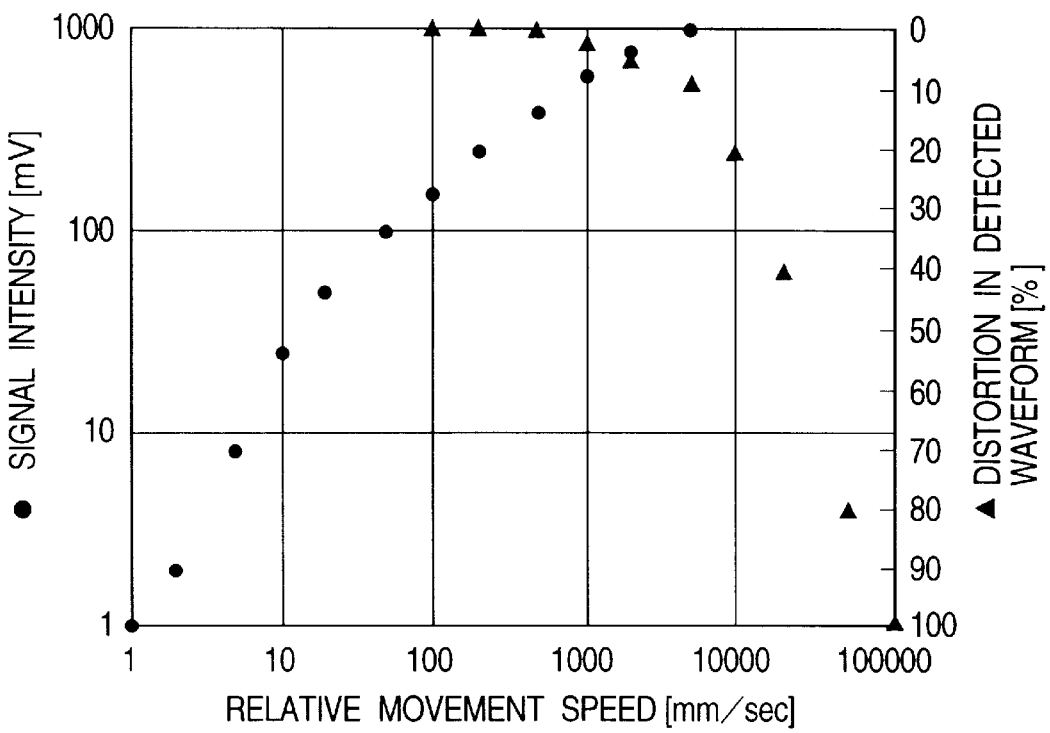
FIG. 35 is a graph showing a relation between a relative movement speed between a surface to be measured and a potential sensor and signal intensity and distortion of a detected waveform of the potential sensor.

FIG. 35 shows a test result providing a relation between the relative movement speed and the signal intensity and distortion of a measured waveform in the test effected by using the potential configuration measuring apparatus shown in FIG. 30. Measuring conditions are as shown in the following Table 20:

TABLE 20

| width of detecting portion | 30 [μm] |
|---|---|
| measurement interval | 30 [μm] |
| relative movement speed | 10 to 100000 [mm/sec] |
| scan line density | 600 [dpi] |

As apparent from FIG. 35, if the relative movement speed becomes smaller than 10 mm/sec, the signal intensity becomes weak, with the result that a waveform having excellent S/N ratio cannot be obtained. Further, if the relative movement speed becomes greater than 10000 mm/sec, distortion is generated in the detected waveform by the influence of time constant based on the measuring system, with the result that the potential configuration on the surface cannot be measured correctly.

<Test Example 13>

Figure 36:
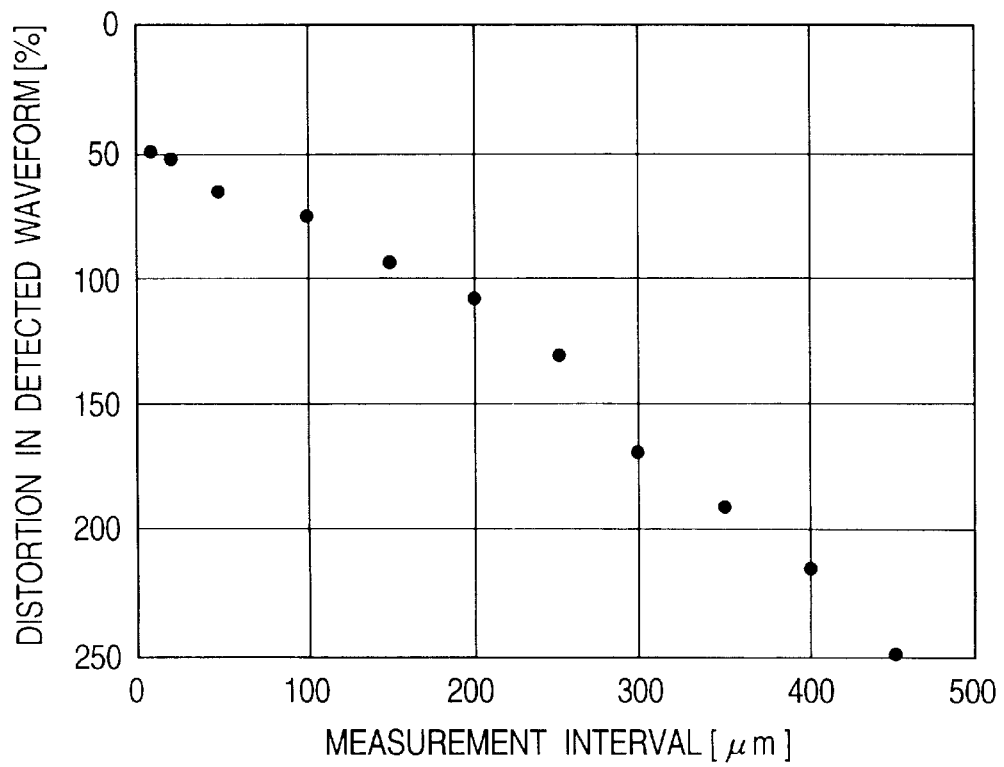
FIG. 36 is a graph showing a relation between a measurement interval and distortion of a detected waveform.

FIG. 36 shows a test result providing a relation between the measurement interval and the detecting resolving power in the test effected by using the potential configuration measuring apparatus shown in FIG. 30. Measuring conditions are as shown in the following Table 21:

TABLE 21

| width of detecting portion | 30 [μm] |
|---|---|
| measurement interval | 5 to 500 [μm] |
| relative movement speed | 300 [mm/sec] |
| scan line density | 600 [dpi] |

Judging from the result shown in FIG. 36, it seems that, as the measurement interval is increased, the detecting resolving power is reduced. However, this is due to the fact that the actual potential has spatial extension but is not caused by the measuring system. In order to correctly evaluate the potential configuration near the surface, it is preferable that the measurement interval is 200 μm or less, and more preferably, 100 μm or less.

That is to say, when the spatial extension of the potential configuration is evaluated, the measurement interval can be selected voluntarily. If the measurement interval is smaller than 10 μm, discharge is generate between the surface potential and the potential sensor to distort the detected waveform considerably, thereby making the measurement of the potential configuration of the surface impossible.

[Embodiment 9]

Figure 37A:
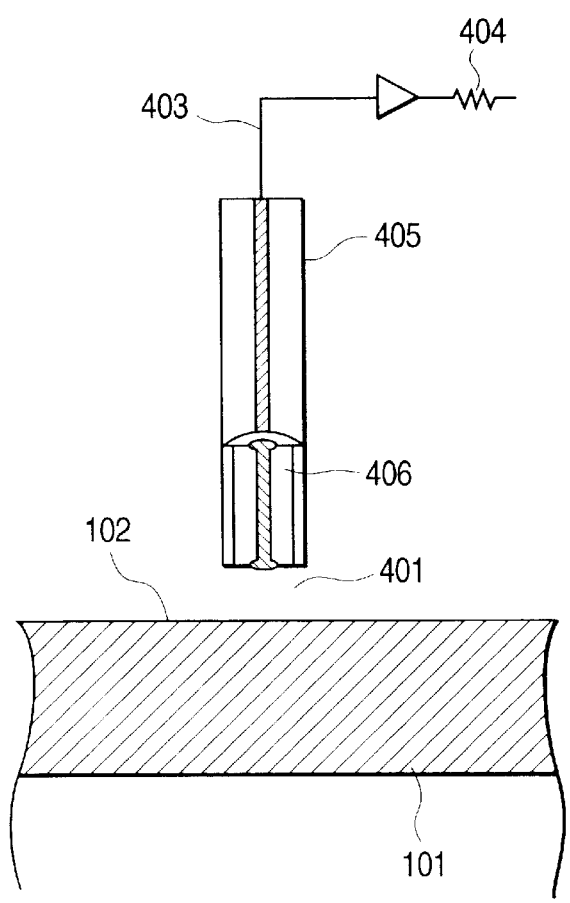
FIGS. 37A and 37B are schematic views showing an example of a structure of a potential sensor according to the first embodiment.
Figure 37B:
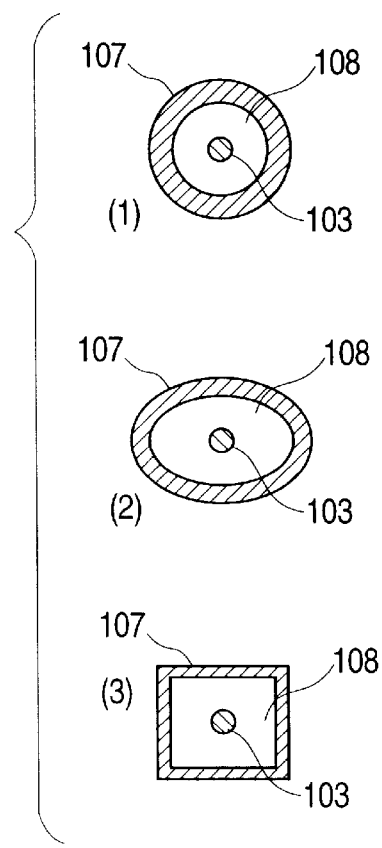

Next, a case where the potential configuration measuring apparatus shown in FIG. 30 is manufactured and potential sensors including shields having different shapes as shown in FIGS. 37A and 37B are manufactured and the potential configurations of the surface are measured by using these apparatus and sensors will be explained. The following Table 22 shows measured results:

TABLE 22

| Shield shape | a [μm] | b [μm] | c [mm/sec] | d [μm] | e [dpi] |
|---|---|---|---|---|---|
| (1) | 53 | 30 | 300 | 10 | 600 |
| (2) | 57 | 30 | 300 | 10 | 600 |
| (3) | 56 | 30 | 300 | 10 | 600 | a: detecting resolving power
b: width of detecting portion
c: relative movement speed
d: measurement interval
e: scan line density
(1): round shape
(2): elliptic shape
(3): rectangular shape As shown in the Table 22, in the shapes of the shields shown in FIGS. 37A and 37B, in all cases, the resolving power sufficient to measure the digital latent image can be obtained. As a result, it can be seen that the detecting resolving power does not depend upon the shape of the shield.

To the contrary, in case of the measurement effected without any shield, an S/N ratio or a resolving power sufficient to measure the digital latent image cannot be obtained.

[Embodiment 10]

Figure 38:
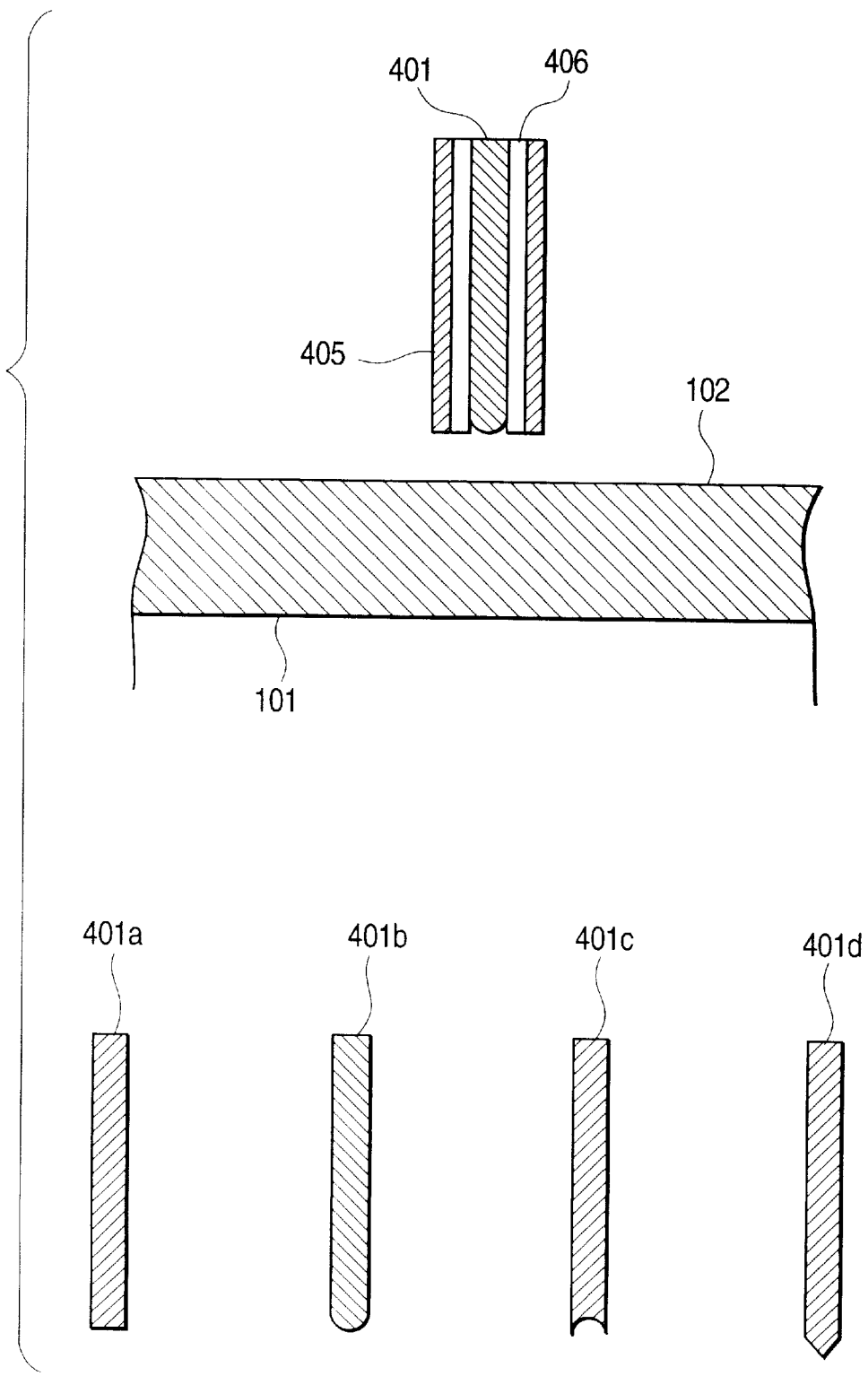
FIG. 38 is a schematic sectional view of the potential sensor according to the third embodiment, looked at from the same direction as FIG. 30.

Next a case where the potential configuration measuring apparatus shown in FIG. 30 is manufactured and potential sensors having detecting portions having shapes (looked at from the relative movement direction) shown by 401a l to 401d in FIG. 38 are manufactured and the potential configuration of the surface is measured by using these apparatus and sensors will be explained. The following Table 23 shows measured results:

TABLE 23

| Sensor shape | a [μm] | b [μm] | c [mm/sec] | d [μm] | e [dpi] |
|---|---|---|---|---|---|
| 401a I | 49 | 10 | 300 | 10 | 600 |
| 401b II | 58 | 10 | 300 | 10 | 600 |
| 401c III | 50 | 10 | 300 | 10 | 600 |
| 401d IV | 62 | 10 | 300 | 10 | 600 | a: detecting resolving power
b: width of detecting portion
c: relative movement speed
d: measurement interval
e: scan line density
I: rectangular shape
II: round shape
III: concave shape
IV: sharp point shape As shown in the Table 23, in four shapes shown by 401a to 401d in FIG. 38, there are no great differences in the detecting resolving power, and, the resolving power sufficient to measure the digital latent image can be obtained by any of these shapes.

[Embodiment 11]

Next, a case where potential configurations of surfaces of a flat board-shaped photosensitive body and a belt-shaped photosensitive body were measured by using the potential sensor of the potential configuration measuring apparatus shown in FIG. 30 will be explained. The following Table 24 shows measured results:

TABLE 24

| Photo-sensitive body shape | a [μm] | b [μm] | c [mm/sec] | d [μm] | e [dpi] |
|---|---|---|---|---|---|
| drum shape | 49 | 10 | 300 | 10 | 600 |
| flat board shape | 53 | 10 | 300 | 10 | 600 |
| belt shape | 56 | 10 | 300 | 10 | 600 | a: detecting resolving power
b: width of detecting portion
c: relative movement speed
d: measurement interval
e: scan line density As shown in the Table 24, the surface potential measuring apparatus can have a resulting power sufficient to measure the digital latent image in the flat board-shaped photosensitive body and the belt-shaped photosensitive body, as well as the drum-shaped photosensitive body.

[Embodiment 12]

In the potential configuration measuring apparatus shown in FIG. 30, the relative movement is generated between the potential sensor and the drum surface by rotation of the photosensitive drum. Now, by improving such an apparatus, a case where potential configuration along the axial direction of the photosensitive drum was measured by shifting the potential sensor along the axial direction of the photosensitive drum will be explained. The following Table 25 shows a measured result:

TABLE 25

| Relative movement direction | relative movement means | a [μm] | b [μm] | c [mm/sec] | d [μm] | e [dpi] |
|---|---|---|---|---|---|---|
| circumference of drum | rotation of drum | 50 | 10 | 300 | 10 | 600 |
| axis of drum | shift of sensor | 61 | 10 | 300 | 10 | 600 | a: detecting resolving power
b: width of detecting portion
c: relative movement speed
d: measurement interval
e: scan line density As shown in the Table 25, by shifting the potential sensor, also in an arrangement in which the relative movement is generated, a resolving power and intensity sufficient to measure the digital latent image can be obtained. From the result, it can be seen that the surface potential measuring method according to the illustrated embodiment can be applied to the arrangement in which the potential sensor is movable with respect to the drum surface, as well as the arrangement in which the relative movement between the potential sensor and the drum surface is achieved by the rotation of the photosensitive drum, i.e., the drum surface is movable with respect to the potential sensor.

In this way, according to the third embodiment, in the surface potential measurement wherein the dielectric current generated by the relative movement between the potential sensor and the surface to be measured is detected and analyzed, by using the potential sensor having the characteristic that the sectional shape of the detecting portion of the potential sensor is constituted by the rod-shaped conductive body extending in perpendicular to the surface to be measured and the conductive portion other than the surface opposed to the surface to be measured is covered by the shield so that the dielectric current is not received from the portion other than the surface opposed to the surface to be measured, there can be provided the more efficient resolving power by about two or three times in comparison with the conventional potential sensor using the flat conductive board as the detecting electrode. Further, even when the width of the detecting electrode, the potential sensor can maintain the signal intensity, thereby providing a signal having excellent S/N ratio. Thus, the digital latent image which was conventionally considered to be hard to measure can be measured and the surface potential configuration thereof can be evaluated.

[[FOURTH EMBODIMENT]]

Next, a fourth embodiment of the present invention will be fully explained with reference to the accompanying drawings.

Figure 39:
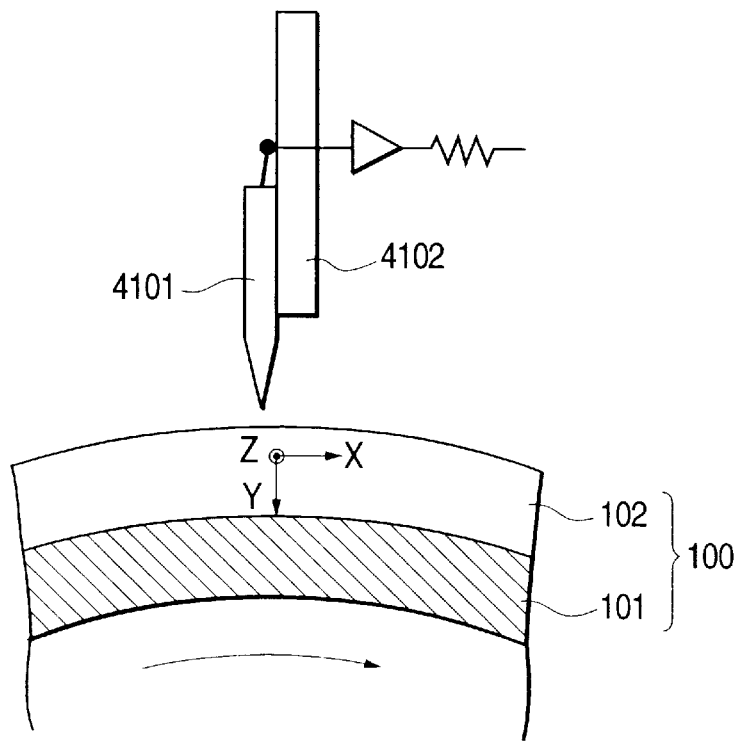
FIG. 39 is a front view of a potential sensor according to a fourth embodiment of the present invention.

FIG. 39 is an enlarged view of a potential sensor 4101 used in a first method of a fourth embodiment of the present invention. As shown in FIG. 39, the potential sensor 4101 is characterized in that a detecting portion of the potential sensor 4101 perpendicular to the surface 102 of the photosensitive body 100 and parallel to the relative movement direction between the potential sensor 4101 and the surface 102 is constituted by a rod-shaped conductive body.

Figure 40:
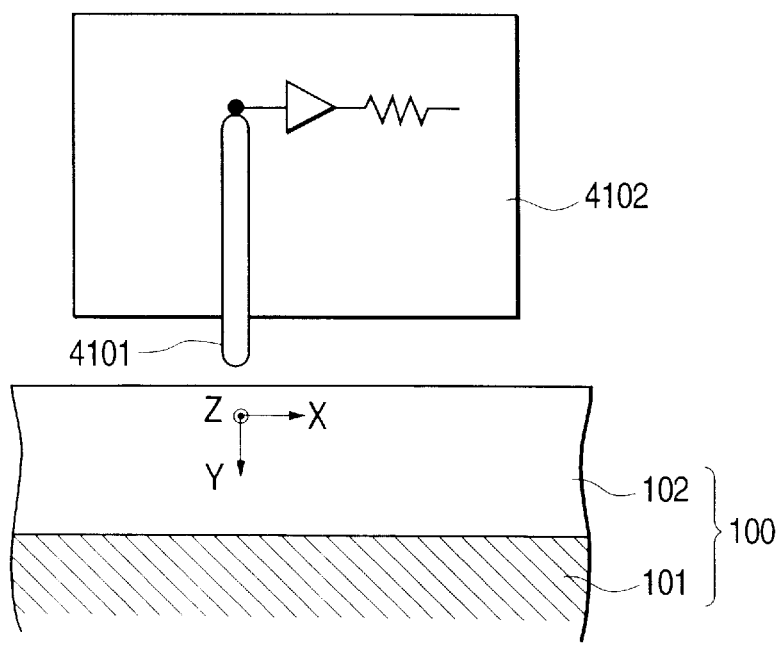
FIG. 40 is a side view of the potential sensor according to the fourth embodiment.

FIG. 40 schematically shows the sensor looked at from the left or right of FIG. 39. In a case where a relative movement is generated between the potential sensor 4101 and the surface 102, when it is assumed that a change amount of potential is dV and a relative movement speed is dx/dt, dielectric current proportional to dV/dt=(dV/dx)·(dx/dt) is generated in the potential sensor 4101. When the potential sensor 4101 is fixed, the relative movement speed can be a surface speed of the photosensitive body 100 (referred to as "process speed" hereinafter).

The dielectric current detected in this method includes information relating to gradient of surface potential. By integrating and analyzing this data, the surface potential distribution can be measured. Integration constant used in analysis is determined to reproduce the potential distribution when the surface of a photosensitive body having known potential distribution is measured. However, in the analyzing method according to the illustrated embodiment, a width of the detecting portion of the potential sensor 4101 must be smaller than a width of change in potential to be measured.

As measured above, the potential sensor 4101 can be constituted by the rod-shaped conductive body. The potential sensor 4101 may be formed from conductive material such as gold, copper, iron, aluminium or the like, but, tungsten is best from the view point of easy-workability and cheapness.

By using the rod shape, a signal having an S/N ratio more excellent than a flat board shape can be obtained. In this case, a maximum diameter of the conductive body used (referred to as "conductor diameter" hereinafter) greatly affects an influence upon the detecting resolving power. Fundamentally, it is desirable that the conductor diameter is as small as possible. However, if too small, since manufacture of the rod becomes difficult or the signal intensity is reduced, the conductor diameter has low limitation. It is desirable that the conductor diameter is within a range of 1 $\mu$m to 100 $\mu$m.

Since the potential sensor has the simple structure such as the rod shape, the position of the sensor can mechanically be adjusted relatively easily. That is to say, the maintenance can be facilitated. Within the above range, by making a portion of the conductive rod near the photosensitive body thinner, the measurement is hard to be subjected to the influence of arrange distribution along an Z-axis (longitudinal direction) of the photosensitive body, thereby permitting the detection of potential distribution within finer range. Further, this is effective when a latent image forming pattern is formed in the longitudinal direction.

A length of the signal detecting portion of the potential sensor 4101 in a direction perpendicular to the relative movement direction (i.e., in the longitudinal direction of the photosensitive body 100) affects an influence upon the signal intensity to be detected. If too long, the detecting ability is worsened or manufacture of the detecting portion becomes difficult. To the contrary, if too short, linearity of the rod-shaped conductor (detecting portion) and parallelism with respect to a Y-axis are worsened to result in reduction of the resolving power. Thus, the length of the rod-shaped conductor is preferably within a range of 0.5 mm to 10 mm.

In this case, as shown in FIGS. 39 and 40, the detecting portion is arranged in parallel to the surface to be measured and in perpendicular to the relative movement direction. The detecting resolving power greatly depends upon the linearity and parallelism of the detecting portion of the potential sensor 4101, and thus, it is preferable that the linearity and parallelism (with respect to the surface to be measured) of the detecting electrode and distortion along the relative movement direction are within a range of 300% or less of the conductor diameter.

Further, in order to obtain a high S/N ratio, portions of the detecting portion other than a portion adjacent to the photosensitive body 100 may be partially shielded by a shield.

Figure 41:
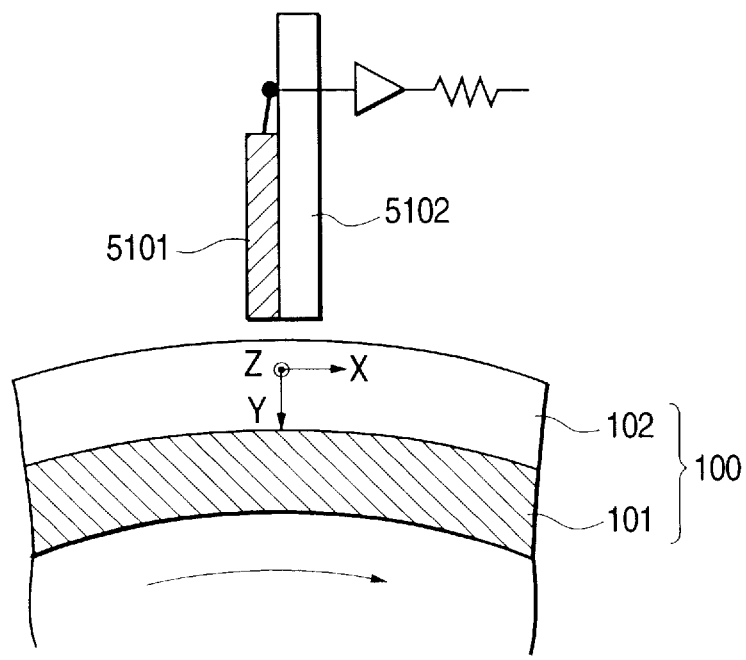
FIG. 41 is a front view of the potential sensor according to the fourth embodiment of the present invention.

FIG. 41 is an enlarged view of a potential sensor 5101 used in a second method. As shown in FIG. 41, in the potential sensor 5101 used in the second method is characterized in that a detecting portion of the potential sensor 5101 perpendicular to the surface 102 and parallel to the relative movement direction between the potential sensor 5101 and the surface 102 is constituted by a board-shaped conductive body.

Figure 42:
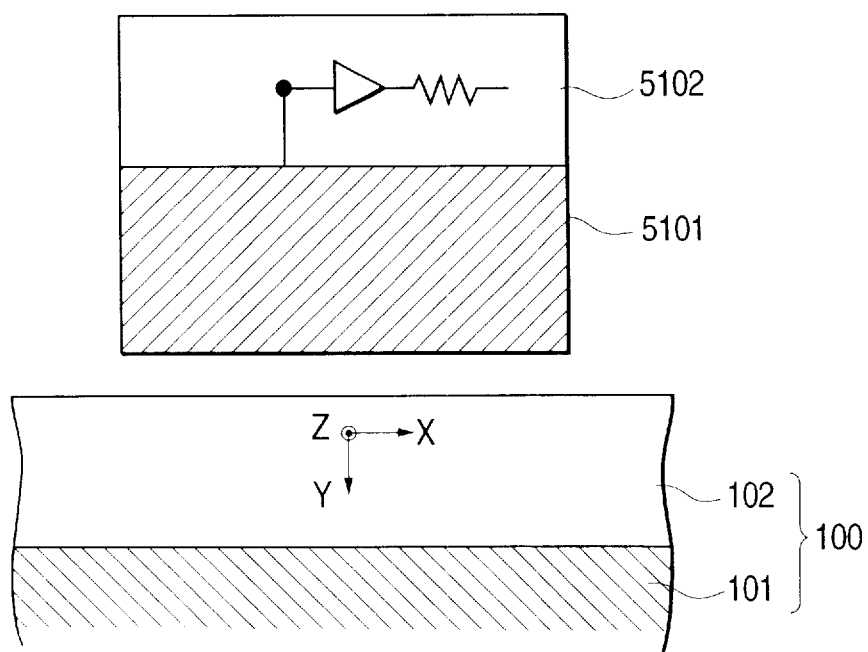
FIG. 42 is a side view of the potential sensor according to the fourth embodiment.

FIG. 42 schematically shows the apparatus looked at from the left or right of FIG. 41. In a case where a relative movement is generated between the potential sensor 5101 and the surface 102, when it is assumed that a change amount of potential is dV and a relative movement speed is dx/dt, dielectric current proportional to dV/dt=(dV/dx)•(dx/dt) is generated in the potential sensor 5101.

As is in the first method, also in this second method, by integrating and analyzing dielectric current at the detecting portion of the potential sensor 5101, the surface potential distribution can be measured. In the analyzing method according to the illustrated embodiment, a width of the detecting portion of the potential sensor 5101 must be smaller than a width of change in potential to be measured. In this way, the potential sensor 5101 can be formed from the board-shaped conductor.

The potential sensor 5101 may be formed from conductive material such as gold, copper, iron, aluminium or the like, but, tungsten is best from the view point of easy-workability and cheapness.

By using the board-shaped sensor and by arranging the sensor in a direction normal to the surface 102 of the photosensitive body 100, measurement is hard to be subjected to influence of potential distribution around a measured point in comparison with the conventional flat-board-shaped sensor arranged in parallel to the surface 102 of the photosensitive body 100, and, thus, a signal having an S/N ratio more excellent that the flat board shape can be obtained.

Further, a signal transmitting path from the detecting portion to the analyzing portion provided by other members can be simplified. Thus, the resistance of such members and joining areas thereof can be reduced, thereby obtaining the signal having excellent S/N ratio. In this case, a thickness of the conductive body used greatly affects an influence upon the detecting resolving power. Fundamentally, it is desirable that the thickness of the conductive body is as small as possible. However, if too small, since the signal intensity is reduced, the thickness of the conductive body has lower limitation. It is desirable that the thickness of the conductive body is within a range of 1 $\mu$m to 100 $\mu$m.

As shown in FIGS. 41 and 42, the detecting portion of the potential sensor 5101 is arranged in parallel to the surface to be measured and in perpendicular to the relative movement direction. The detecting resolving power greatly depends upon the linearity and parallelism of the detecting portion of the potential sensor 5101, and, thus, it is preferable that the linearity and parallelism (with respect to the surface to be measured and to the direction (perpendicular to the plane of FIG. 42) perpendicular to the relative movement direction) of the detecting electrode are within a range of 300% or less of the thickness of the conductive body.

The potential sensor 5101 having such a detecting portion has the small number of parts and can easily maintain the parallelism and is cheap.

By forming the board-shaped detecting portion by deposition, the thickness and length of the conductive body can be uniformed, thereby obtaining a high accurate detecting portion stably. Further, in the manufacture, the setting of the Z-axis direction can be facilitated, and, thus, a longer sensor or a plurality of sensors can be manufactured. Furthermore, in order to obtain a high S/N ratio, portions of the detecting portion other than a portion adjacent to the surface 102 of the photosensitive body 100 may be electrically shielded by a shield.

Incidentally, as is in the first method, the potential sensor may be movable with respect to the surface of the photosensitive body.

Test Examples and Embodiments

Now, the present invention will be concretely explained with reference to test examples and embodiments.

Incidentally, the present invention is not limited to such embodiments. Further, the detecting resolving power in the tests is evaluated as a half value width of a signal obtained when a digital latent image formed by one-line laster exposure is measured by using a laser having a spot diameter of 42 $\mu$m.

Test Example 4-1

Figure 43:
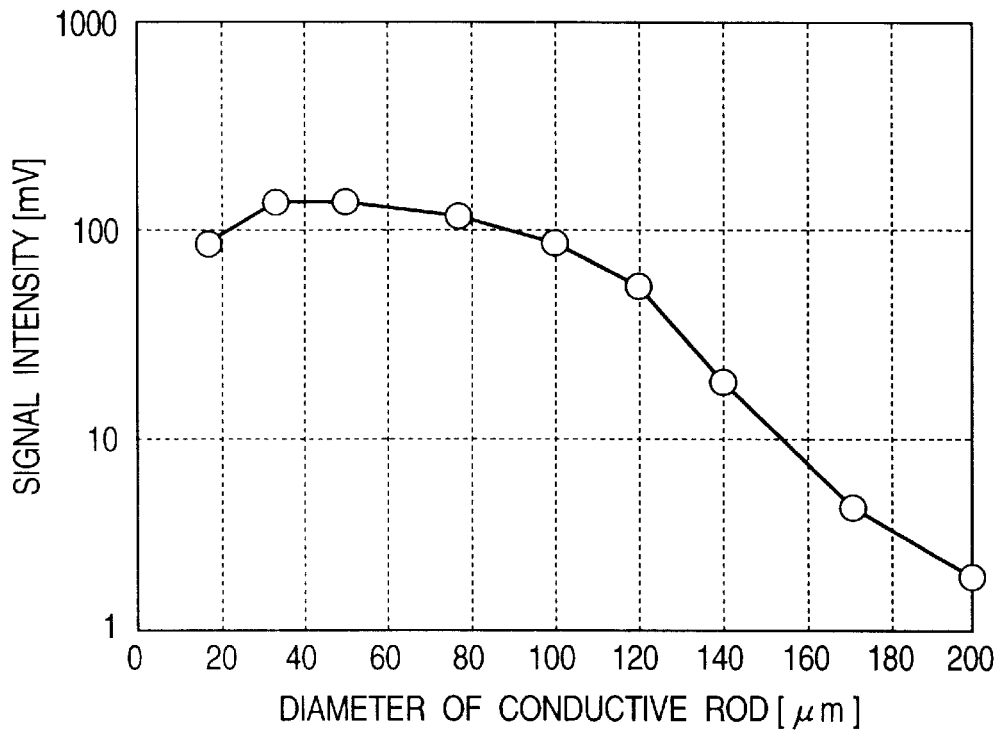
FIG. 43 is a graph showing a relation between a diameter and signal intensity of a conductive rod used in a potential sensor of a potential configuration measuring apparatus according to the fourth embodiment.

FIG. 43 shows a test result providing a relation between the diameter of the conductive rod used in the potential sensor 4101 and the detecting resolving power in the test effected by the potential distribution measuring apparatus shown in FIG. 39. The measuring conditions are shown in the following Table 26.

TABLE 26

| diameter of conductive rod | 1 to 200 [$\mu$m] |
| length of conductive rod | 5 [mm] |
| measurement interval | 10 [$\mu$m] |
| relative movement speed | 300 [mm/sec] |

\* tip end of sensor is not worked (cylindrical)

As apparent from FIG. 43, the detecting resolving power (signal intensity) strongly depends upon the diameter of the conductive rod. Particularly when the conductive rod having a diameter greater than 50 $\mu$m is used, it was difficult to measure the digital latent image separately. Further, when the rod has a diameter up to 1 $\mu$m, a signal having a sufficiently good S/N ratio could be obtained. More preferably, the diameter ($\Phi$) was 50 $\mu$m.

Figure 45:
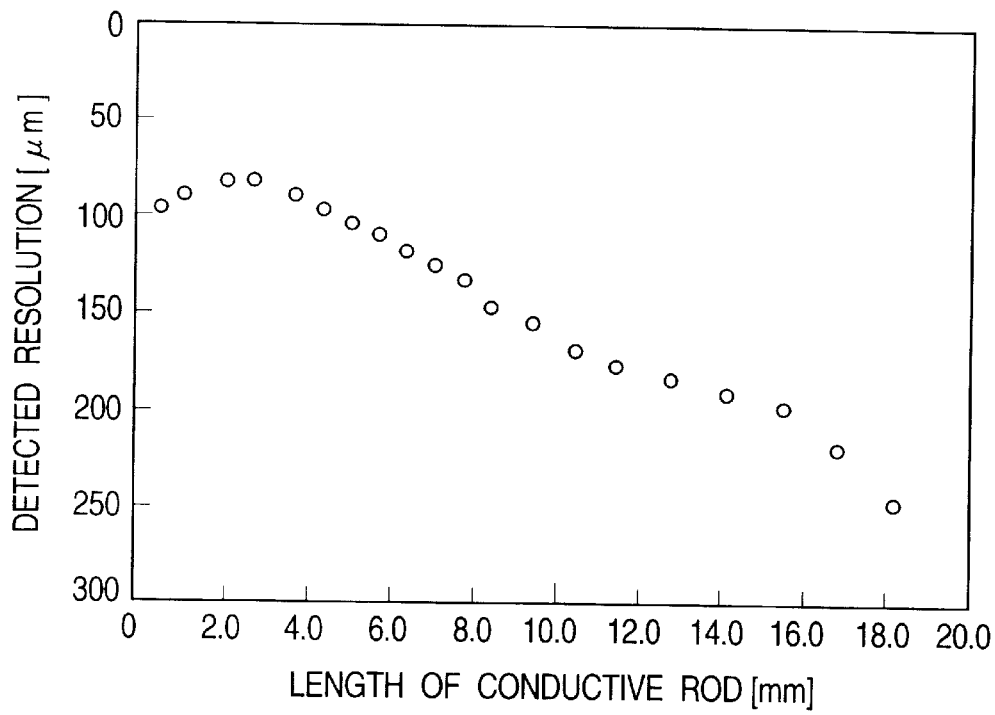
FIG. 45 is a graph showing a relation between a thickness and a detecting resolving power of the conductive board used in a potential sensor of the potential configuration measuring apparatus according to the fourth embodiment.

FIG. 45 shows a test result providing a relation between the thickness of the conductive board used in the potential sensor 5101 and the detecting resolving power in the test effected by the potential distribution measuring apparatus shown in FIG. 41. Measuring conditions are as shown in the following Table 27:

TABLE 27

| Test conditions | |
| --- | --- |
| thickness of conductive board | 1 to 200 [$\mu$m] |
| length of conductive board | 1 [mm] |
| measurement interval | 10 [$\mu$m] |
| relative movement speed | 300 [mm/sec] |

Figure 44:
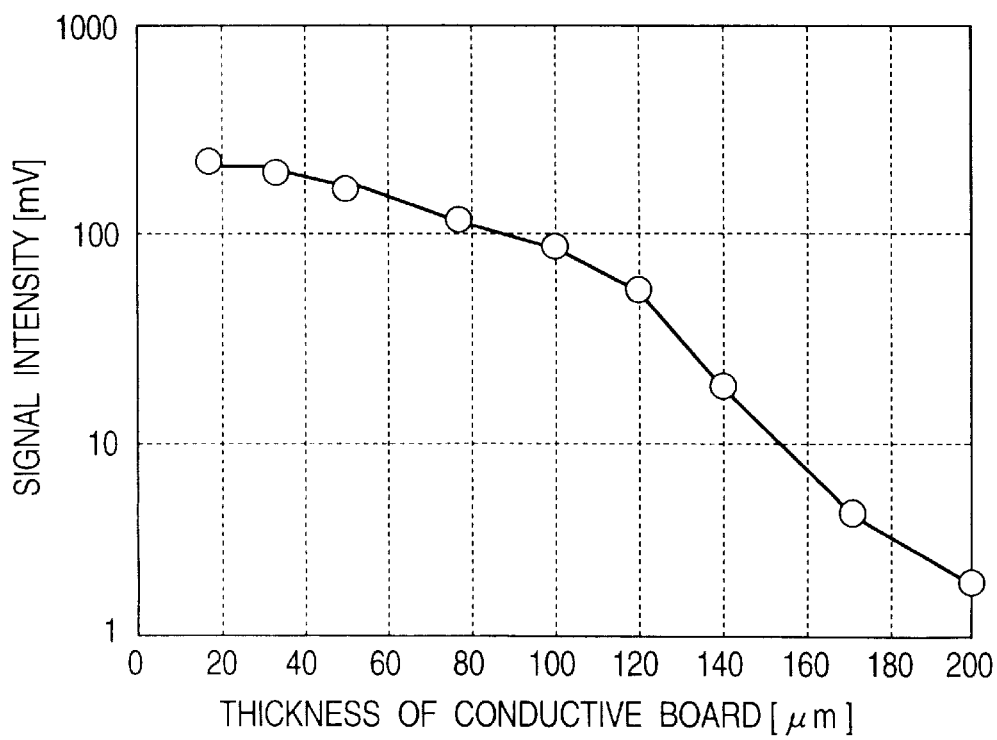
FIG. 44 is a graph showing a relation between a thickness and signal intensity of a conductive board used in a potential sensor of the potential configuration measuring apparatus according to the fourth embodiment.

\* the length of the conductive board is a length of a portion bent at a right angle with respect to a moving direction of an object to be measured As apparent from FIG. 44, the detecting resolving power (signal intensity) strongly depends upon the thickness of the conductive board. Particularly when the conductive rod having a thickness greater than 50 $\mu$m is used, it was difficult to measure the digital latent image separately. Further, when the rod has a thickness up to 1 $\mu$m, a signal having a sufficiently good S/N ratio could be obtained.

Test Example 4-2

Figure 46:
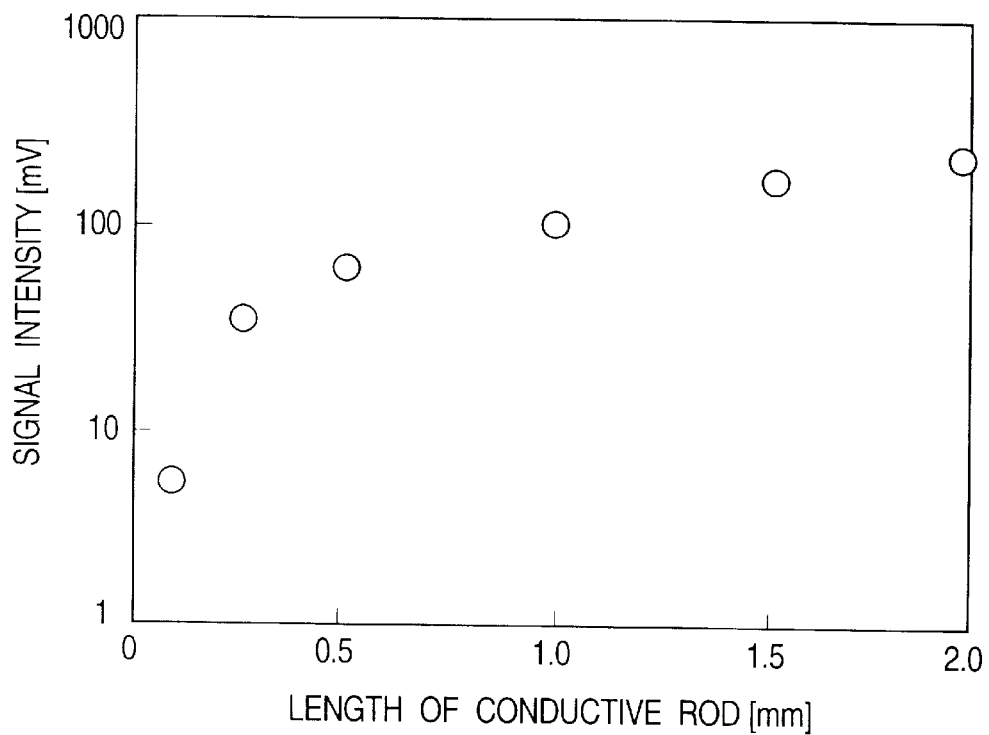
FIG. 46 is a graph showing a relation between a length and signal intensity of a conductive rod used in a potential sensor of the potential configuration measuring apparatus according to the fourth embodiment.

FIGS. 45 and 46 show test results providing a relation between a length of the conductive rod used in the potential sensor 4101 and the detecting resolving power and a relation between the length and the signal intensity in tests effected by using the potential distribution measuring apparatus shown in FIG. 39. Measuring conditions are as shown in the following Table 28:

TABLE 28

| Test conditions | |
| --- | --- |
| diameter of conductive rod | 1 [$\mu$m] |
| length of conductive rod | 0.1 to 15 [mm] |
| measurement undervalued | 10 [$\mu$m] |
| relative movement speed | 300 [mm/sec] |
| scan line density | 600 [dpi] |

As apparent from FIGS. 45 and 46, the length of the conductive rod is associated with the signal intensity and the detecting resolving power. As the length of the conductive rod is increased, the detecting resolving power is worsened. However, an absolute value of the detecting resolving power strongly depends upon the diameter of the conductive rod more than the length of the conductive rod. Thus, it is considered that, when the length of the conductive rod is increased, the resolving power inherently included in the wire cannot be reached. In FIG. 45, when the length of the conductive rod is 10 mm, the detecting resolving power is worsened about twice in comparison with the case where the length of the conductive rod is 1 mm. Thus, it is not so preferable to select a conductive rod having a length greater than 10 mm. Further, as the length is decreased, the signal intensity is reduced, and, particularly when the length is smaller than 0.5 mm, the detection became difficult.

Figure 47:
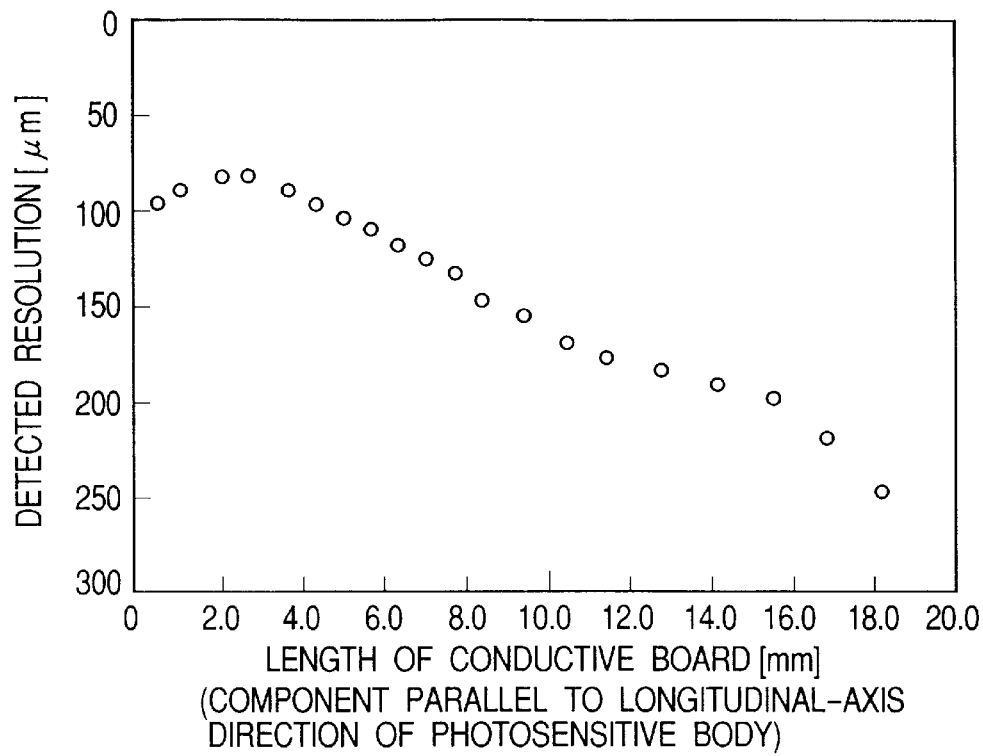
FIG. 47 is a graph showing a relation between a length and a detecting resolving power of the conductive board used in a potential sensor of the potential configuration measuring apparatus according to the fourth embodiment.
Figure 48:
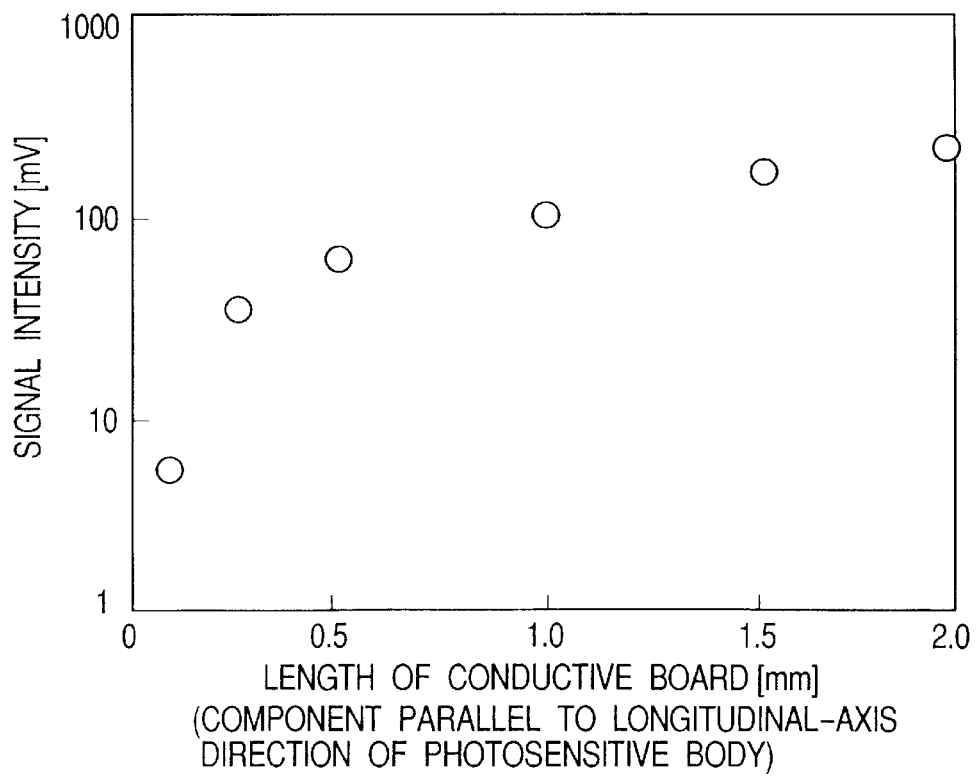
FIG. 48 is a graph showing a relation between a length and signal intensity of the conductive board used in a potential sensor of the potential configuration measuring apparatus according to the fourth embodiment.

FIGS. 47 and 48 show test results providing a relation between a length of the conductive board used in the potential sensor 5101 and the detecting resolving power and a relation between the length and the signal intensity in tests effected by using the potential distribution measuring apparatus shown in FIG. 41. Measuring conditions are as shown in the following Table 29:

TABLE 29

| Test conditions | |
| --- | --- |
| thickness of conductive board | 10 [$\mu$m] |
| length of conductive board | 0.1 to 15 [mm] |
| measurement interval | 10 [$\mu$m] |
| relative movement speed | 300 [mm/sec] |
| scan line density | 600 [dpi] |

\* the length of the conductive board is a length of a portion bent at a right angle with respect to a moving direction of an object to be measured As apparent from FIGS. 47 and 48, the length of the conductive board is associated with the signal intensity and the detecting resolving power. As the length of the conductive board is increased, the detecting resolving power is worsened. However, an absolute value of the detecting resolving power strongly depends upon the diameter of the conductive board more than the length of the conductive board. Thus, it is considered that, when the length of the conductive board is increased, the resolving power inherently included in the wire cannot be reached. In FIG. 47, when the length of the conductive board is 10 mm, the detecting resolving power is worsened about twice in comparison with the case where the length of the conductive board is 1 mm. Thus, it is not so preferable to select a conductive board having a length greater than 10 mm. Further, as the length is decreased, the signal intensity is reduced, and, particularly when the length is smaller than 0.5 mm, the detection became difficult.

Test Example 4-3

Figure 49:
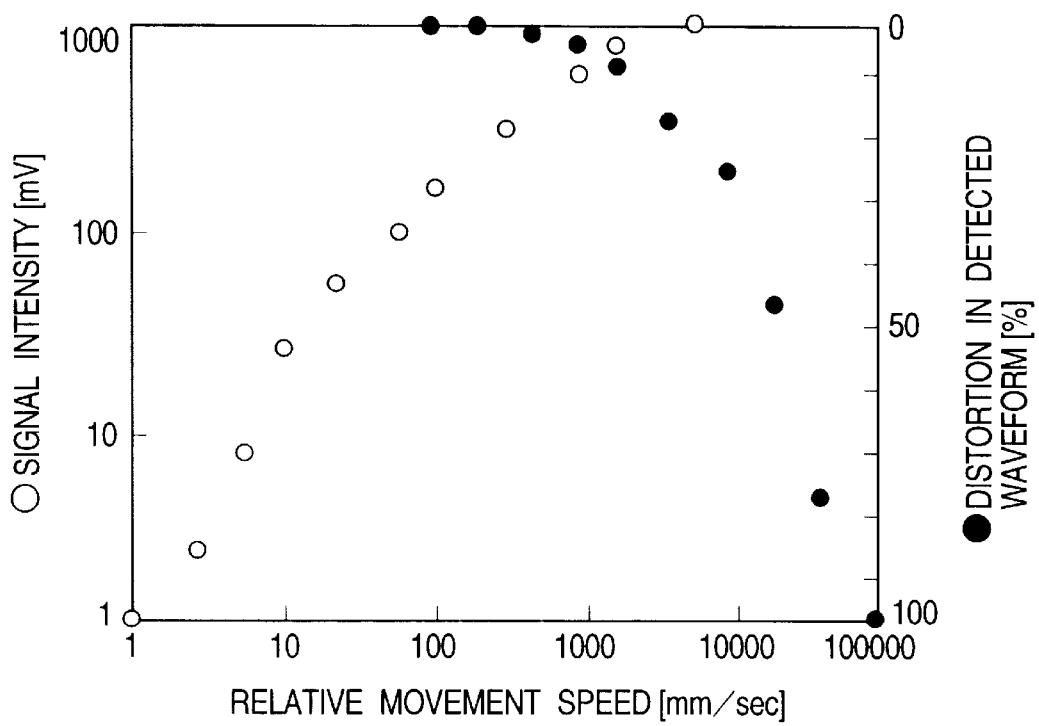
FIG. 49 is a graph showing a relation between a relative movement speed between a surface to be measured and a potential sensor and a signal intensity and distortion of a detected waveform of the potential sensor, in a potential configuration measurement according to the fourth embodiment.

FIG. 49 shows a test result providing a relation between the relative movement speed and the signal intensity and distortion of a measured waveform in the test effected by using the potential distribution measuring apparatus shown in FIG. 39. Measuring conditions are as shown in the following Table 30:

TABLE 30

| Test conditions | |
| --- | --- |
| diameter of conductive rod | 50 [μm] |
| length of conductive rod | 5 [mm] |
| measurement interval | 10 [μm] |
| relative movement speed | 1 to 100000 [mm/sec] |

As apparent from FIG. 49, if the relative movement speed becomes smaller than 10 mm/sec, the signal intensity becomes weak, with the result that a waveform having excellent S/N ratio cannot be obtained. Further, if the relative movement speed becomes greater than 100000 mm/sec, distortion is generated in the detected waveform by the influence of time constant based on the measuring system, with the result that the potential distribution on the surface cannot be measured correctly.

Figure 50:
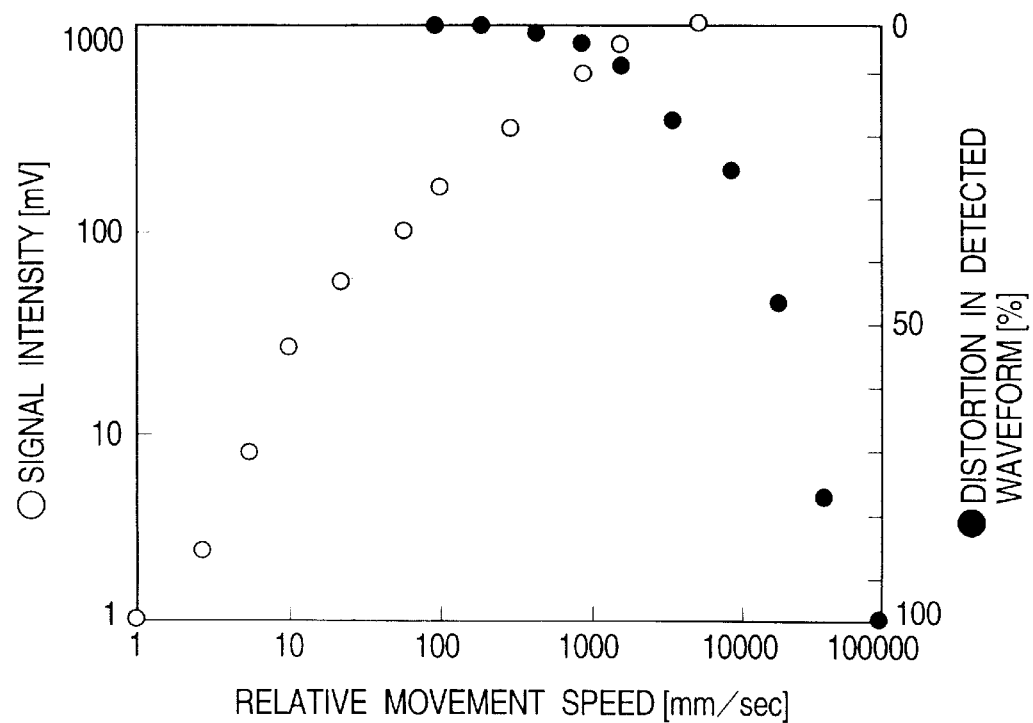
FIG. 50 is a graph showing a relation between a relative movement speed between a surface to be measured and a potential sensor and signal intensity and distortion of a detected waveform of the potential sensor, in a potential configuration measurement according to the fourth embodiment.

FIG. 50 shows a test result providing a relation between the relative movement speed and the signal intensity and distortion of a measured waveform in the test effected by using the potential distribution measuring apparatus shown in FIG. 41. Measuring conditions are as shown in the following Table 31:

TABLE 31

| Test conditions | |
| --- | --- |
| thickness of conductive board | 10 [μm] |
| length of conductive board | 1 [mm] |
| measurement interval | 10 [μm] |
| relative movement speed | 1 to 100000 [mm/sec] |

As apparent from FIG. 50, if the relative movement speed becomes smaller than 10 mm/sec, the signal intensity becomes weak, with the result that a waveform having excellent S/N ratio cannot be obtained. Further, if the relative movement speed becomes greater than 100000 mm/sec, distortion is generated in the detected waveform by the influence of time constant based on the measuring system, with the result that the potential distribution on the surface cannot be measured correctly.

Test Example 4-4

Figure 51:
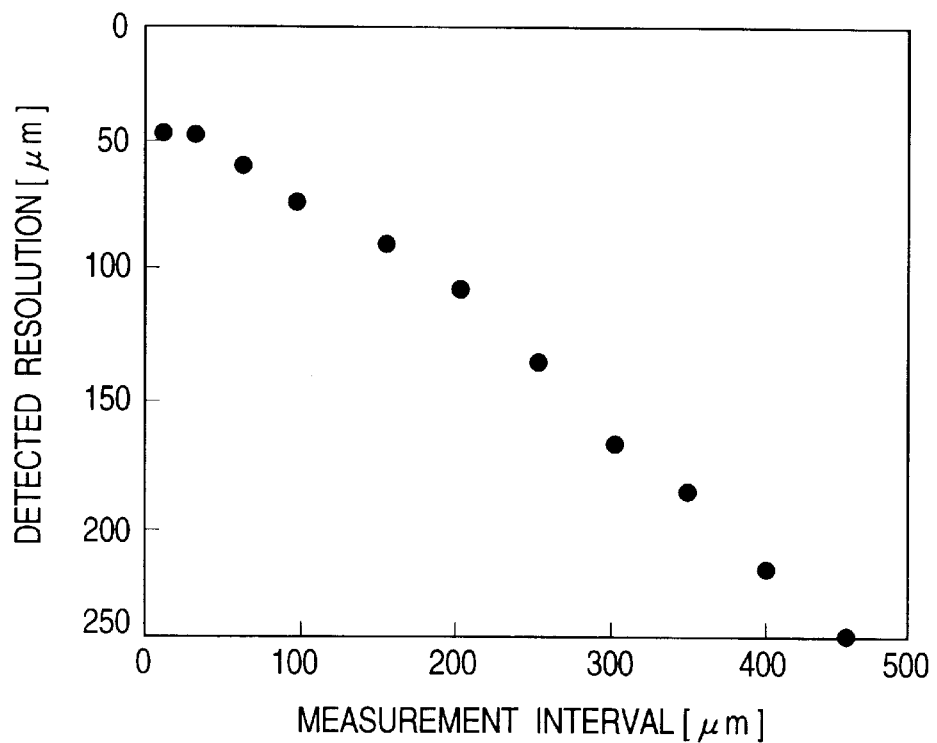
FIG. 51 is a graph showing a relation between a measurement interval and a detecting resolving power, in the potential configuration measurement according to the fourth embodiment.

FIG. 51 shows a test result providing a relation between the measurement interval and the detecting resolving power in the test effected by using the potential distribution measuring apparatus shown in FIG. 39. Measuring conditions are as shown in the following Table 32:

TABLE 32

| Test conditions | |
| --- | --- |
| diameter of conductive rod | 50 [μm] |
| length of conductive rod | 5 [mm] |
| measurement interval | 5 to 500 [μm] |
| relative movement speed | 300 [mm/sec] |
| scan line density | 600 [dpi] |

Figure 52:
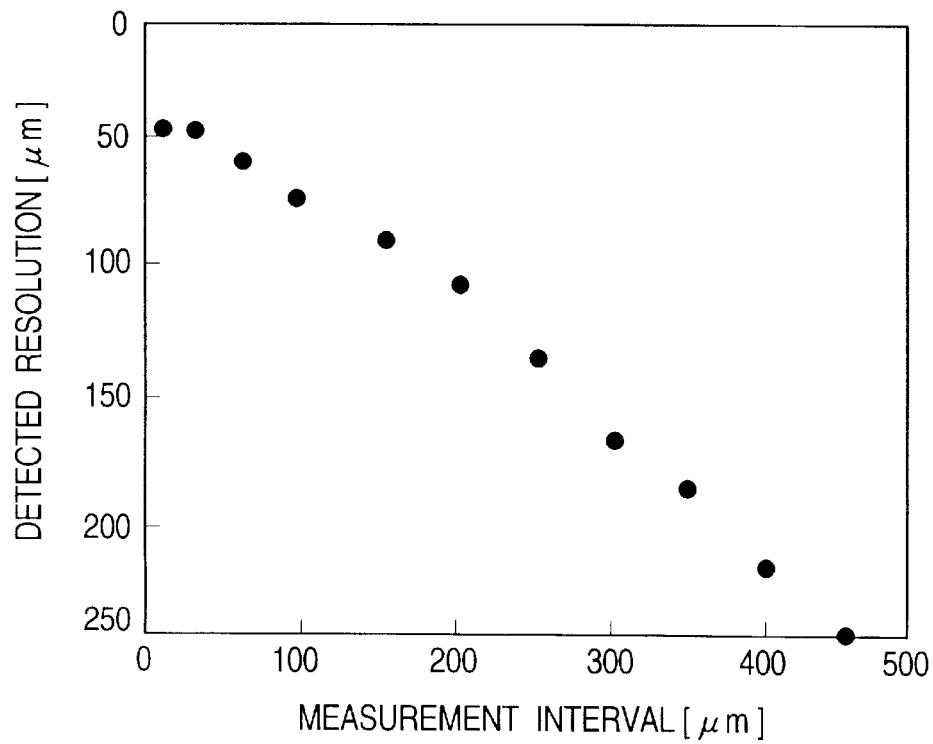
FIG. 52 is a graph showing a relation between a measurement interval and a detecting resolving power, in the potential configuration measurement according to the fourth embodiment.

FIG. 52 shows a test result providing a relation between the measurement interval and the detecting resolving power in the test effected by using the potential distribution measuring apparatus shown in FIG. 41. Measuring conditions are as shown in the following Table 33:

TABLE 33

| Test conditions | |
| --- | --- |
| thickness of conductive board | 10 [μm] |
| length of conductive board | 1 [mm] |
| measurement interval | 5 to 500 [μm] |
| relative movement speed | 300 [mm/sec] |
| scan line density | 600 [dpi] |

Judging from the results shown in FIGS. 51 and 52, it seems that, as the measurement interval is increased, the detecting resolving power is reduced. However, this is due to the fact that the actual potential has spatial extension but is not caused by the measuring system. In order to correctly evaluate the potential distribution near the surface, it is preferable that the measurement interval is 200 μm or less, and more preferably, 100 μm or less.

When the spatial extension of the potential distribution is evaluated, the measurement interval can be selected voluntarily. If the measurement interval is smaller than 10 μm, discharge is generate between the surface potential and the potential sensor to distort the detected waveform considerably, thereby making the measurement of the potential configuration of the surface impossible.

Embodiment 4-1

Figure 53:
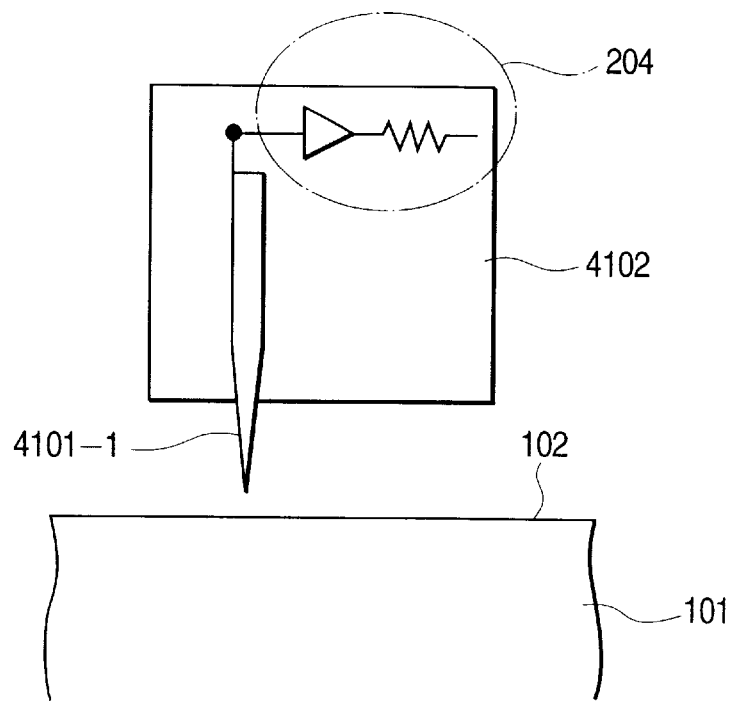
FIG. 53 is a schematic view showing an example of a structure of the potential sensor of the potential configuration measurement according to the fourth embodiment.
Figure 54:
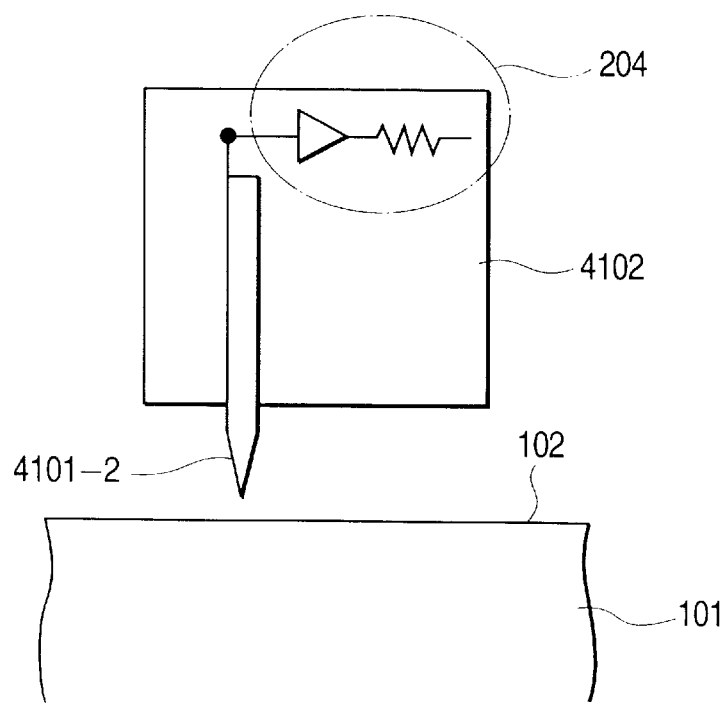
FIG. 54 is a schematic view showing an example of a structure of the potential sensor of the potential configuration measurement according to the fourth embodiment.
Figure 55:
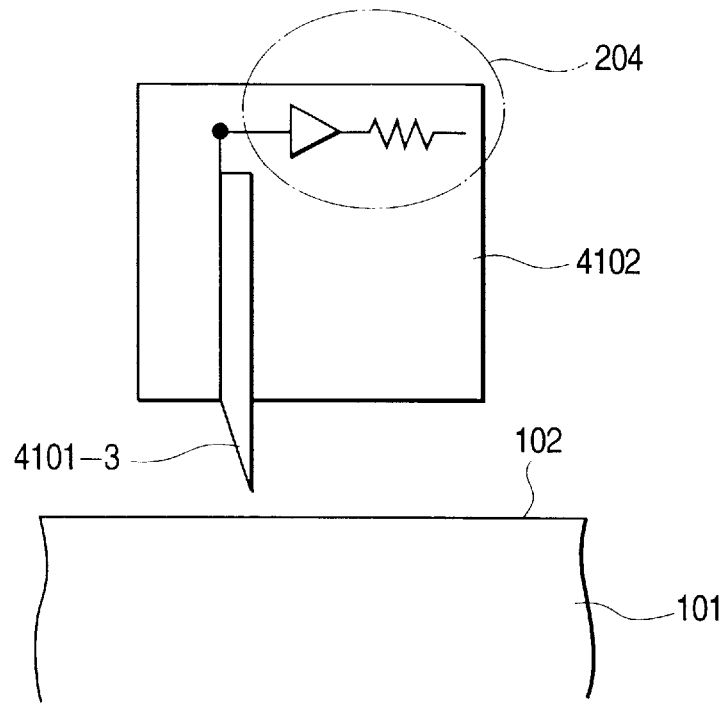
FIG. 55 is a schematic view showing an example of a structure of the potential sensor of the potential configuration measurement according to the fourth embodiment.

Next, a case where potential sensors 4101 to 1 to 4101 to 3 having detecting portions having shapes shown in FIGS. 53 to 55 are manufactured and the potential configuration of the surface is measured by using the potential configuration measuring apparatus shown in FIG. 39 and these and sensors will be explained. The following Table 34 shows a measured result:

TABLE 34

| Sensor shape | a [μm] | b [μm] | c [mm] | d [mm/sec] | e [μm] | f [dpi] |
| --- | --- | --- | --- | --- | --- | --- |
| FIG. 53 | 49 | 50 | 5.0 | 300 | 10 | 600 |
| FIG. 54 | 53 | 50 | 5.0 | 300 | 10 | 600 |
| FIG. 55 | 47 | 50 | 5.0 | 300 | 10 | 600 | a: detecting resolving power
b: diameter of conductive rod
c: length of conductive rod
d: relative movement speed
e: measurement interval
f: scan line density As shown in the Table 34, in three shapes shown in FIGS. 53 to 55, there are no great differences in the detecting resolving power, and, the resolving power sufficient to measure the digital latent image can be obtained by any one of these shapes.

Figure 56:
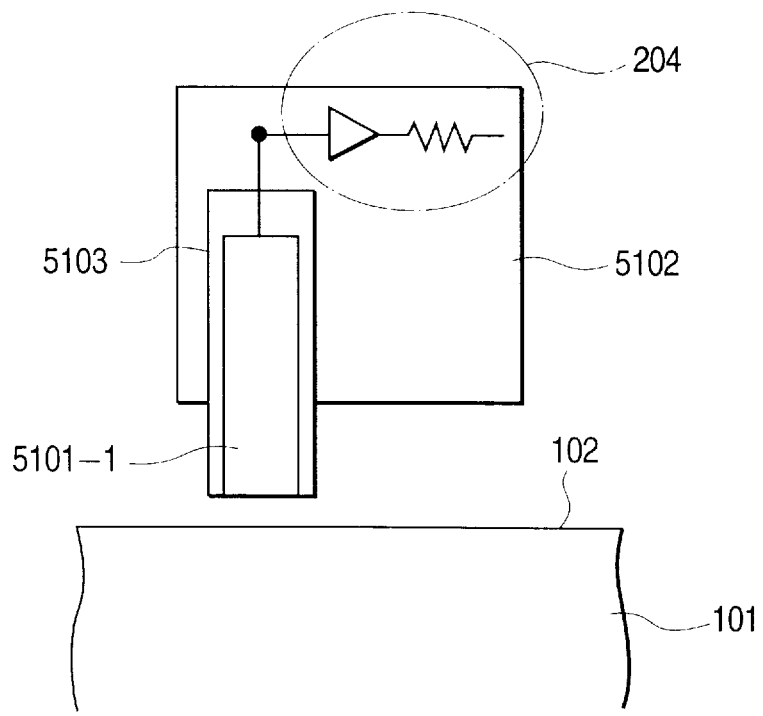
FIG. 56 is a schematic view showing an example of a structure of the potential sensor of the potential configuration measurement according to the fourth embodiment.
Figure 57:
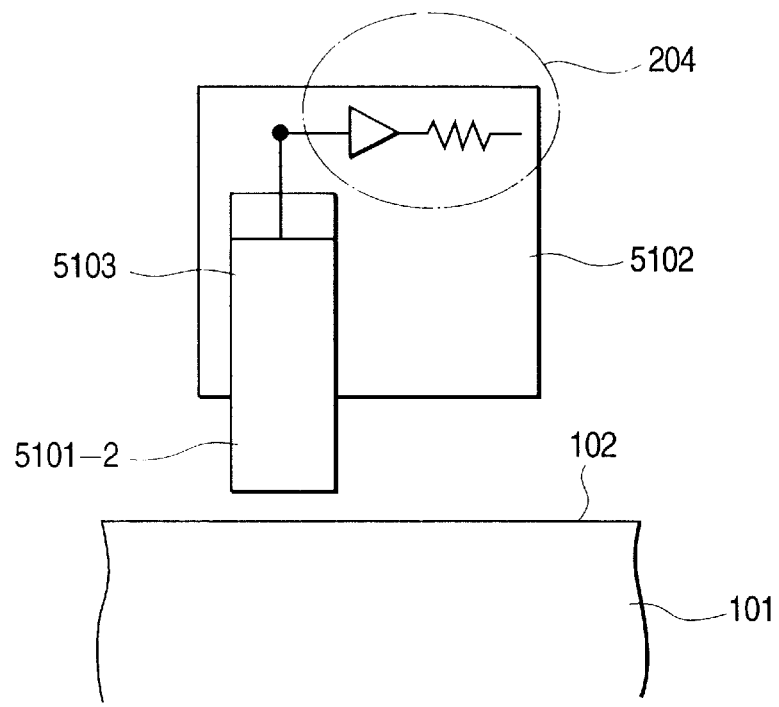
FIG. 57 is a schematic view showing an example of a structure of the potential sensor of the potential configuration measurement according to the fourth embodiment.
Figure 58:
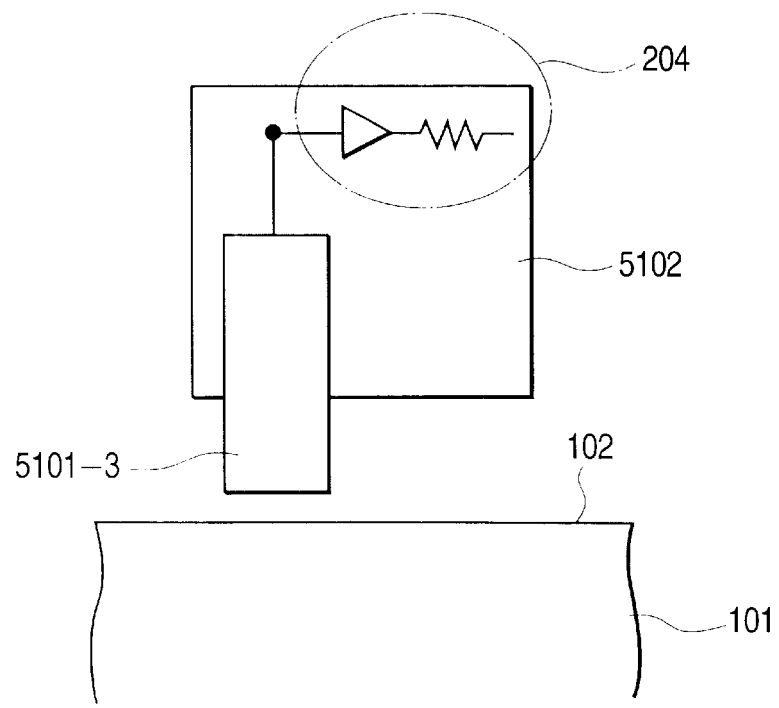
FIG. 58 is a schematic view showing an example of a structure of the potential sensor of the potential configuration measurement according to the fourth embodiment.

Further, case where potential sensors 5101 to 1 to 5101 to 3 having detecting portions having shapes shown in FIGS. 56 to 58 are manufactured and the potential configuration of the surface is measured by using the potential configuration measuring apparatus shown in FIG. 41 and these and sensors will be explained. The following Table 35 shows a measured result. Incidentally, the reference numeral 5103 denotes a conductor on which the sensor is deposited.

TABLE 35

| Sensor shape | a [μm] | b [μm] | c [mm] | d [mm/sec] | e [μm] | f [dpi] |
|---|---|---|---|---|---|---|
| FIG. 56 | 49 | 50 | 5.0 | 300 | 10 | 600 |
| FIG. 57 | 53 | 50 | 5.0 | 300 | 10 | 600 |
| FIG. 58 | 47 | 50 | 5.0 | 300 | 10 | 600 | a: detecting resolving power
b: thickness of conductive board
c: length of conductive board
d: relative movement speed
e: measurement interval
f: scan line density \* only the conductive board shown in FIG. 58 is formed without deposition As shown in the Table 35, in three shapes shown in FIGS. 56 to 58, there are no great differences in the detecting resolving power, and, the resolving power sufficient to measure the digital latent image can be obtained by any one of these shapes.

Embodiment 4-2

Next, the surface potential distributions of the drum-shaped photosensitive body, flat board-shaped photosensitive body and belt-shaped photosensitive body were measured by using the potential sensors 4101, 5101 of the potential distribution measuring apparatuses shown in FIGS. 39 and 41. The following Tables 36 and 37 show measured results.

TABLE 36

| Photo-sensitive body shape | a [μm] | b [μm] | c [mm] | d [mm/sec] | e [μm] | f [dpi] |
|---|---|---|---|---|---|---|
| drum shape | 49 | 50 | 5.0 | 300 | 10 | 600 |
| flat board shape | 54 | 50 | 5.0 | 300 | 10 | 600 |
| belt shape | 56 | 50 | 5.0 | 300 | 10 | 600 | a: detecting resolving power
b: diameter of conductive rod
c: length of conductive rod
d: relative movement speed
e: measurement interval
f: scan line density

TABLE 37

| Photo-sensitive body shape | a [μm] | b [μm] | c [mm] | d [mm/sec] | e [μm] | f [dpi] |
|---|---|---|---|---|---|---|
| drum shape | 49 | 50 | 5.0 | 300 | 10 | 600 |
| flat board shape | 54 | 50 | 5.0 | 300 | 10 | 600 |
| belt shape | 56 | 50 | 5.0 | 300 | 10 | 600 | a: detecting resolving power
b: thickness of conductive board
c: length of conductive board
d: relative movement speed
e: measurement interval
f: scan line density As shown in the Tables 36 and 37, the surface potential measuring apparatus according to the present invention can have a resolving power sufficient to measure the digital latent image in the flat board-shaped photosensitive body and the belt-shaped photosensitive body, as well as the drum-shaped photosensitive body.

Embodiment 4-3

In the potential distribution measuring apparatus shown in FIGS. 39 and 41, the relative movement is generated between the potential sensor 4101, 5101 and the surface by rotation of the photosensitive body 100. Now, by improving such apparatuses, a case where potential distributions along the axial direction of the photosensitive body 100 were measured by shifting the potential sensor along the axial direction of the photosensitive body 100 will be explained. The following Tables 38 and 39 show measured results:

TABLE 38

| Relative movement direction | relative move-ment means | a [μm] | b [μm] | c [mm] | d [mm/sec] | e [μm] | f [dpi] |
|---|---|---|---|---|---|---|---|
| circumference of drum | rotation of drum | 49 | 50 | 5.0 | 300 | 10 | 600 |
| axis of drum | shift of sensor | 58 | 50 | 5.0 | 300 | 10 | 600 | a: detecting resolving power
b: diameter of conductive rod
c: length of conductive rod
d: relative movement speed
e: measurement interval
f: scan line density

TABLE 39

| Relative movement direction | relative move-ment means | a [μm] | b [μm] | c [mm] | d [mm/sec] | e [μm] | f [dpi] |
|---|---|---|---|---|---|---|---|
| circumference of drum | rotation of drum | 49 | 50 | 5.0 | 300 | 10 | 600 |

TABLE 39-continued

| Relative movement direction | relative movement means | a [μm] | b [μm] | c [mm] | d [mm/ sec] | e [μm] | f [dpi] |
|---|---|---|---|---|---|---|---|
| axis of drum | shift of sensor | 58 | 50 | 5.0 | 300 | 10 | 600 | a: detecting resolving power
b: thickness of detecting rod
c: length of conductive rod
d: relative movement speed
e: measurement interval
f: scan line density As shown in the Tables 38 and 39, by shifting the potential sensors 4101, 5101, also in an arrangement in which the relative movement is generated, a resolving power and intensity sufficient to measure the digital latent image can be obtained. From the result, it can be seen that the surface potential measuring method according to the present invention can be applied to the arrangement in which the potential sensors 4101, 5101 are movable with respect to the surface, as well as the arrangement in which the relative movement between the potential sensors 4101, 5101 and the surface is achieved by the rotation of the photosensitive body 100, i.e., the surface is movable with respect to the potential sensor.

Now, concrete examples of control of the electrophotographic apparatus by using these sensors will be explained.

Embodiment 4-4

A photosensitive body mainly including a-Si and comprised of a charge-injection preventing layer, a photoconductive layer and a surface layer was formed on blast-worked aluminium cylinder (support) having a diameter of 180 mm under conditions shown in the following Table 40.

TABLE 40

| | Photosensitive body | | |
|---|---|---|---|
| | A layer | B layer | C layer |
| Kind and flow rate of gas | | | |
| $SiH_4$ [sccm] | 100 | 200 | 10 |
| $H_2$ [sccm] | 300 | 800 | |
| $B_2H_6$ [sccm] (for $SiH_4$) | 2000 | 2 | |
| NO [sccm] | 50 | | |
| $CH_4$ [sccm] | | | 500 |
| Support temp. [° C.] | 290 | 290 | 290 |
| Inner pressure [Torr] | 0.5 | 0.5 | 0.5 |
| Power [W] | 500 | 800 | 300 |
| Film thickness [μm] | 3 | 30 | 0.5 |

A layer: charge-injection preventing layer
B layer: photo-conductive layer
C layer: surface layer

TABLE 41

| Sensor shape | a [μm] | b [mm] | c [mm/ sec] | d [μm] | e [dpi] |
|---|---|---|---|---|---|
| FIG. 52 type | 10 | 1.0 | 300 | 10 | 600 | a: diameter of conductive rod
b: length of conductive rod
c: relative movement speed
d: measurement interval
e: scan line density The manufactured photosensitive body was set in an image forming apparatus (obtained by remodeling NP 6060 (manufactured by Canon Inc.) to be suited to the potential sensor of the present invention). Incidentally, the image forming apparatus was remodeled so that the latent image can be written by a laser.

The potential sensor in the embodiments 1 and 2 was used. The shape of the sensor used is shown in the above Table 41. The image formation was controlled by using this sensor. Control methods are shown in the following Table 42.

In the control methods shown in the Table 42, when two controls are overlapped, it means that these controls are effected simultaneously.

TABLE 42

| Control method | Vdark control | V1 control | Vdc control |
|---|---|---|---|
| A | presence | absence | presence |
| B | absence | presence | presence |
| C | presence | presence | absence |

* Vdark control (presence): A sequence in which only Vdark potential is set to a target value is effected by applying voltage/current to a charging portion.

* Vdark control (absence): Vdark potential is determined by applying given voltage/current to a charging member and further control is not effected.

A Vdark potential value is monitored by the potential sensor of the present invention, and Vdc is controlled on the basis of such a value, if necessary.

* V1 control (presence): Change of potential is caused in the charged-up charging member by a laser and the laser output is controlled so that the change of potential becomes a given amount of potential change by integrating and analyzing the dielectric current detected by the potential sensor of the present invention.

* V1 control (absence): Change of potential is caused in the charged-up charging member by a given laser, and the dielectric current (corresponding to the change of potential) detected by the potential sensor of the present invention is integrated and analyzed, and the obtained data is fed back to the Vdark control and Vdc control, if necessary.

* Vdc control (presence): A DC component of developing bias is controlled in dependence upon a value of V1/Vdark.

* Vdc control (absence): The DC component of the developing bias is maintained to a constant value.

In all of the image formation controls A, B and C shown in the Table 42, a high quality digital image in which laser dots are reproduced correctly could be obtained.

Further, a print endurance test was effected by copying 100,000 (A4 size) sheets by means of this electrophotographic image forming apparatus under an environment shown in the following Table 43. The control of image formation was effected as shown in the above Table 42. The control shown in the Table 42 was effected automatically every 100 sheets.

The evaluation of the latent image during the print endurance test was effected on the basis of the image by checking reproductivity of the laser latent image (reproductivity of dots) and change in image density. The results of the print endurance test were good in all of the environments, and, during the print endurance test for 100,000 sheets, the quality (dot reproductivity/image density) of the digital images was not worsened. Further, in the controls A and B shown in the Table 42, the control time can be reduced to about 50% or less in comparison with the well-known potential control (in which Vdark and V1 are independently controlled by know potential sensors), thereby achieving an advantage of reduction of potential control time. Incidentally, "1" in V1 is "l" (small L).

TABLE 43

| Environment | room temp. [° C.] | RH [%] | number of test sheets |
|---|---|---|---|
| A | 30 | 80 | 100,000 |
| B | 20 | 40 | 100,000 |

Further, it was found that the sensor shapes in the embodiments 1 and 2 other than the sensor shapes shown in the Table 41 achieved the same effect.

Embodiment 4-5

A ground layer (intermediate layer) having a thickness of 1 μm was provided by coating methanol solution including alkoxy-methylated nylon of 5% on an aluminium cylinder (base substrate) having another diameter of 108 mm and a length of 358 mm by immersion. Then, titanyl-pthalocyanine pigment of 10 weight parts (referred to merely as "parts" hereinafter), polyvinyl butylal of 8 parts and cyclohexanone of 50 parts were mixed and dispersed in a sand mill device using glass beads of 100 parts for 20 hours. Methyl-ethyl ketone of 70 to 120 parts (appropriately) was added to the dispersion solution and then was coated on the ground layer, and, by drying this at a temperature of 100° C. for 5 minutes, a charge generating layer was formed having a thickness of 0.2 μm. Then, styryl compound of 10 parts and bisphenol Z-type polycarbonate of 10 parts was dissolved in monochlorobenzene of 65 parts. This solution was coated on the charge generating layer by a dipping technique, and, by drying this by hot-air for 60 minutes at a temperature of 120° C., a charge transfer layer having a thickness of 20 μm was formed. Further, a surface layer having a thickness of about 1 μm was provided on the transfer layer as a surface protection layer.

An OPC photosensitive body so manufactured was set in an image forming apparatus (obtained by remodeling NP 6060 (manufactured by Canon Co.) to be suited to the potential sensor of the present invention). Incidentally, the image forming apparatus was remodeled so that the latent image can be written by a laser. The potential sensor in the embodiments 1 and 2 was used. Control of image formation was effected by using this potential sensor. The control methods are the same as those in the embodiment 4 (Table 42). By effecting the same evaluation as that in the embodiment 4, it was ascertained that the same excellent result can be obtained.

Then, the same print endurance test as that in the embodiment 4 was effected. The control methods, environment and evaluating method are the same as those in the embodiment 4. 20,000 sheets were copied.

The evaluation of the latent image during the print endurance test was effected on the basis of the image by checking reproductivity of the laser latent image (reproductivity of dots) and change in image density. The results of the print endurance test were good in all of the environments, and, during the print endurance test for 10,000 sheets, the quality (dot reproductivity/image density) of the digital images was not worsened. Further, in the controls A and B shown in the Table 42, the control time can be reduced to about 50% or less in comparison with the well-known potential control (in which Vdark and V1 are independently controlled by know potential sensors), thereby achieving an advantage of reduction of potential control time.

Figure 59:
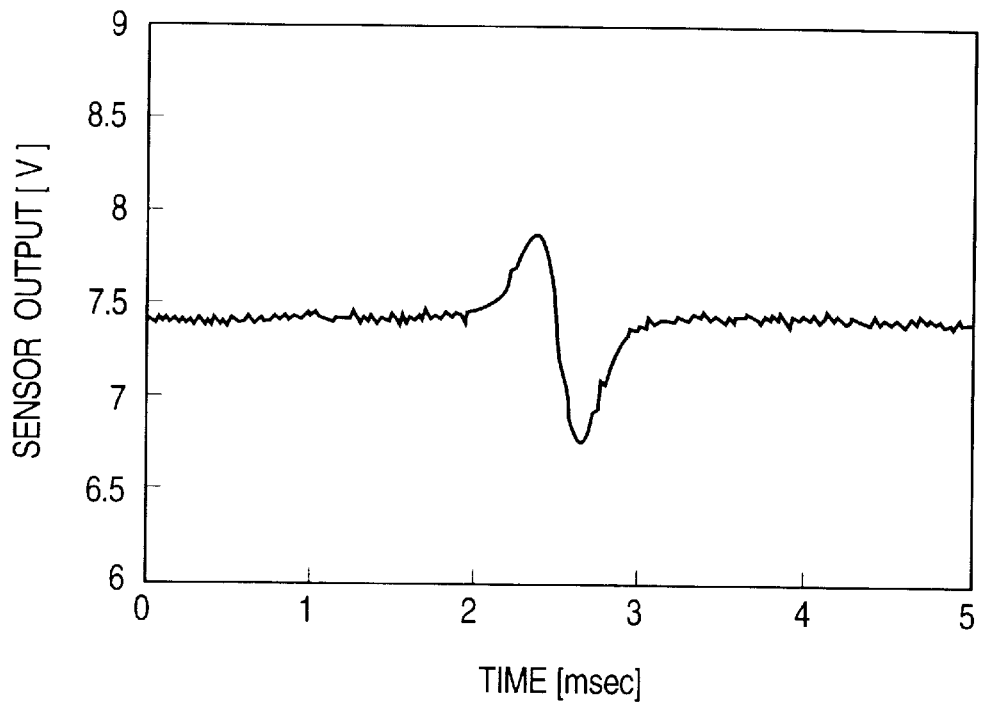
FIG. 59 is a waveform view showing measured results of a one-pixel latent image formed by a laser exposure having scan line density of 600 dpi.
Figure 60:
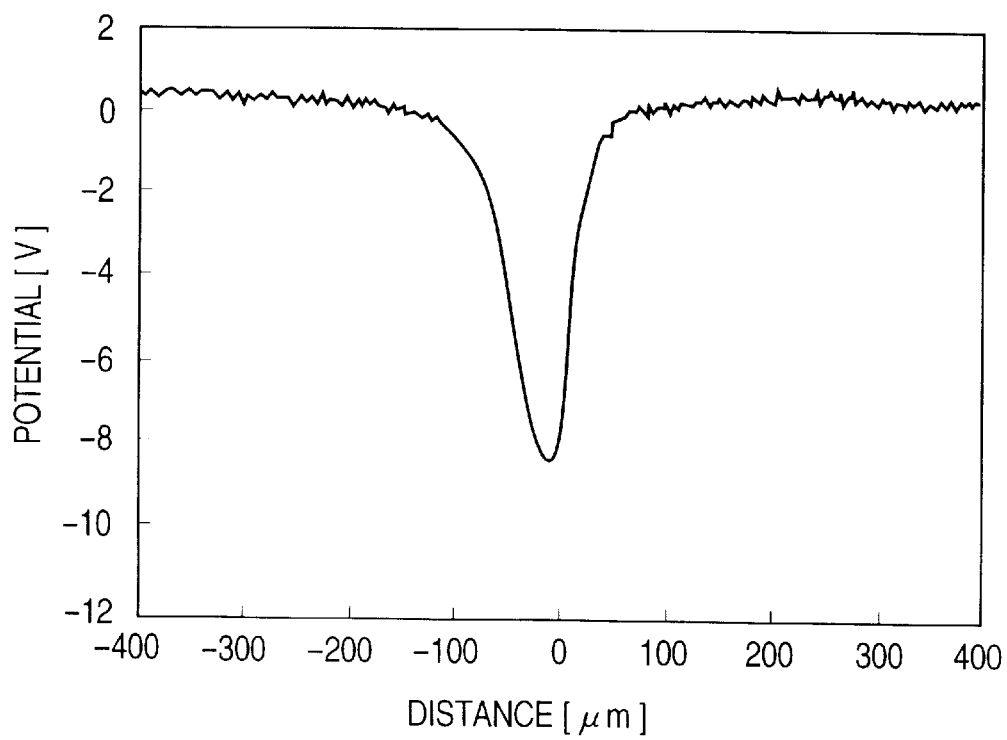
FIG. 60 is a waveform view showing potential configuration after integration analysis of FIG. 59.
Figure 61:
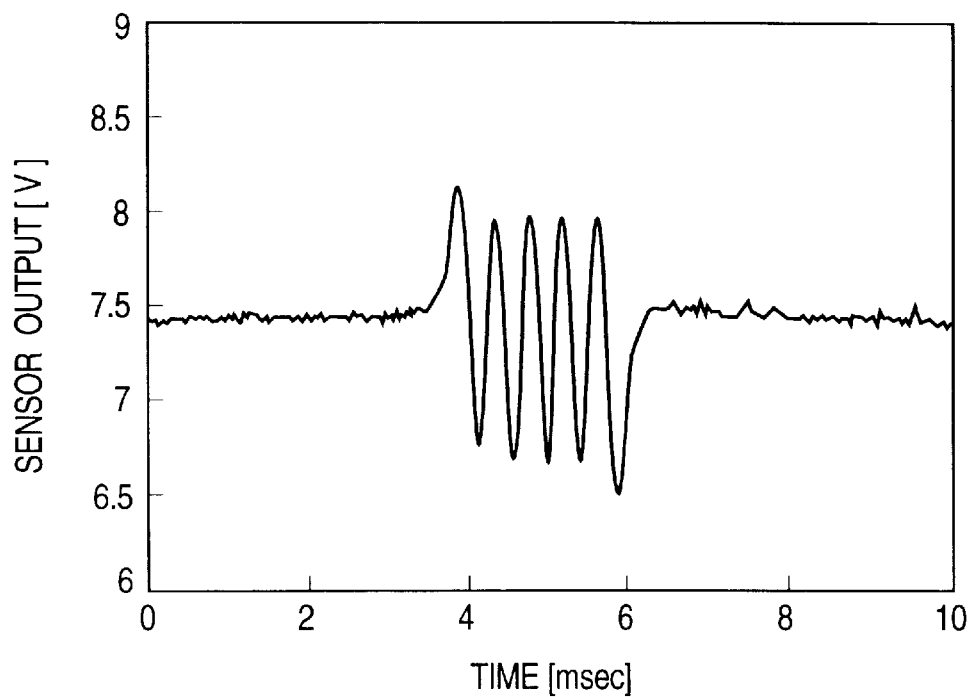
FIG. 61 is a waveform view showing measured results of a one-dot/one-space latent image formed by a laser exposure having scan line density of 600 dpi.
Figure 62:
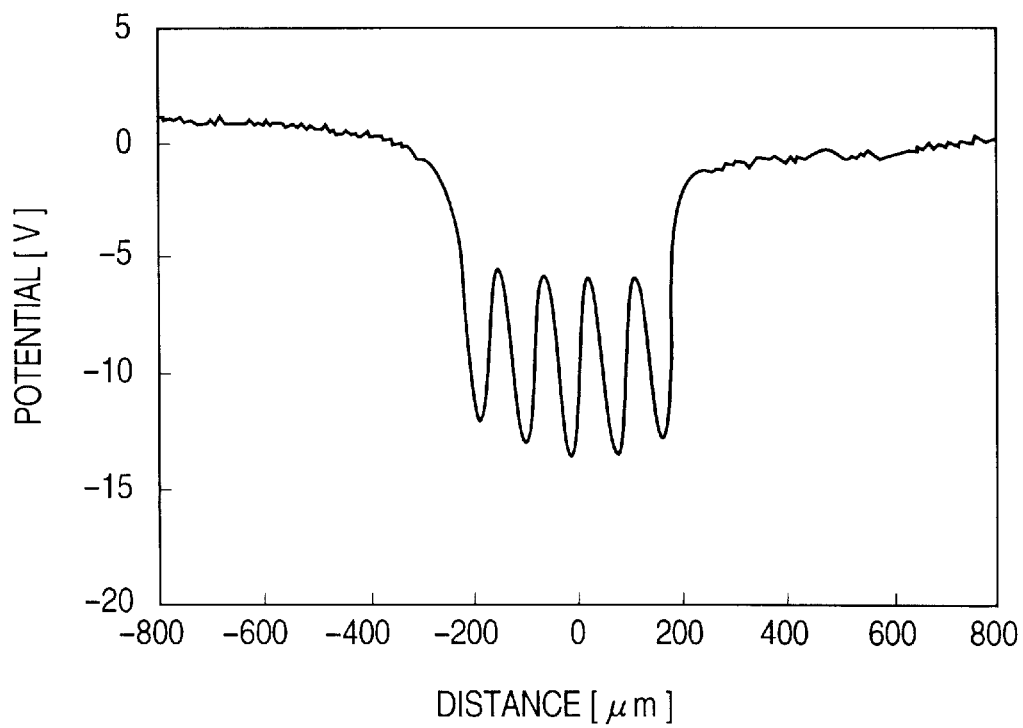
FIG. 62 is a waveform view showing potential configuration after integration analysis of FIG. 61.

FIG. 59 shows a result of measurement of a one-pixel latent image formed by laser exposure having scan line density of 600 dpi. FIG. 60 shows potential configuration of FIG. 59 in the form of a waveform after integration and analysis. FIG. 61 shows a result of measurement of a one dot-one space latent image formed by laser exposure having scan line density of 600 dpi. FIG. 62 shows potential configuration of FIG. 61 in the form of a waveform after integration and analysis.

FIFTH EMBODIMENT

Control

To obtain the high quality image by using the above-mentioned potential measuring means, in a fifth embodiment of the present invention, the potential configuration of the digital latent image on the photosensitive body 100, particularly, clearness or sharpness and depth of the digital electrostatic latent image are controlled. Alternatively, the image forming processes are controlled in accordance with the depth and clearness of the latent image. From the investigation, the Inventors found an electrophotographic image forming apparatus and an electrophotographic image forming method, in which a high quality image can be obtained by controlling one or both of the potential distribution of the digital latent image detected by the above-mentioned potential measuring method and the image forming processes.

Control of Image Formation

By controlling the image forming processes in accordance with the depth and clearness of the latent image, development of a toner image can be maintained in an optimum condition, thereby obtaining a high quality image. For example, a developing process can be controlled in accordance with the potential distribution in the following manners.

Figure 63:
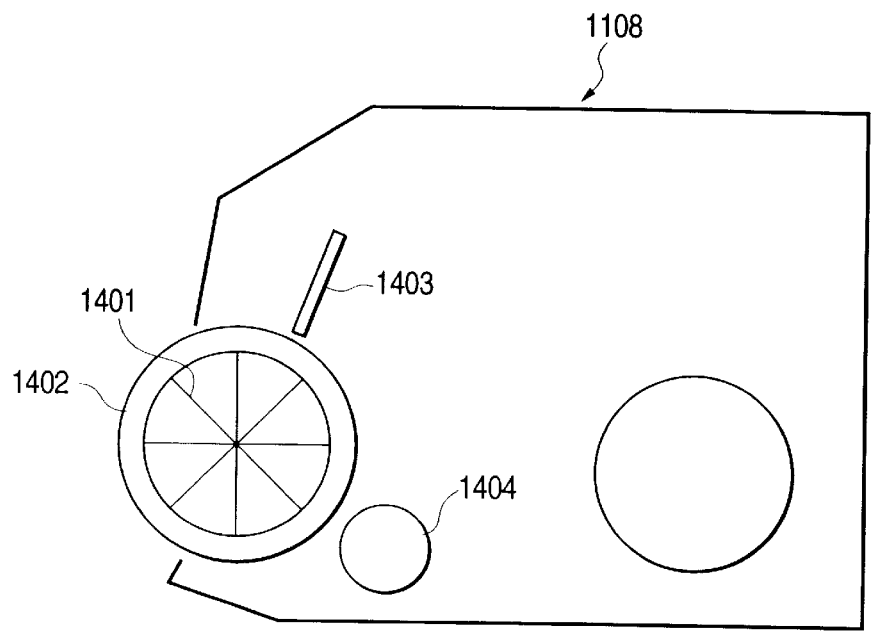
FIG. 63 is a sectional view of a developing device.

(1) Control for Changing Developing Bias
Uniform image quality, down time reduction and increase of maintenance interval FIG. 63 schematically shows a developing device (developing means) 1108. The developing device 1108 comprises a developing sleeve 1402 including a magnet 1401 therein and adapted to convey toner to the vicinity of the surface of the photosensitive body 100, a doctor blade 1403 as a means for regulating an amount of toner conveyed to the photosensitive body, a voltage applying means (not shown) for applying developing bias to the developing sleeve 1402, and a toner reservoir 1404 for storing the toner. In the development, the developing bias (AC+DC) is applied to the developing sleeve 1402. Performance of the toner is varied with construction of the toner and is generally divided into two kinds.

(a) One-component Group

The toner is reciprocated while jumping at a high speed between the developing sleeve 1402 and the photosensitive body 100 by a relation between the developing bias (particularly, an AC component thereof) and a magnetic force of the magnet 1401 of the developing sleeve. The toner is developed on the surface 102 of the photosensitive body 100 by a relation between polarity of the toner and the developing bias (particularly, a DC component thereof) and potential of the surface 102 of the photosensitive body 100.

(b) Two-component Group

The toner extends to the surface 102 of the photosensitive body 100 while being connected to the developing sleeve so that to toner is contacted with the surface in the form of a magnet brush. The toner is developed on the surface 102 of the photosensitive body 100 by a relation between the developing bias (particularly, the DC component thereof) and the magnetic force of the magnet of the developing sleeve. In such developing processes, the high quality image can be obtained by controlling the developing means in accordance with the digital electrostatic latent image.

Concretely, for example, the developing bias may be controlled in accordance with the depth of the latent image.

Figure 64:
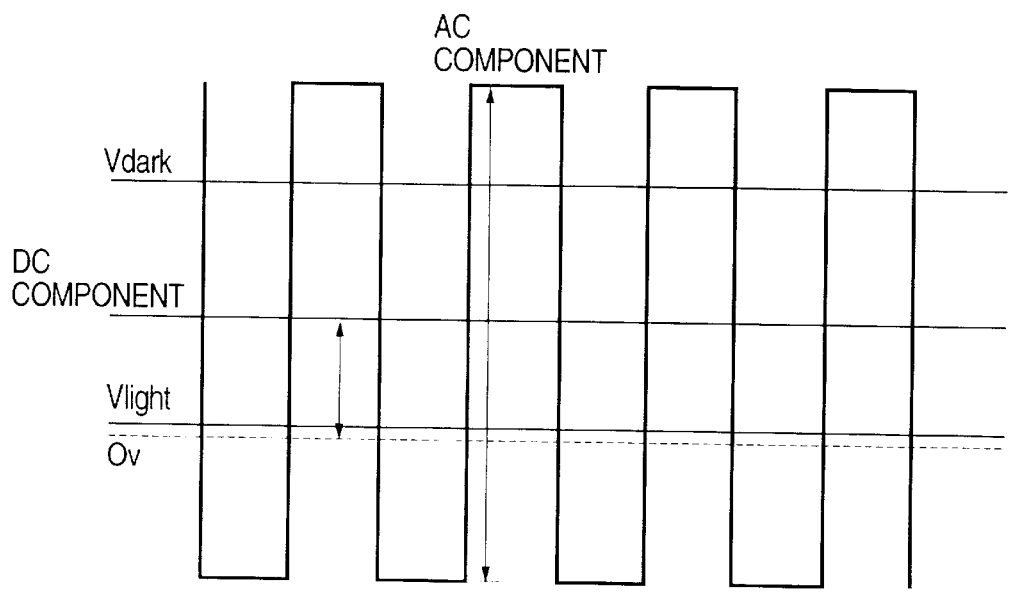
FIG. 64 is a schematic explanatory view showing a relation between a digital electrostatic latent image and developing base.
Figure 65:
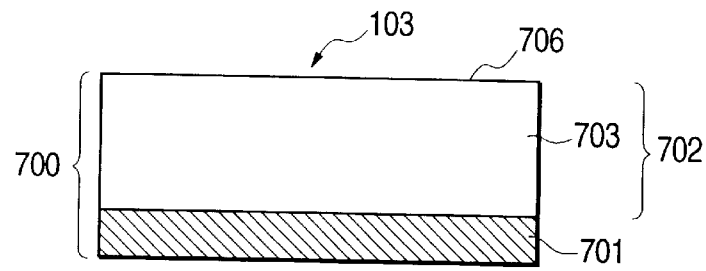
FIG. 65 is a schematic view showing a layer structure of a photosensitive body of the image forming apparatus according to the present invention.

FIG. 64 schematically shows a relation between the digital electrostatic latent image and the developing bias. In general, the DC component of the developing bias is set to a substantially intermediate value between the potential Vdark of the dark portion of the digital electrostatic latent image and the potential VI of the exposure portion.

In the illustrated embodiment, if one or both of the values Vdark and VI is changed for any reason, the optimum toner image can be obtained by changing the DC component of the developing bias in accordance with the changed potential. If the value VI is increased to decrease the depth of the latent image, the DC component of the developing bias is changed toward an increasing direction. Conversely, if the value Vdark is decreased, the developing bias is decreased. In this way, even if the depth of the latent image is changed, the uniform image can be obtained.

Further, it is not required to re-set the values Vdark and VI, thereby reducing the control time. Thus, the control can be effected at real time in use, and, thus, a waiting time of control can be eliminated or be reduced greatly. Further, even if the value Vdark is reduced due to reduction of ability of the charge means or even if the value VI is increased due to reduction of ability of the exposure means, the control can be performed. As a result, interval of the maintenance can be lengthened. Incidentally, the AC component of the developing bias may be controlled.

(2) Control for Changing a Distance (SD gap) Between the Developing Means and the Photosensitive Body Reduction of fog by controlling SD gap By controlling the SD gap in accordance with the clearness of the potential of the digital latent image, so-called "fog" in which toner development is caused up to an undesired area can be suppressed.

If the boundary between the Vdark area and the VI area detected by the measuring method according to the illustrated embodiment is obscure, i.e., if the clearness of the latent image is weak, by controlling the SD gap, an area where the toner is developed is changed, thereby obtaining an image having less "fog".

In the illustrated embodiment, as a result that the potential distribution of the digital electrostatic latent image, if the clearness of the potential of the latent image is weak, the development at the boundary can be suppressed by decreasing the SD gap or the development at the boundary can be promoted by increasing the SD gap.

This effect becomes great particularly in the two-component toner group. Probably, the reason is that, in a system in which there is almost no positional change between the developing sleeve and the photosensitive body 100, as the SD gap, i.e., the distance between the sleeve and the tip end of the toner is increased, the effect of the magnetic force of the sleeve acting on the tip end of the toner is reduced.

Incidentally, from the view points of the jumping movement and chain connection of the toner and prevention of toner scattering within the apparatus, it is not so preferable that the SD gap is too great. Further, if too small, the discharge is generated between the toner or the developing means such as the developing sleeve and the photosensitive body 100, thereby affecting a bad influence upon the latent image or preventing the movement of the toner to damage the developing means and/or the photosensitive body 100. Thus, the SD gap is preferably within a range of 100 $\mu$m to 400 $\mu$m.

Further, from the above-mentioned relation, the developing bias value, weight of the toner and charge density, it is effective that the SD gap is controlled to a more suitable range. A means for controlling the SD gap may be similar to the means for maintaining the distance between the potential sensor and the photosensitive body 100, and other various methods may be used as the control means.

(Control of potential distribution of latent image)

Converesely to the above example, the digital electrostatic latent image can be controlled.

The depth and clearness of the latent image on the photosensitive body 100 can be controlled on the basis of the image forming processes, so that the image quality can be improved and a waiting time can be shortened.

(3) Control for Changing the Values Vdark and VI Usage within a range where the latent image is formed It is preferable that the depth of the digital latent image has a value greater than a predetermined value. Further, in order to obtain a clear image including fine grids and the like, it is preferable that the potential at the boundary between the exposure portion and the non-exposure portion is cleared distinguished from these portions, namely, the clearness of the latent image is excellent. On the other hand, the range of the potential for obtaining the optimum digital electrostatic latent image is varied with the photosensitive body and use condition thereof. By setting the depth and clearness of the latent image to the optimum condition totally, a sharp digital latent image which can reproduce the image signal effectively can be obtained.

More specifically, the charge means and/or the image signal applying means are controlled on the basis of the potential distribution of the electrostatic latent image. In the system for controlling the electrostatic latent image, absolute values of Vdark and VI are not necessarily constant.

Reduction of potential control time

As mentioned above, in the past, the value Vdark has firstly been set by controlling the charge means and then the value VI has been set while controlling the image signal applying means. During the potential control, since a waiting condition is established to limit the use of the apparatus, it is important to reduce the potential control time particularly in case of continuous use such as a printer in a network.

In the potential measuring means according to the illustrated embodiment, regarding the digital electrostatic latent image, the values Vdark and VI can be measured simultaneously, the charge means and the image signal applying means can be controlled simultaneously. As a result, the time required for the potential control can be shortened.

(4) Control for Regulating Electricity Amount of Photosensitive Body

Use of photosensitive body 100 having electric capacity of 40 $nC/cm^2$ to 400 $nC/cm^2$ In the potential measuring means according to the illustrated embodiment, from the above-mentioned measuring principle, it is preferable that difference in the charge amount in the developing portion is great. However, if too great, adjusting amount of the charging condition such as applied voltage and applied current and the image signal applying condition such as exposure intensity must be increased, with the result that the electrophotographic apparatus becomes complicated and bulky. To avoid this, a photosensitive body 100 in which difference in electricity amount between the values Vdark and VI of the latent image having 40 nC/cm² to 400 nC/cm² is used is preferable.

A preferred photosensitive body 100 may be a photosensitive body including non-crystal silicon as main material, i.e., a photosensitive body of amorphous silicon group (referred to as "a-Si photosensitive body") or a photosensitive body comprised of organic semi-conductor (OPC).

Since the a-Si photosensitive body has relatively great electric capacity, the difference in the electricity amount per potential difference becomes great. Thus, such photosensitive body can be used in an area having low Vdark and VI values.

On the other hand, in the OPC, the difference in electricity amount becomes small. In such a photosensitive body 100, the value Vdark is set to be greater to increase the difference in electricity amount so that the photosensitive body may be used to increase the potential difference between the values Vdark and VI. By selecting the setting of the potential more suitable for the photosensitive body 100, the sharp digital latent image can be obtained.

(a-Si group photosensitive body)

Although the a-Si group photosensitive body may be constituted by a known conductive support and a photo-conductive layer made of non-mono-crystal material based on silicon element, a photosensitive body having improved property can be used, if necessary.

The a-Si group photosensitive body having the improved property has a photo-conductive layer including hydrogen of 10 atom % to 30 atom % and is characterized in that property energy of tail (Arback tail) of an exponential function of light absorption spectrum is 50 meV to 60 meV and local condition density is $1 \times 10^{14}$ cm$^{-3}$ to $1 \times 10^{16}$ cm$^{-3}$.

The photosensitive body (for the image forming apparatus) designed to have the above-mentioned construction has very excellent electrical, optical and photo-electrical features, good image quality, good endurance and good use environmental feature, as well as good temperature depending feature of charging ability.

Now, a photo-conductive member according to the illustrated embodiment will be fully explained with reference to the accompanying drawings.

Figure 66:
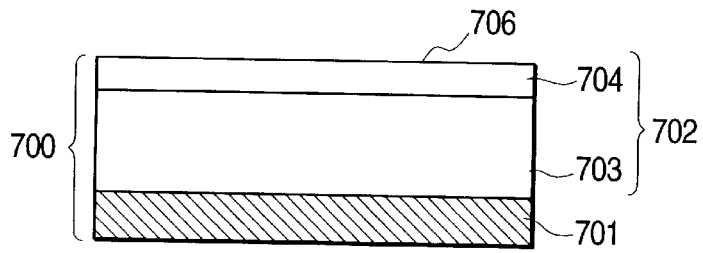
FIG. 66 is a schematic view showing a layer structure of a photosensitive body of the image forming apparatus according to the present invention.

FIGS. 65 to 70 are schematic structural views for explaining layer structures of photosensitive bodies for the image forming apparatus. A photosensitive body 700 for the image forming apparatus shown in FIG. 65 includes a photosensitive layer 702 provided on a support 701 as a photosensitive body. The photosensitive layer 702 is constituted by a photo-conductive layer 703 comprising a-Si: H, X and having photo-conductivity. FIG. 66 is a schematic constructional view for explaining another layer structure of a photosensitive body for the image forming apparatus.

The photosensitive body 700 for the image forming apparatus shown in FIG. 66 includes a photosensitive layer 702 provided on a support 701 as a photosensitive body. The photosensitive layer 702 is constituted by a photo-conductive layer 703 comprising a-Si: H, X and having photo-conductivity, and a surface layer 704 of amorphous silicon group.

Figure 67:
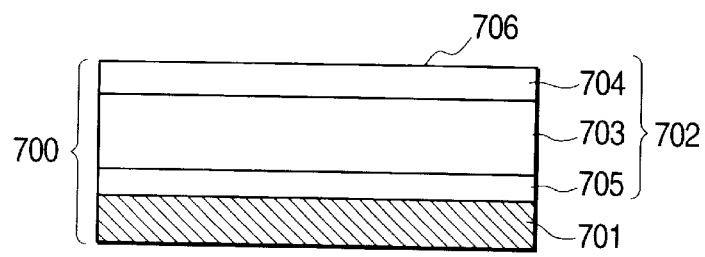
FIG. 67 is a schematic view showing a layer structure of a photosensitive body of the image forming apparatus according to the present invention.

FIG. 67 is a schematic constructional view for explaining a further layer structure of a photosensitive body for the image forming apparatus. The photosensitive body 700 for the image forming apparatus shown in FIG. 67 includes a photosensitive layer 702 provided on a support 701 as a photosensitive body. The photosensitive layer 702 is constituted by a photo-conductive layer 703 comprising a-Si: H, X and having photo-conductivity, a surface layer 704 of amorphous silicon group, and a charge injection preventing layer 705 of amorphous silicon group.

Figure 68:
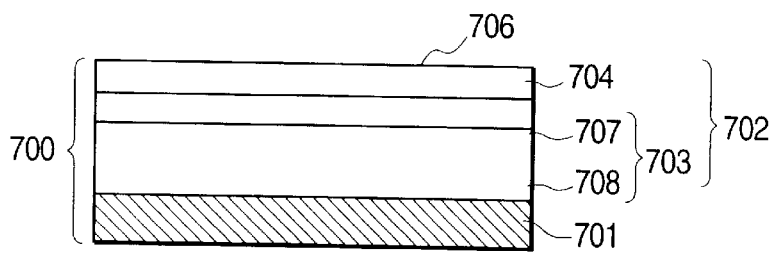
FIG. 68 is a schematic view showing a layer structure of a photosensitive body of the image forming apparatus according to the present invention.
Figure 69:
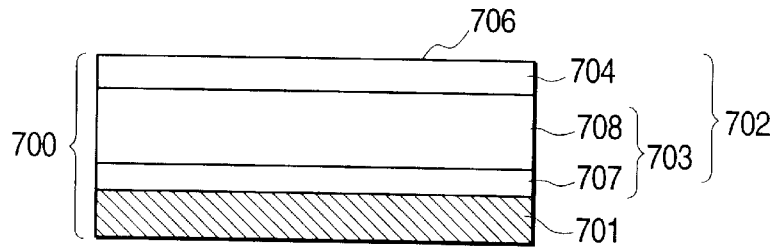
FIG. 69 is a schematic view showing a layer structure of a photosensitive body of the image forming apparatus according to the present invention.

FIGS. 68 and 69 are schematic constructional views for explaining a still further layer structure of a photosensitive body for the image forming apparatus. The photosensitive body 700 for the image forming apparatus shown in FIGS. 68 and 69 includes a photosensitive layer 702 provided on a support 701 as a photosensitive body. The photosensitive layer 702 is constituted by a charge transfer layer 708 and a charge generating layer 707 comprising a-Si: H, X and constituting a photo-conductive layer 703, and a surface layer 704 of amorphous silicon group.

(Support)

The support 701 may be conductive or insulative. The conductive support may be formed from metal such as Al, Cr, Mo, Au, In, Nb, Te, V, Ti, Pt, Pd, Fe or alloy thereof (for example, stainless steel). Further, a surface (on which the photosensitive layer is formed) of an electrically insulative support formed from film or sheet of synthetic resin such as polyester, polyethylene, polycarbonate, cellulose acetate, polypropylene, polyvinyl chloride, polystyrene or polyamide, or glass or ceramics may be conductor-treated.

Further, a shape of the support 701 may be a cylinder or an endless belt having a smooth surface or an uneven surface, and a thickness of the support is appropriately determined so that a desired photosensitive body 700 for the image forming apparatus can be formed. However, the thickness of the support 701 is normally selected to 10 μm or more in consideration of manufacture, handling and mechanical strength.

Particularly, when the image recording is effected by using coherence light such as laser, in order to eliminate poor image due to so-called interference fringes appeared on the visual image more effectively, unevenness may be formed on the surface of the support 701 within a range where there is substantially no reduction in light forming carrier. The unevenness on the surface of the support 701 may be formed by a well-known method disclosed in Japanese Patent Application Laid-Open Nos. 60-168156, 60-178457, 60-225854 and 61-231561.

As another method for eliminating the poor image due to the interference fringes more effectively when the coherence light such as laser is used, an interference preventing layer or area such as a light absorbing layer may be provided inside or lower side of the photosensitive layer 702.

By providing fine scratches on the surface of the support 701, fine roughness of the surface of the photosensitive boy can be controlled. Formation of the scratches may be effected by using abrasive agent or member or by using etching due to chemical reaction or dry etching or spattering in plasma. In this case, depth and magnitude of the scratches may be included within the range where there is substantially no reduction in light forming carrier.

(Photo-conductive layer)

In the present invention, in order to achieve the objects thereof effectively, numerical conditions of film forming parameters of the photo-conductive layer 703 provided on the support 701 (or on the ground layer (not shown), if necessary) and constituting a part of the photosensitive layer 702 are set appropriately to obtain a desired property by a vacuum deposition film forming method. More concretely, for example, the photo-conductive layer can be formed by various thin film deposition methods such as a glow discharge method (AC discharge CVD method such as low frequency CVD method, high frequency CVD method or microwave CVD method, or DC discharge CVD method), a spattering method, a vacuum deposition method, an ion plating method, a light CVD method or a thermal CVD method. These thin film deposition methods are selected and adopted on the basis of various factors such as a manufacturing condition, degree of burden in investment of capital equipments, a manufacturing scale and features required for the photosensitive body for the image forming apparatus. However, since the control of conditions for manufacturing the photosensitive body (for the image forming apparatus) having the desired features is relatively easy, the glow discharge method, particularly, a high frequency glow discharge method using an RF band, a $\mu$W band or a VHF band is preferable.

In order to form the photo-conductive layer 703 by the glow discharge method, fundamentally, as is well-known, raw material gas capable of supplying silicon atoms (Si) and raw material gas capable of supplying hydrogen atoms (H) or raw material gas capable of supplying halogen atoms (X) may be introduce into a reaction vessel (in which inner pressure can be reduced) in a desired gaseous condition and the glow discharge may be generated in the reaction vessel so that a layer comprised of a-Si: H, X is formed on a predetermined support 701 which was previously installed at a predetermined position.

Further, although it is required that hydrogen atoms or/and halogen atoms are included in the photo-conductive layer 703 in order to compensate for non-bonding hands of silicon atoms thereby to improve quality of the layer (particularly, photo-conductivity and charge holding ability), it is desirable that a content amount of hydrogen atoms or halogen atoms, or the sum of amounts of the hydrogen atoms and the halogen atoms is 10atom% to 30atom% (preferably, 15atom% to 25atom%) with respect to the sum of the silicon atoms and the hydrogen atoms or/and halogen atoms.

In order to achieve the objects of the present invention by structurally introducing the hydrogen atoms into the photo-conductive layer 703 to be formed and by facilitating the control of the introduction rate of the hydrogen atoms, $H_2$ gas and/or He gas or gas of silicon compound including hydrogen atoms are required to be mixed with the above-mentioned gases to form the layer. Further, not only each gas alone can be used, but also several kinds of gases can be mixed with a predetermined mixing ratio.

The raw material gas capable of supplying the halogen atoms used in the illustrated embodiment may be, for example, halogen gas, haride, inter-halogen compound including halogen, or halogen compound such as silane derivative replaced by halogen which is gaseous or can be gasified. Furthermore, silicon hydride compound including halogen atoms and silicon atoms which is gaseous or can be gasified is also effective.

The halogen compound which can suitably be used in the illustrated embodiment may concretely be inter-halogen compound such as fluorine gas ($F_2$), BrF, ClF, $ClF_3$, $BrF_3$, $BrF_5$, $IF_3$ or $IF_7$.

The silicon compound including halogen atoms (so-called silane derivative replaced by halogen atoms) may concretely be silicon fluoride such as $SiF_4$ or $Si_2F_6$, for example.

In order to control the amounts of hydrogen atoms or/and halogen atoms included in the photo-conductive layer 703, for example, a temperature of the support 701, an amount of raw material substance (used for including hydrogen atoms or/and halogen atoms) introduced into the reaction vessel, and/or discharge electric power may be controlled.

In the illustrated embodiment, it is preferable that atoms for controlling conductivity are included in the photo-conductive layer 703, if necessary. The atoms for controlling the conductivity may uniformly be distributed in the photo-conductive layer 703 or be included in the photo-conductive layer partially non-uniformly along a thickness direction.

The atoms for controlling the conductivity may be so-called impurities in the semi-conductor field, and, as such atoms, atoms belonging to the periodic law table IIIb group giving p-type conductivity (referred to as "IIIb group atoms" hereinafter) or atoms belonging to the periodic law table Vb group giving n-type conductivity (referred to as "Vb group atoms" hereinafter) may be used.

The IIIb group atoms may concretely be boron (B), aluminum (Al), gallium (Ga), indium (In) or thallium (Tl). Particularly, B, Al or Ga is preferable. The Vb group atom may concretely be phosphorus (P), arsenic (As), antimony (Sb) or bismuth (Bi) (particularly, P or As is preferable).

The amount of atoms (for controlling the conductivity) included in the photo-conductive layer 703 is preferably $1\times10^{-2}$atom•ppm–$1\times10^4$atom•ppm, and more preferably, $5'10^{-2}$atom•ppm–$5\times10^3$atom•ppm, and most preferably, $1\times10^{-1}$atom•ppm–$1\times10^3$atom•ppm.

In order to structurally introduce the atoms (for example, IIIb group atoms or Vb group atoms) for controlling the conductivity, when the layer is formed, raw material substances for introducing the IIIb group atoms or raw material substance for introducing the Vb group atoms may be introduced into the reaction vessel in a gaseous form, together with other gases for forming the photo-conductive layer 703. It is desirable that gasses which is gaseous under normal temperature and normal pressure or gasses which can easily be gasified at least in the layer forming condition is used as the raw material substance for introducing the IIIb group atoms or raw material substance for introducing the Vb group atoms.

Such raw material substance for introducing the IIIb group atoms may concretely be boron hydride such as $B_2H_6$, $B_4H_{10}$, $B_5H_9$, $B_5H_{11}$, $B_6H_{10}$, $B_6H_{12}$ or $B_6H_{14}$ or boron haride such as $BF_3$, $BCl_3$ or $BBr_3$ (for introducing boron atoms). $AlCl_3$, $GaCl_3$, $Ga(CH_3)_3$, $InCl_3$ or $TlCl_3$ may also be used.

The raw material substance for introducing the Vb group atoms may be phosphorus hydride such as $PH_3$ or $P_2H_4$ or phosphorus haride such as $PH_4I$, $PF_3$, $PF_5PCl_3$, $PCl_5$, $PBr_3$, $PBr_5$ or $PI_3$ (for introducing phosphorus atoms). $AsH_3$, $AsF_3$, $AsCl_3$, $AsBr_3$, $AsF_5$, $SbH_3$, $SbF_3$, $SbF_5$, $SbCl_3SbCl_5$, $BiH_3$, $BiCl_3$ or $BiBr_3$ may also be used as start substance for introducing the Vb group atoms.

The raw material substances for introducing the atoms for controlling the conductivity may be diluted by $H_2$ and/or He, if necessary.

In the illustrated embodiment, it is also effective that carbon atoms and/or oxygen atoms and/or nitrogen atoms are included in the photo-conductive layer 703. Contact amounts of the carbon atoms and/or oxygen atoms and/or nitrogen atoms is preferably $1\times10^{-5}$atom% to 10atom%, and most preferably, $1\times10^{-5}$atom% to 8atom%, and most preferably, $1\times10^{-3}$atom% to 5atom% with respect to the sum of silicon atoms, carbon atoms, oxygen atoms and nitrogen atoms. The carbon atoms and/or oxygen atoms and/or nitrogen atoms may uniformly be distributed in the photo-conductive layer or be included in the photo-conductive layer partially non-uniformly along a thickness direction.

In the illustrated embodiment, a thickness of the photo-conductive layer 703 is appropriately determined in consideration of the fact that the desired electrophotographic feature can be obtained, the fact that the electric capacity in the use condition is included within the above-mentioned range, and economical effect. The thickness is preferably 20 µm to 50 µm, and more preferably, 23 µm to 45 µm, and most preferably, 25 µm to 40 µm. The temperature of the support 701 is appropriately selected to the optimum range in accordance with the layer design. Normally, the temperature is preferably 200° C. to 350° C., and more preferably, 230° C. to 330° C., and most preferably, 250° C. to 310° C.

The conditions for forming the photo-conductive layer (temperature of the support, gas pressure and the like) are not normally determined independently, but, are desirably determined to optimum values on the basis of organic co-relation to obtain the photosensitive body having the desired features.

(Surface layer)

In the present invention, it is preferable that the surface layer 704 of amorphous silicon group is formed on the photo-conductive layer 703 so formed on the support 701. The surface layer 704 has a free surface 706 and is provided for achieving the objects of the present invention mainly regarding humidity resistance, continuous use feature, electrical voltage resistance, use environmental feature and endurance. The surface layer 704 may be formed from any one of materials of amorphous silicon group. However, for example, amorphous silicon including hydrogen atoms (H) and/or halogen atoms (X) and also including carbon atoms (referred to as "a-SiC: H, X" hereinafter), amorphous silicon including hydrogen atoms (H) and/or halogen atoms (X) and also including oxygen atoms (referred to as "a-SiO: H, X" hereinafter), amorphous silicon including hydrogen atoms (H) and/or halogen atoms (X) and also including nitrogen atoms (referred to as "a-SiN: H, X" hereinafter) or amorphous silicon including hydrogen atoms (H) and/or halogen atoms (X) and also including at least one of carbon atoms, oxygen atoms and nitrogen atoms (referred to as "a-SiCON: H, X" hereinafter) is preferably used.

The surface layer 704 can be formed, for example, by a well-known thin film deposition method such as a glow discharge method (AC discharge CVD method such as low frequency CVD method, high frequency CVD method or microwave CVD method, or AC discharge method), a spattering method, a vacuum depositing method, an ion plating method, a light CVD method or a thermal CVD method. There thin film depositing methods are selected and adopted on the basis of various factors such as a manufacturing condition, degree of burden in investment of capital equipments, a manufacturing scale and features required for the photosensitive body for the image forming apparatus. However, from the view point of productivity of the photosensitive body, the deposition method same as the deposition method for forming the photo-conductive layer is preferable.

For example, in order to form the surface layer 704 comprised of a-Si: H, X by the glow discharge method, fundamentally, raw material gas capable of supplying carbon atoms (C), and raw material gas capable of supplying carbon atoms (C), and raw material gas capable of supplying hydrogen atoms (H) or/and raw material gas capable of supplying halogen atoms (X) may be introduced into a reaction vessel (in which inner pressure can be reduced) in a desired gaseous condition and the glow discharge may be generated in the reaction vessel so that a surface layer comprised of a-Si: H, X is formed on a predetermined support 701 which was previously installed at a predetermined position and on which the photo-conductive layer 703 was formed. When the surface layer mainly including a-Sic is formed, it is desirable that the content amount of carbon atoms is 30% to 90% with respect to the sum of the silicon atoms and the carbon atoms.

Further, by controlling the content amount of hydrogen atoms included in the surface layer to be greater than 30atom% and smaller than 70atom%, the electric feature and high speed continuous use ability can be improved considerably and high hardness of the surface layer can be ensured. The content amount of hydrogen atoms included in the surface layer can be controlled on the basis of a flow rate of $H_2$ gas, temperature of the support, discharge power and/or gas pressure.

In order to control the amounts of the hydrogen atoms or/and halogen atoms included in the surface layer 704, for example, the temperature of the support 701, an amount of raw material substance (used for including hydrogen atoms or/and halogen atoms) introduced into the reaction vessel, and/or discharge electric power may be controlled. The carbon atoms and/or oxygen atoms and/or nitrogen atoms may uniformly be distributed in the surface layer or be included in the surface layer partially non-uniformly along a thickness direction.

Further, in the illustrated embodiment, it is preferable that atoms for controlling conductivity are included in the surface layer 704, if necessary. The atoms for controlling conductivity may uniformly be distributed in the surface layer or be included in the surface layer partially non-uniformly along a thickness direction.

The atoms for controlling the conductivity may be so-called impurities in the semi-conductor field, and, as such atoms, "IIIb group atoms" or "Vb group atoms" may be used.

Further, the raw material substance for introducing the atoms for controlling the conductivity may be diluted by gas such as $H_2$, He, Ar or Ne, if necessary.

It is desirable that a thickness of the surface layer 204 according to the illustrated embodiment is normally 0.01 µm to 3 µm, and preferably 0.05 µm to 2 µm, and most preferably, 0.1 µm to 1 µm. If the surface thickness is smaller than 0.01 µm, during the usage of the photosensitive body, the surface layer is lost due to wear; whereas, if the thickness is greater than 3 µm, the electrophotographic feature is worsened due to increase in residual potential.

Alternatively, as a surface layer, a non-crystal carbon film mainly including carbon and having bonding between carbon and fluorine at interior and/or outermost surface thereof (referred to as "a-C: H: F" hereinafter) may be used.

The a-C: H: f has an excellent water-repelling ability and low friction and further has an effect for preventing obscurity of the image under a high humidity environment in a conduction that an environmental countermeasure heater is eliminated, and serves to reduce or prevent damage of the photosensitive body due to mechanical friction of the toner particles.

An example that the surface layer 704 comprises a-C: H: F will now be described. Hydrocarbon is used as raw material gas and the layer is formed by glow discharge decomposition using high frequency. Since it is desirable that the surface protection layer has high transparency to suppress reduction in sensitivity, gas such as hydrogen, helium or argon is appropriately added, if necessary. Further, a temperature of the substrate is adjusted within a range from a room temperature to 350° C.

The substance for supplying carbon may be hydrocarbon such as $CH_4$, $C_2H_6$, $C_3H_8$ or $C_4H_{10}$ which is gaseous or which can be gasified. From the view point of easy handling during the layer formation and good carbon supplying efficiency, $CH_4$ or $C_2H_6$ is preferable. The carbon supplying raw material gas may be diluted by gas such as $H_2$, He, Ar or Ne, if necessary.

Although it is preferable that the high frequency electric power is greater since decomposition of hydrocarbon is adequately promoted, if too great, abnormal discharge will be generated to worsen the feature of the photosensitive body. Thus, the electric power should be limited not to generate the abnormal discharge. More specifically, the electric power is preferably 10W/cc or more regarding the hydrocarbon raw material gas and is adjusted appropriately.

The pressure in the discharge space is selected to 100 mmTorr or less, and preferably, 50 mTorr or less, and more preferably, 10Torr or less, and a lower limit of the pressure may be selected to a range where the discharge is stabilized.

In order to form an area where fluorine atoms are bonded to the film, after the surface protection layer comprising a-C is formed, gas including fluorine atoms is introduced, and the fluorine atoms are included into the film of the surface protection layer by etching the surface protection layer by generating plasma by means of the appropriate high frequency electric power. The electric power is suitably selected within a range from 10W to 500W in accordance with an etching speed. Similarly, pressure in a treatment space is suitably selected within a range from 1 mTorr to several Torr.

The fluorine group gas used for achieving the effect of the present invention may be gas including fluorine such as $CF_4$, $CHF_3$, $C_2F_6$, $ClF_3$, $CHClF_3$, $F_2$, $C_3F_8$ or $C_4F_{10}$. In order to achieve the effect of the present invention, a thickness of the film to be etched may be at least 20 Å or more. When more than 100 Å is etched, reproductivity and uniformity are further improved. So long as the thickness of the film to be etched is greater than 20 Å to 100 Å, since the effect of the present invention can be achieved, the thickness may be appropriately selected within this range. However, from the view point of easy control and industrial productivity, the thickness to be etched is preferably 1000 Å to 5000 Å or less.

In order to form the surface layer 704 having the feature capable of achieving the effect of the present invention, the temperature of the support 701 and the gas pressure in the reaction vessel must be selected to desired values. The conditions (temperature of the support and gas pressure and the like) for forming the surface layer are not normally determined independently, but, are desirably determined to optimum values on the basis of organic co-relation to obtain the photosensitive body having the desired features.

Further, in the illustrated embodiment, in order to further improve the feature such as charging ability, it is effective that a blocking layer (lower surface layer) in which content amounts of carbon atoms, oxygen atoms and nitrogen atoms are smaller than those in the surface layer is provided between the photo-conductive layer and the surface layer. Further, an area where content amounts of carbon atoms and/or oxygen atoms and/or nitrogen atoms are changed to gradually decrease toward the photo-conductive layer 703 may be provided between the surface layer 704 and the photo-conductive layer 703. With this arrangement, close contact between the surface layer and the photoconductive layer can be improved and an influence of interference due to light reflection at the interface can be reduced.

(Charge injection preventing layer)

In the photosensitive body for the image forming apparatus according to the illustrated embodiment, it is more effective that the charge injection preventing layer for preventing injection of charges from the conductive support is provided between the conductive support and the photo-conductive layer. That is to say, the charge injection preventing layer has a function for preventing the charges from being injected from the support to the photo-conductive layer when the free surface of the photosensitive layer is subjected to the charging treatment with given polarity and has a polarity depending ability for preventing such a function when the free surface is subjected to the charging treatment with opposite polarity. In order to apply such function and ability, a larger amount of atoms for controlling the conductivity are included in the charge injection preventing layer than the photoconductive layer.

The atoms for controlling the conductivity may uniformly be distributed in the charge injection preventing layer or along the thickness direction thereof, or be included in the charge injection preventing layer partially non-uniformly along the thickness direction. If the distribution density is uneven, it is preferable that a larger amount of atoms are distributed near the support. In any cases, it is required that the atoms are evenly included with uniform distribution in planes parallel to the surface of the support to make the features of the planes uniform.

The atoms for controlling the conductivity included in the charge injection preventing layer may be so-called impurities in the semi-conductive field, and, as such atoms, "III group atoms" or "V group atoms" may be used.

It is desirable that a thickness of the charge injection preventing layer according to the illustrated embodiment is preferably 0.1 μm to 5 μm, and more preferably, 0.3 μm to 4 μm, and most preferably, 0.5 μm to 3 μm from the view point of desired electrophotographic feature and economical effect.

Although desirable numerical range of a mixing ratio of diluting gas, gas pressure, discharge electric power and temperature of the support for forming the charge injection preventing layer may be the above-mentioned ones, these factors for forming the layer are not normally determined independently, but, are desirably determined to optimum values on the basis of organic co-relative to obtain the photosensitive body having the desired features.

Further, in the photosensitive body for the image forming apparatus according to the illustrated embodiment, in order to further improve close contact between the support 701 and the photo-conductive layer 703 or the charge injection preventing layer 105, a close contact layer formed from, for example, $Si_3N_4$, $SiO_2$, SiO, or non-crystal material based on silicon atoms and including hydrogen atoms and/or halogen atoms and carbon atoms and/or oxygen atoms and/or nitrogen atoms may be provided. Further, as mentioned above, a light absorbing layer for preventing generation of interference fringes due to reflection light from the support may be provided.

Figure 71:
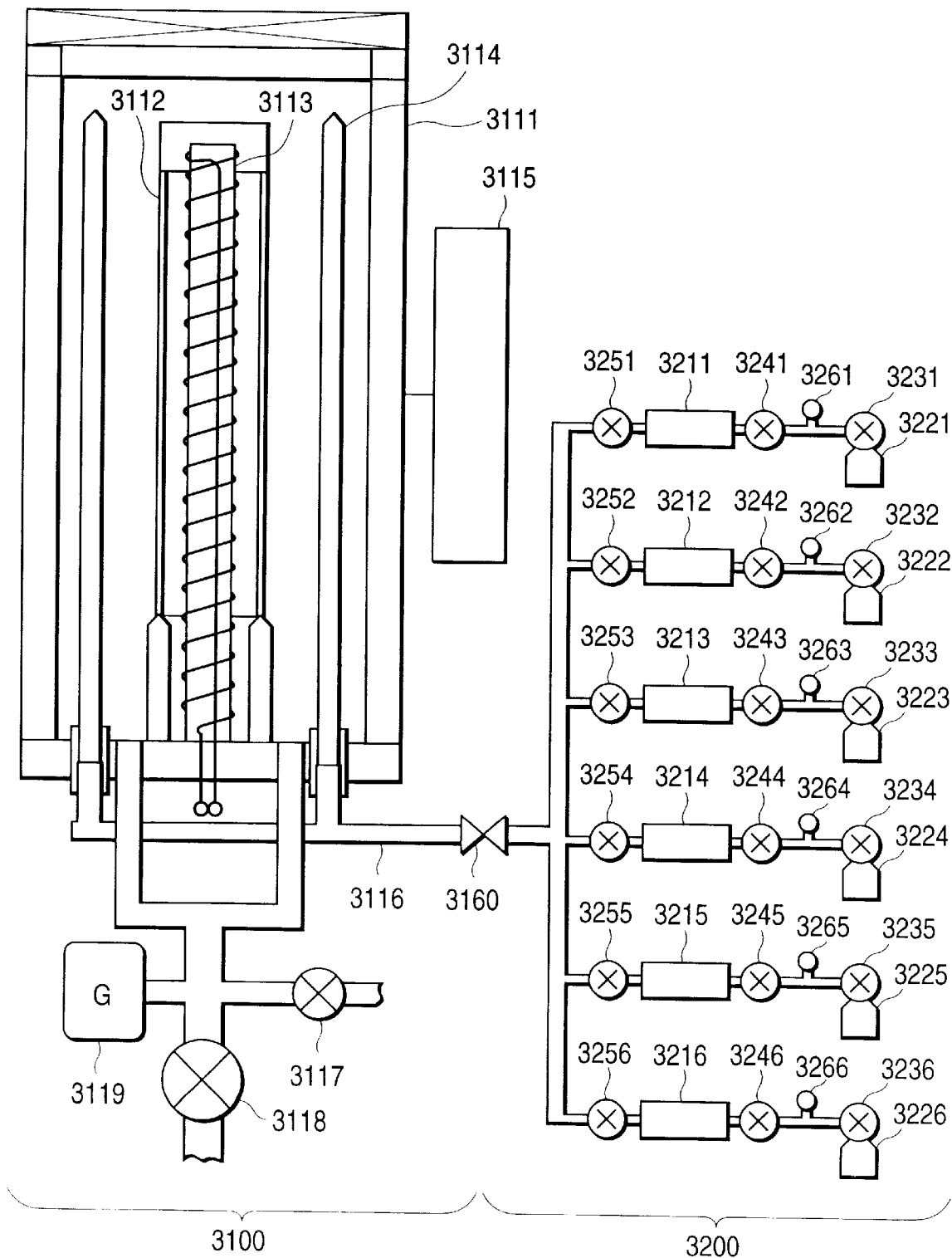
FIG. 71 is a constructional view showing an example of an apparatus for manufacturing a photosensitive body by means of RF-PCVD.

The above layers are manufactured by well-known device and film forming method, for example, as shown in FIG. 71, FIG. 71 is a constructional view showing an example of an apparatus for manufacturing the photosensitive body (for the image forming apparatus) associated with a high frequency plasma CVD method using an RF band as power source frequency (referred to as "RF-PCVD" hereinafter). This apparatus generally comprises a deposition device 3100, a raw material gas supplying device 3200, and an air discharge device (not shown) for reducing pressure in a reaction vessel 3111. Within the reaction vessel 3111 of the deposition device 3100, there are provided a cylindrical support 3112, a support heating heater 3113 and raw material gas introduction pipes 3114, and a high frequency matching box 3115 is connected to the reaction vessel.

The raw material gas supplying device 3200 comprises containers 3221 to 3226 containing raw material gases such as $SiH_4$, $GeH_4$, $H_2$, $CH_4$, $B_2H_6$ and $PH_3$, values 3231 to 3236, 3241 to 3246, 3251 to 3256, and micro-controllers 3211 to 3216. The raw material containers are connected to the gas introduction pipes 3114 of the reaction vessel 3111 through a valve 3160.

Figure 72:
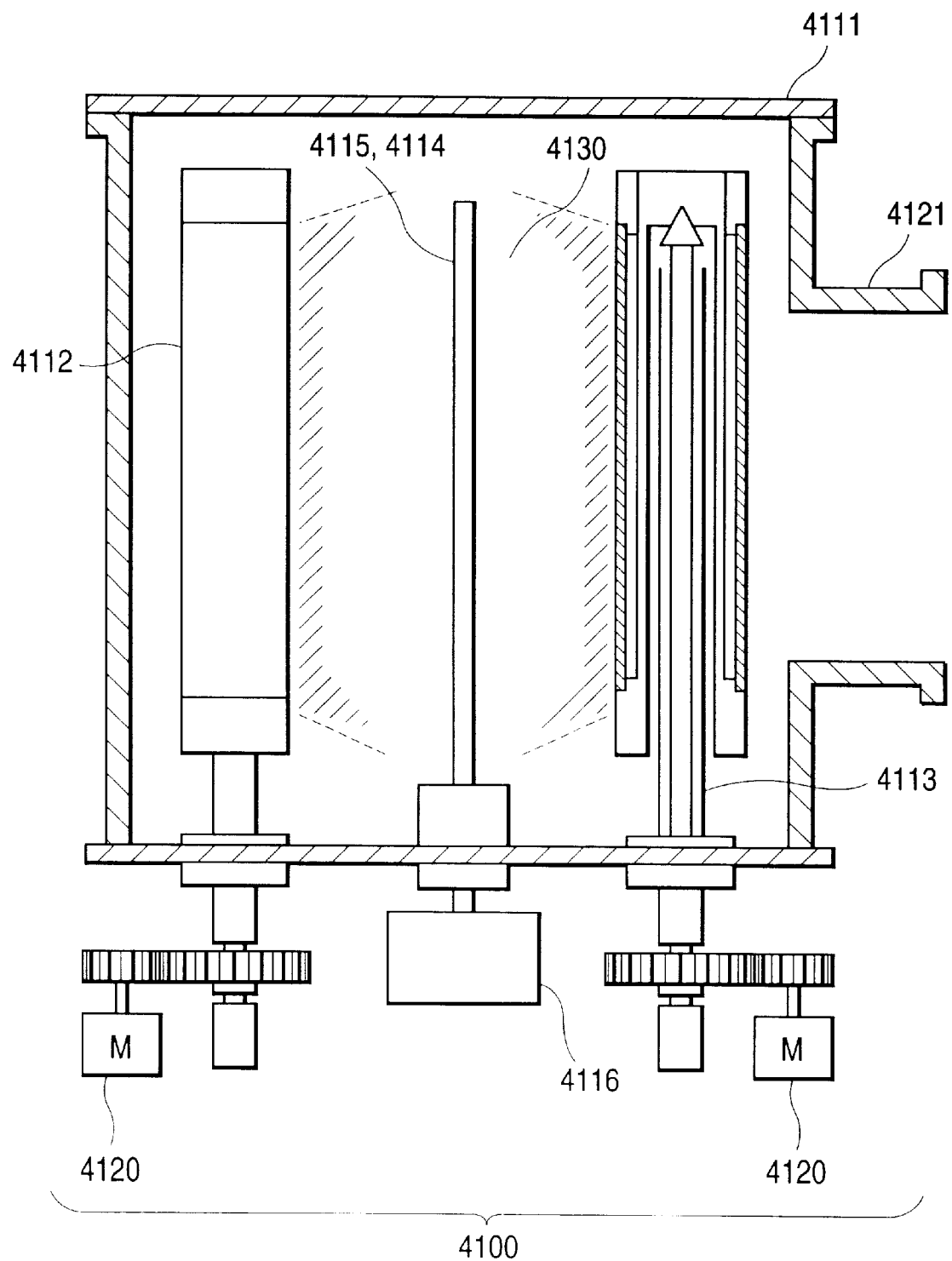
FIG. 72 is a constructional view showing an example of a depositing apparatus for photosensitive body by means of RF-PCVD.
Figure 73:
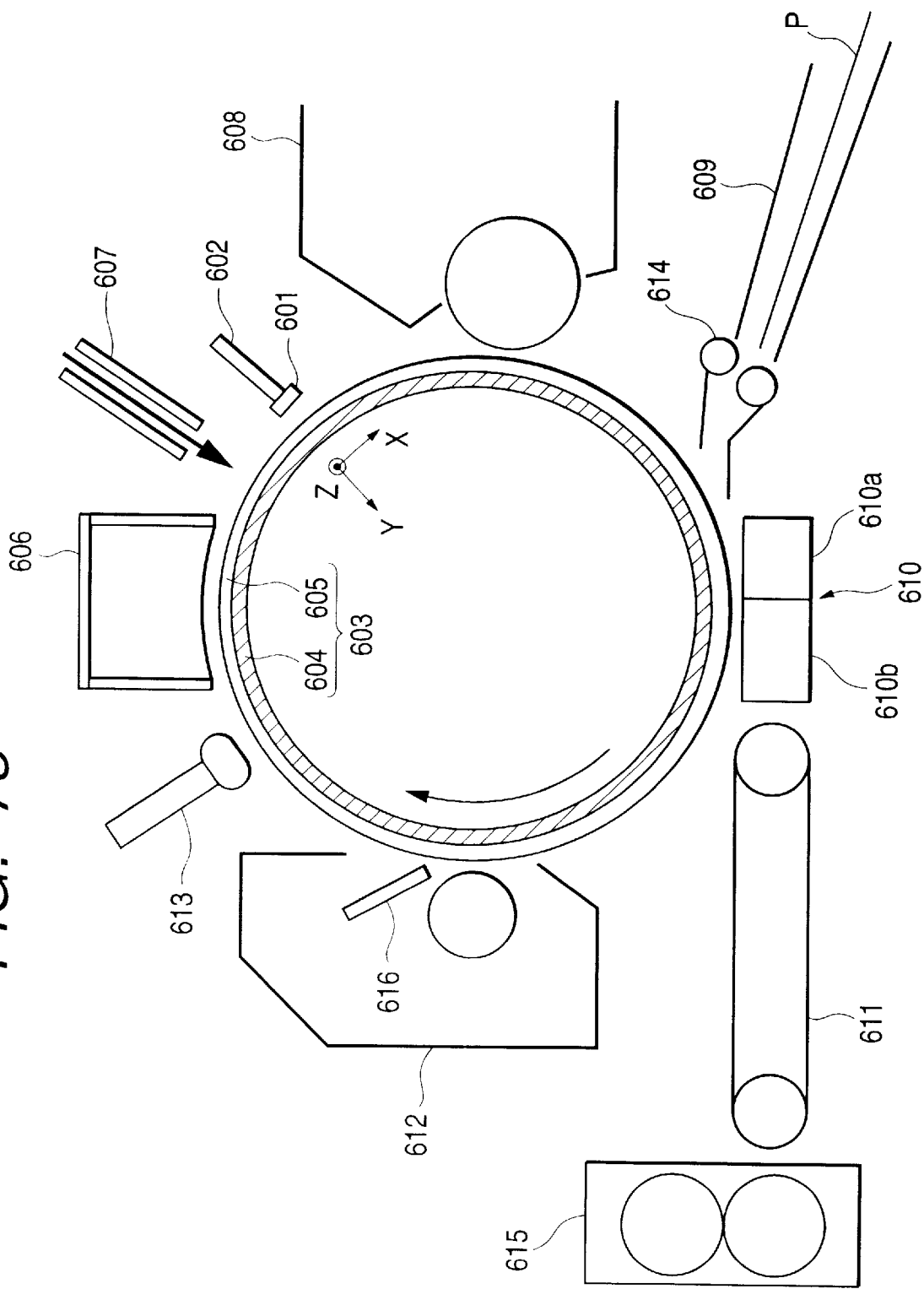
FIG. 73 is a sectional view of a conventional image forming apparatus.

An apparatus for manufacturing the photosensitive body (for the image forming apparatus) associated with a high frequency plasma CVD method using a VHF band as power-source frequency (referred to as "VHF-PCVD" hereinafter) can be obtained, for example, by replacing the deposition device 3110 (for RF-PCVD method) of the manufacturing apparatus shown in FIG. 71 by a deposition device 4100 shown in FIG. 72 and by connecting such a deposition device to the raw material gas supplying device 3200.

Such an apparatus generally comprises a vacuum sealed reaction vessel 4111 in which pressure can be reduced, a raw material gas supplying device 3200, and an air discharge device (not shown) for reducing pressure in a reaction vessel 4111. Within the reaction vessel 4111, there are provided a cylindrical support 4112, a support heating heater 4113, a raw material gas introduction pipe 4114 and an electrode, and a high frequency matching box 4120 is connected to the electrode. The interior of the reaction vessel 4111 is connected to a diffusion pump (not shown) through an air discharge duct 4121.

The raw material gas supplying device 3200 comprises containers 3221 to 3226 containing raw material gases such as $SiH_4$, $GeH_4$, $H_2$, $CH_4$, $B_2H_6$ and $PH_3$, valves 3231 to 3236, 3241 to 3246, 3251 to 3256, and micro-controllers 3211 to 3216. The raw material containers are connected to the gas introduction pipe 3114 of the reaction vessel 4111 through a valve 3160. A space 4114 enclosed by the cylindrical support 4112 defines a discharge space.

[Organic photo-conductor (OPC)]

Now, an OPC photosensitive body which is one of photosensitive bodies suitable for the present invention will be described.

Figure 70:
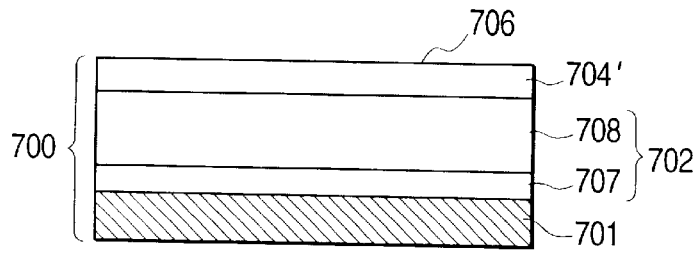
FIG. 70 is a schematic view showing a layer structure of a photosensitive body of the image forming apparatus according to the present invention.

FIG. 70 shows an example of an OPC photosensitive body for the image forming apparatus. The OPC photosensitive body 700 has a photosensitive layer 702 provided on a support 701 for the photosensitive body. The photosensitive layer 702 includes a charge generating layer 707 and a charge transfer layer 708, and, if necessary, further includes a protection layer or surface 704', and, an intermediate layer disposed between the support 701 and the charge generating layer 707.

In the OPC photosensitive body according to the illustrated embodiment (i.e., surface layer, photoconductive layer and intermediate layer (if provided)), particularly, although the surface layer may be a conventional one, polyethylene terephthalate (PTFB, referred to as "Teflon" hereinafter) may be mixed with or coated on the surface layer to improve endurance.

Now, examples of resins used for forming the surface layer, photo-conductive layer, charge transfer layer and charge generating layer of the electrophotographic photosensitive body according to the illustrated embodiment will be described.

Polyester is a bond polymer comprised of acid constituent and alcohol constituent and is polymer obtained by condensation between discarboxylic acid and glycol or between hydroxy benzoic acid and compound having hydroxyl group and carboxyl group.

As the acid constituent, aromatic dicarboxylic acid such as terephthalic acid, isophthalic acid or naphthalene dicarboxylic acid, or, aliphatic dicarboxylic acid such as succinic acid, adipic acid or sebacic acid, or, alicyclic dicarboxylic acid such as hexahydroterephthalic acid, or, oxycarboxylic acid such as hydroxy-ethoxy benzoic acid may be used.

As the glycol constituent, ethylene glycol, trimethylene glycol, tetramethylene glycol, hexamethylene glycol, cyclohexane dimethyrol, polyethylene glycol or polypropylene glycol may be used.

Incidentally, within a range where the polyester resin is substantially linear, multifunctional compound such as pentaerythritol, trimethylol propane, pyromerit acid, or one of their ester forming derivatives may be co-polymerized.

Polyester resin having a high melting point is used in the illustrated embodiment.

As the polyester resin having the high melting point, polyester resin having limiting viscosity (measured in ortho-chlorophenol at a temperature of 360° C.) of 0.4 dl/g or more, and preferably, 0.5 dl/g or more, and more preferably, 0.65 dl/g or more is used.

Preferred polyester resins having the high melting point may be resins of polyalkylene terephthalate group. The resin of polyalkene terephthalate group mainly includes terephthalic acid (as acid constituent) and alkylene glycol (as glycol constituent).

As concrete examples, polyethylene terephthalate (PET) mainly including terephthalic acid constituent and ethylene glycol constituent, polybutylene terephthalate (PBT) mainly including terephthalic acid constituent and 1,4-tetramethylene glycol (1,4-butylene glycol) constituent, and polycyclohexyl dimethylene terephthalate (PCT) mainly including terephthalic acid constituent and cyclohexane dimethylol constituent can be listed up.

As other preferably high molecular weight polyester resins, there are resins of polyalylene naphthalate group. The resin of polyalylene naphthalate group mainly includes naphthalene dicarboxylic acid (as acid constituent) and alkylene glycol (as glycol constituent). As concrete examples, polyethylene naphthalate (PEN) mainly including naphthalic dicarboxylic acid constituent and ethylene glycol constituent can be listed up.

The high melting point polyester resin has a melting point of preferably 160° C. or more, and more preferably, 200° C. or more.

Other than the polyester resins, acrylic resin may be used. Further, as binder, two-functional acrylic resin, six-functional acrylic resin or phosphagen is used.

These resins has relatively high crystallization and uniform and close entanglement between hardening resin polymer chains and high melting point polymer chains to form a surface layer having excellent endurance. If a low melting point polyester resin is used, since it has poor crystallization, good entanglement (between hardening resin polymer chains and low melting point polymer chains) and poor entanglement are generated to worsen the endurance.

Teflon resin is dispersed in the surface layer.

In dependence upon the use conditions, it is preferable that the charging ability and sensitive feature are controlled by adjusting the dispersed amount.

The surface of the photosensitive body may be coated by Teflon resin.

During the control, the transfer means and/or the separation means may be controlled to effectively transfer the visualized image on the photosensitive body onto the transfer material effectively and/or to separate the transfer material effectively.

By using the means and functions for solving the above-mentioned problems solely or in combination, the excellent effect can be achieved.

Further, the following additional effects can be obtained.

(1) Light memory such as ghost is reduced. Probably, the reason is that formation or remaining of excessive light carrier (as cause of light memory) is reduced.

(2) Image defect such as so-called white void around a black spot is eliminated or reduced. Probably, the reason is that this is obtained by independent or relative effect of control of contrast and/or adjustment of the developing condition.

Incidentally, the present invention may be applied to a system comprising a plurality of equipments (for example, a host computer, an interface equipment, a reader, a printer and the like) or to a system comprising a single equipment (for example a copying machine or a facsimile).

Of course, the objects of the present invention can be achieved by supplying a recording medium storing a program code (software) for realizing the function of the aforementioned embodiments to the system or the apparatus and by reading out and executing the program code stored in the recording medium by a computer (CPU or MPU) of the system or the apparatus.

In this case, the program code itself read out from the recording medium realizes the function of the aforementioned embodiment and the recording medium storing the program code constitutes the present invention.

As the recording medium for supplying the program code, for example, a floppy disc, a hard disc, an optical disc, a photo-magnetic disc, a CD-ROM, a CD-R, a magnetic tape, a non-volatile memory card or a ROM can be used.

Further, by executing the program code read out by the computer, not only the function of the aforementioned embodiments can be realized, but also a part or all of the actual treatment can be effected by an OS (operating system) working on the computer on the basis of instruction of the program code to realize the function of the aforementioned embodiments.

In addition, after the program code read out from the recording medium is written in a memory of a function extension board inserted into the computer or of a function extension unit connected to the computer, a part or all of the actual treatment may be effected by a CPU of the function extension board or the function extension unit on basis of the instruction of the program code to realize the function of the aforementioned embodiments.

The present invention is not limited to the above-mentioned embodiments, and various alteration can be made within the scope of the invention.

What is claimed is:

1. A surface potential measuring apparatus for measuring a potential configuration by moving a surface which is to be measured and in which potential is changed and at least one potential sensor relative to each other and by generating dielectric current in said potential sensor due to change in potential on said surface and by analyzing the dielectric current, wherein:

a width of a detecting portion of said potential sensor is smaller than a width of the change in potential to be measured;

a sectional shape of said detecting portion in a plane perpendicular to said surface and parallel to the relative movement direction does not include any edge; and by analyzing the dielectric current, the potential configuration of said surface is sought.

2. A surface potential measuring apparatus according to claim 1, wherein the sectional shape of said detection portion is true circular.

3. A surface potential measuring apparatus according to claim 1, wherein the sectional shape of said detection portion is elliptic.

4. A surface potential measuring apparatus according to claim 1, wherein the sectional shape of said detection portion is triangular with edges chamfered.

5. A surface potential measuring apparatus according to claim 1, wherein said detecting portion of said potential sensor is constituted by a conductive wire, and, when it is assumed that the relative movement direction is X, a direction normal to said surface is Y and a direction perpendicular to the directions X, Y is Z, said detecting portion is arranged in parallel to the Z-axis.

6. A surface potential measuring apparatus according to claim 5, wherein linearity of said detecting portion of said potential sensor and parallelism of said detecting portion to the Z-axis are within 300% of a diameter of said conductive wire.

7. A surface potential measuring apparatus for measuring a potential configuration by moving a surface which is to be measured and in which potential is changed and at least one potential sensor relative to each other and by generating dielectric current in said potential sensor due to change in potential on said surface and by analyzing the dielectric current, wherein:

a width of a detecting portion of said potential sensor is smaller than a width of the change in potential to be measured;

said detecting portion is constituted by a board-shaped conductive body having extension existed in a plane perpendicular to said surface to be measured and to the relative movement direction, and a portion of said conductive body other than a portion opposed to said surface is shielded not receive the dielectric current from the portion other than the portion opposed to said surface; and by analyzing the dielectric current, the potential configuration of said surface is sought.

8. A surface potential measuring apparatus according to claim 7, wherein said detecting portion of said potential sensor is formed as a conductive board shape having a predetermined width.

9. A surface potential measuring apparatus according to claim 8, wherein when it is assumed that the relative movement direction is X, a direction normal to said surface is Y and a direction perpendicular to the directions X, Y is Z, parallelism of said detecting portion of said potential sensor to the Z-axis is within 300% of the width of said detecting portion.

10. A surface potential measuring apparatus for measuring a potential configuration by moving a surface which is to be measured and in which potential is changed and at least one potential sensor relative to each other and by generating dielectric current in said potential sensor due to change in potential on said surface and by analyzing the dielectric current, wherein:

a width of a detecting portion of said potential sensor is smaller than a width of the change in potential to be measured;

said detecting portion is constituted by a rod-shaped conductive body extending in perpendicular to said surface to be measured, and a portion of said conductive body other than a portion opposed to said surface is shielded not receive the dielectric current from the portion other than the portion opposed to said surface; and by analyzing the dielectric current, the potential configuration of said surface is sought.

11. A surface potential measuring apparatus according to claim 10, wherein, when it is assumed that the relative movement direction is X, a direction normal to said surface is Y and a direction perpendicular to the directions X, Y is Z, widths of said detecting portion of said potential sensor in the X-axis direction and the Z-axis direction are defined by a rod-shaped conductive body having a predetermined length.

12. A surface potential measuring method for measuring a potential configuration by moving a surface which is to be measured and in which potential is changed and at least one potential sensor relative to each other and by generating dielectric current in said potential sensor due to change in potential on said surface and by analyzing the dielectric current, wherein:

a width of a detecting portion of said potential sensor is smaller than a width of the change in potential to be measured;

a sectional shape of said detecting portion in a plane perpendicular to said surface and parallel to the relative movement direction does not include any edge; and by analyzing the dielectric current, the potential configuration of said surface is sought.

13. A surface potential measuring method for measuring a potential configuration by moving a surface which is to be measured and in which potential is changed and at least one potential sensor relative to each other and by generating dielectric current in said potential sensor due to change in potential on said surface and by analyzing the dielectric current, wherein:

a width of a detecting portion of said potential sensor is smaller than a width of the change in potential to be measured;

said detecting portion is constituted by a board-shaped conductive body having extension existed in a plane perpendicular to said surface to be measured and to the relative movement direction, and a portion of said conductive body other than a portion opposed to said surface is shielded not receive the dielectric current from the portion other than the portion opposed to said surface; and by analyzing the dielectric current, the potential configuration of said surface is sought.

14. A surface potential measuring method for measuring a potential configuration by moving a surface which is to be measured and in which potential is changed and at least one potential sensor relative to each other and by generating dielectric current in said potential sensor due to change in potential on said surface and by analyzing the dielectric current, wherein:

a width of a detecting portion of said potential sensor is smaller than a width of the change in potential to be measured;

said detecting portion is constituted by a rod-shaped conductive body extending in perpendicular to said surface to be measured, and a portion of said conductive body other than a portion opposed to said surface is shielded not receive the dielectric current from the portion other than the portion opposed to said surface; and by analyzing the dielectric current, the potential configuration of said surface is sought.

15. An image forming method for measuring change in potential distribution of a latent image formed on a photosensitive body by means of a potential sensor and for controlling at least one of electrophotographic image forming processes on the basis of measured result, comprising the steps of:

generating dielectric current in a detecting portion of said potential sensor by the change in the potential distribution on a surface of said photosensitive body; and detecting and analyzing the dielectric current generated; and wherein said detecting portion of said potential sensor has a detecting end face having a width smaller than a width of the change in the potential distribution to be measured and having no edge;

the dielectric current is generated in said detecting portion of said potential sensor in a conduction that said detecting end face of said potential sensor is opposed to the surface of said photosensitive body;

the change in the potential distribution is measured by detecting, integrating and analyzing the dielectric current generated; and at least one of said electrophotographic image forming processes is controlled on the basis of a measured result.

16. An image forming method according to claim 15, wherein said detecting portion of said potential sensor has a board-shape and constituted by a conductive wire having a thickness of 1 $\mu$m to 100 $\mu$m and a length of 0.2 mm to 10 mm, and said detecting portion is arranged so that a longitudinal direction thereof becomes in parallel to a direction normal to the surface of said photosensitive body.

17. An image forming method according to claim 16, wherein linearity of said detecting portion of said potential sensor and parallelism of said detecting portion to the direction normal to the surface of said photosensitive body are within 300% of a diameter of said wire.

18. An image forming method according to claim 15, wherein integration and analysis of the dielectric current are analyzed in such a manner that a value of the dielectric current is regarded as gradient of the potential and a time integration value of the dielectric current is regarded as depth of the potential.

19. An image forming method according to claim 15, wherein there is provided a mechanism for keeping a distance between said potential sensor and the surface of said photosensitive body constant during the relative movement between said potential sensor and said photosensitive body.

20. An image forming method according to claim 19, wherein the distance between said potential sensor and the surface of said photosensitive body is 10 $\mu$m to 300 $\mu$m.

21. An image forming method according to claim 15, wherein said detecting portion of said potential sensor is formed from tungsten material.

22. An image forming apparatus for measuring change in potential distribution of a latent image formed on a photosensitive body and for controlling at least one of electrophotographic image forming processes on the basis of a measured result, comprising:

a potential sensor including a detecting portion having a detecting end face having a width smaller than a width of change in potential distribution to be measured and having no edge;

a means for generating dielectric current in said detecting portion of said potential sensor in a condition that said detecting end face of said potential sensor is opposed to the surface of said photosensitive body;

a means for measuring the change in the potential distribution on the surface of said photosensitive body by detecting, integrating and analyzing the dielectric current generated; and a means for controlling at least one of said electrophotographic image forming processes on the basis of a measured result.

23. An image forming apparatus according to claim 22, wherein said detecting portion of said potential sensor has a board-shape and constituted by a conductive wire having a thickness of 1 μm to 100 μm and a length of 0.2 mm to 10 mm, and said detecting portion is arranged so that a longitudinal direction thereof becomes in parallel to a direction normal to the surface of said photosensitive body.

24. An image forming apparatus according to claim 23, wherein linearity of said detecting portion of said potential sensor and parallelism of said detecting portion to the direction normal to the surface of said photosensitive body are within 300% of a diameter of said wire.

25. An image forming apparatus according to claim 22, wherein integration and analysis of the dielectric current are analyzed in such a manner that a value of the dielectric current is regarded as gradient of the potential and a time integration value of the dielectric current is regarded as depth of the potential.

26. An image forming apparatus according to claim 22, further comprising a mechanism for keeping a distance between said potential sensor and the surface of said photosensitive body constant during the relative movement between said potential sensor and said photosensitive body.

27. An image forming apparatus according to claim 26, wherein the distance between said potential sensor and the surface of said photosensitive body is 10 μm to 300 μm.

28. An image forming apparatus according to claim 22, wherein said detecting portion of said potential sensor is formed from tungsten material.

29. A surface potential measuring apparatus for measuring a potential configuration by moving a surface which is to be measured and in which potential is changed and at least one potential sensor relative to each other and by generating dielectric current in said potential sensor due to change in potential on said surface and by analyzing the dielectric current, wherein:
  a detecting portion of said potential sensor is constituted by a rod-shaped conductive body having a width smaller than a width of the change in potential to be measured; and
  by analyzing the dielectric current, the potential configuration of said surface is sought.

30. A surface potential measuring apparatus according to claim 29, wherein said rod-shaped detecting portion of said potential sensor has a diameter of 1 μm to 100 μm and a length of 0.5 mm to 10 mm in a direction normal to a surface of said photosensitive body.

31. A surface potential measuring apparatus according to claim 29, wherein said potential sensor has a portion electrically shielded.

32. A surface potential measuring apparatus according to claim 29, wherein, in said potential sensor, a diameter of a portion of said rod-shaped detecting portion near a surface of said photosensitive body is smaller than a diameter of a portion of said rod-shaped detecting portion remote from the surface of said photosensitive body.

33. A surface potential measuring apparatus for measuring a potential configuration by moving a surface which is to be measured and in which potential is changed and at least one potential sensor relative to each other and by generating dielectric current in said potential sensor due to change in potential on said surface and by analyzing the dielectric current, wherein:
  a detecting portion of said potential sensor is constituted by a board-shaped conductive body having a width smaller than a width of the change in potential to be measured; and
  by analyzing the dielectric current, the potential configuration of said surface is sought.

34. A surface potential measuring apparatus according to claim 33, wherein said board-shaped detecting portion of said potential sensor has a thickness of 1 μm to 100 μm and a length of 0.2 mm to 10 mm, and said detecting portion is arranged so that a longitudinal direction thereof is disposed in parallel to a direction normal to the surface of said photosensitive body.

35. A surface potential measuring apparatus according to claim 33, wherein the conductive body of said detecting portion of said potential sensor is formed by deposition.

36. A surface potential measuring apparatus according to claim 33, wherein a portion of said potential sensor other than a portion opposed to said photosensitive body is electrically shielded.

37. A surface potential measuring apparatus according to claim 33, wherein linearity of said detecting portion of said potential sensor and parallelism of said detecting portion to the direction normal to the surface of said photosensitive body are within 300% of a thickness of said board.

* * * * *

UNITED STATES PATENT AND TRADEMARK OFFICE
CERTIFICATE OF CORRECTION

PATENT NO. : 5,983,043
DATED : November 9, 1999
INVENTOR(S) : Hironori Ohwaki, et al.

It is certified that error appears in the above-identified patent and that said Letters Patent is hereby corrected as shown below:

Column 1,
Line 19, "have" should read -- has -- ; and
Line 28, "transferred" should read -- transfer --.

Column 2,
Line 24, "reproductively" should read -- reproductivity --.

Column 3,
Line 9, "suing" should read -- using --;
Line 26, "reproductively" should read -- reproductivity --; and
Line 50, "sued" should read -- used --.

Column 4,
Line 2, "reproductively" should read -- reproductivity --.

Column 9,
Line 63, "keep" should read -- keeping --.

Column 14,
Line 6, "suing" should read -- using --.

Column 20,
Line 30, "generate" should read -- generated --.

Column 23,
Line 22, "not" should read -- not be --; and
Line 56, "ha" should read -- has --.

Column 24,
Line 14, "herein after" should read -- hereinafter --.

Column 26,
Line 20, "generate" should read -- generated --; and
Line 63, "1" should be deleted.

Column 29,
Line 41, "arrange" should read -- arranged --.

UNITED STATES PATENT AND TRADEMARK OFFICE
CERTIFICATE OF CORRECTION

PATENT NO. : 5,983,043
DATED : November 9, 1999
INVENTOR(S) : Hironori Ohwaki, et al.

It is certified that error appears in the above-identified patent and that said Letters Patent is hereby corrected as shown below:

Column 52,
Line 32, "preferably" should read -- preferable --; and
Line 46, "has" should read -- have --.

Column 54,
Line 31, "not" should read -- to not -- ; and
Line 61, "not" should read -- to not --.

Column 55,
Line 37, "not" should read -- to not -- ; and
Line 57, "not" should read -- to not --.

Column 57,
Line 9, "in" should be deleted.

Signed and Sealed this

Twenty-seventh Day of November, 2001

Attest:

*Attesting Officer*

NICHOLAS P. GODICI
*Acting Director of the United States Patent and Trademark Office*